United States Patent
Sumitomo et al.

(10) Patent No.: US 9,230,937 B2
(45) Date of Patent: Jan. 5, 2016

(54) SEMICONDUCTOR DEVICE AND A MANUFACTURING METHOD THEREOF

(75) Inventors: Kaori Sumitomo, Kanagawa (JP);
Hideyuki Arakawa, Kanagawa (JP);
Hiroshi Horibe, Kanagawa (JP); Yasuki Takata, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 590 days.

(21) Appl. No.: 13/468,139

(22) Filed: May 10, 2012

(65) Prior Publication Data
US 2012/0286427 A1  Nov. 15, 2012

(30) Foreign Application Priority Data

May 13, 2011 (JP) .................................. 2011-108530

(51) Int. Cl.
*H01L 21/44* (2006.01)
*H01L 23/00* (2006.01)

(52) U.S. Cl.
CPC ............... *H01L 24/85* (2013.01); *H01L 24/05* (2013.01); *H01L 24/11* (2013.01); *H01L 24/78* (2013.01); *H01L 24/03* (2013.01); *H01L 24/13* (2013.01); *H01L 24/16* (2013.01); *H01L 2224/0401* (2013.01); *H01L 2224/04042* (2013.01); *H01L 2224/0508* (2013.01); *H01L 2224/05186* (2013.01); *H01L 2224/05553* (2013.01); *H01L 2224/05554* (2013.01); *H01L 2224/1134* (2013.01); *H01L 2224/13017* (2013.01); *H01L 2224/13147* (2013.01); *H01L 2224/16225* (2013.01); *H01L 2224/16238* (2013.01); *H01L 2224/32225* (2013.01);
(Continued)

(58) Field of Classification Search
CPC ................... H01L 24/85; H01L 24/11; H01L 2224/48227; H01L 2224/73204
USPC .......................................................... 438/613
See application file for complete search history.

(56) References Cited

U.S. PATENT DOCUMENTS 5,871,141 A * 2/1999 Hadar et al. ............... 228/180.5
6,065,667 A * 5/2000 Singh ......................... 228/180.5
(Continued)

FOREIGN PATENT DOCUMENTS

JP  2-125631 A   5/1990
JP  11-186315 A  7/1999
(Continued)

OTHER PUBLICATIONS

Office Action issued Feb. 10, 2015, in Japanese Patent Application No. 2011-108530.

*Primary Examiner* — Luan C Thai
(74) *Attorney, Agent, or Firm* — Miles & Stockbridge P.C.

(57) ABSTRACT

There is provided a technology capable of suppressing the damage applied to a pad. When the divergence angle of an inner chamfer part is smaller than 90 degrees, the ultrasonic conversion load in a direction perpendicular to the surface of the pad is very small in magnitude. In other words, the ultrasonic conversion load in a direction perpendicular to the surface of the pad is sufficiently smaller in magnitude than the ultrasonic conversion load in a direction in parallel with the surface of the pad. Consequently, when the divergence angle of the inner chamfer part is smaller than 90 degrees, the ultrasonic conversion load in a direction perpendicular to the surface of the pad can be sufficiently reduced in magnitude, which can prevent pad peeling.

13 Claims, 39 Drawing Sheets

(52) U.S. Cl.
CPC ............... *H01L 2224/32245* (2013.01); *H01L 2224/45015* (2013.01); *H01L 2224/45144* (2013.01); *H01L 2224/45147* (2013.01); *H01L 2224/45164* (2013.01); *H01L 2224/48091* (2013.01); *H01L 2224/48095* (2013.01); *H01L 2224/48227* (2013.01); *H01L 2224/48247* (2013.01); *H01L 2224/48451* (2013.01); *H01L 2224/48465* (2013.01); *H01L 2224/49175* (2013.01); *H01L 2224/73204* (2013.01); *H01L 2224/73265* (2013.01); *H01L 2224/78301* (2013.01); *H01L 2224/78304* (2013.01); *H01L 2224/78343* (2013.01); *H01L 2224/81193* (2013.01); *H01L 2224/85181* (2013.01); *H01L 2224/85205* (2013.01); *H01L 2924/0102* (2013.01); *H01L 2924/014* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01028* (2013.01); *H01L 2924/01029* (2013.01); *H01L 2924/01033* (2013.01); *H01L 2924/01051* (2013.01); *H01L 2924/01052* (2013.01); *H01L 2924/01074* (2013.01); *H01L 2924/01079* (2013.01); *H01L 2924/01082* (2013.01); *H01L 2924/07802* (2013.01); *H01L 2924/10329* (2013.01); *H01L 2924/1306* (2013.01); *H01L 2924/13091* (2013.01); *H01L 2924/15311* (2013.01)

(56) References Cited

U.S. PATENT DOCUMENTS

| | | | |
|---|---|---|---|
| 6,213,378 B1 * | 4/2001 | Singh | 228/110.1 |
| 6,581,816 B2 * | 6/2003 | Vitali et al. | 228/4.5 |
| 6,595,406 B2 * | 7/2003 | Chapman et al. | 228/180.5 |
| 6,908,841 B2 * | 6/2005 | Burrell et al. | 438/612 |
| 6,910,612 B2 * | 6/2005 | Perlberg et al. | 228/4.5 |
| 7,192,861 B2 * | 3/2007 | Ano | 438/617 |
| 8,308,049 B2 * | 11/2012 | Nakao | 228/110.1 |

FOREIGN PATENT DOCUMENTS

| | | |
|---|---|---|
| JP | 2006-512788 A | 4/2006 |
| JP | 2009-194136 A | 8/2009 |

* cited by examiner

SEMICONDUCTOR DEVICE AND A MANUFACTURING METHOD THEREOF

CROSS-REFERENCE TO RELATED APPLICATIONS

The disclosure of Japanese Patent Application No. 2011-108530 filed on May 13, 2011 including the specification, drawings and abstract is incorporated herein by reference in its entirety.

BACKGROUND

The present invention relates to a semiconductor device and a manufacturing technology thereof. More particularly, it relates to a technology effectively applicable to a semiconductor device in which copper wires are bonded to pads disposed on the surface of a semiconductor chip, and a manufacturing technology thereof.

Japanese Unexamined Patent Publication No. 2009-194136 (Patent Document 1) discloses the following. The inner chamfer angle of a capillary is 60 degrees or 120 degrees. Then, the capillary is pressed together with a ball against a bonding pad. Thus, a bonding load is applied thereto, and an ultrasonic vibration is supplied through the capillary in the direction in parallel with the surface of the bonding pad. As a result, a press-bonded ball is formed on the bonding pad.

[Patent Document 1] Japanese Unexamined Patent Publication No. 2009-194136

SUMMARY

A semiconductor device is formed of a semiconductor chip over which semiconductor elements such as MOSFETs (Metal Oxide Semiconductor Field Effect Transistors) and a multilayer wiring are formed, and a package formed in such a manner as to cover the semiconductor chip. The package has (1) a function of electrically coupling the semiconductor elements formed over the semiconductor chip with an external circuit; and (2) a function of protecting the semiconductor chip from external environment such as humidity or temperature, and preventing the breakage due to vibration or impact, or the characteristic deterioration of the semiconductor chip. Further, the package also has (3) a function of facilitating handling of the semiconductor chip; (4) a function of dissipating the heat generated during the operation of the semiconductor chip, and making full use of the capabilities of the semiconductor elements; and other functions in combination.

For the package, for example, in order to implement the function of electrically coupling the semiconductor elements formed over the semiconductor chip with the external circuit, the following is performed: a semiconductor chip is mounted over a wiring board; thus, the pads formed over the semiconductor chip and the terminals formed over the wiring board are coupled by wires. At this step, as the wire for coupling each pad and each terminal, there is used, for example, a gold wire using gold as a material.

However, in recent years, the price of gold has been increasing. For this reason, in order to suppress the direct material cost in the manufacturing steps of a semiconductor device, a study has been done on the use of a copper wire formed of copper less expensive than gold. Particularly, the copper wire has a characteristic of being lower in not only cost but also electric resistivity than a gold wire, and hence is also excellent in electric characteristics, and has received attention.

Herein, the pads formed over the semiconductor chip and the terminals formed over the wiring board are coupled through wires. In this case, first, an initial ball is formed at the tip part of a capillary. Then, the initial ball formed at the tip part of the capillary is pressed against the top of the pad. Specifically, the initial ball is pressed against the top of the pad by a load and an ultrasonic vibration resulting from the capillary. As a result, the initial ball is deformed. This results in the formation of a press-bonded ball capable of sufficiently ensuring the contact area with the pad. Then, while moving the capillary to the terminal of the wiring board, a wire is led out. Thus, the wire is bonded to the terminal of the wiring board by the capillary. As a result, the pad and the terminal are coupled by the wire.

Thus, when the press-bonded ball is formed over the pad, the load and the ultrasonic vibration resulting from the capillary are required to be applied to the initial ball. However, copper is harder than gold. In addition, while gold is not oxidized, copper is oxidized. For these reasons, the load and the ultrasonic vibration applied for deforming the initial ball, and removing the oxide film are larger in the case using a copper wire than in the case using a gold wire. Therefore, when the copper wire is used, the damage inflicted on the pad unfavorably increases.

It is an object of the present invention to provide a technology capable of suppressing the damage inflicted on the pad.

The foregoing and other objects, and the novel features of the present invention will be apparent through the description provided in this specification and the accompanying drawings.

Summaries of the representative ones of the inventions disclosed in the present application will be described in brief as follows.

A method for manufacturing a semiconductor device in a representative embodiment includes a step of applying an initial ball formed at the tip part of a capillary with a load and an ultrasonic wave, and thereby deforming the initial ball to form a press-bonded ball, and electrically coupling a pad with the press-bonded ball. Herein, the press-bonded ball has a first portion coupled with the pad, a second portion arranged over the first portion, and a third portion arranged over the second portion, and coupled with a copper wire led out from the capillary. Then, the divergence angle of an inner chamfer part of the capillary forming the second portion of the press-bonded ball is smaller than 90 degrees.

Further, a method for manufacturing a semiconductor device in a representative embodiment includes a step of applying an initial ball formed at the tip part of a capillary with a load and an ultrasonic wave, and thereby deforming the initial ball to form a press-bonded ball, and electrically coupling a pad with the press-bonded ball. Herein, the press-bonded ball has a first portion coupled with the pad, a second portion arranged over the first portion, and a third portion arranged over the second portion, and coupled with a copper wire led out from the capillary. Then, the longitudinal sectional shape of the third portion of the press-bonded ball is a tapered shape.

A semiconductor device in a representative embodiment has a press-bonded ball formed of copper, formed over a pad. Herein, the press-bonded ball has a first portion coupled with the pad, a second portion arranged over the first portion, and a third portion arranged over the second portion. Then, the divergence angle of the second portion is smaller than 90 degrees.

Further, a semiconductor device in a representative embodiment has a press-bonded ball formed of copper, formed over a pad. Herein, the press-bonded ball has a first portion coupled with the pad, a second portion arranged over the first portion, and a third portion arranged over the second portion. Then, the longitudinal sectional shape of the third portion of the press-bonded ball is a tapered shape.

The effects obtainable by representative ones of the inventions disclosed in the present application will be described in brief as follows.

It is possible to suppress the damage inflicted on the pad.

DETAILED DESCRIPTION

In the following embodiment, the embodiment may be described in a plurality of divided sections or embodiments for convenience, if required. However, unless otherwise specified, these are not independent of each other, but are in a relation such that one is a modified example, detailed explanation, complementary explanation, or the like of apart or the whole of the other.

Further, in the following embodiments, when a reference is made to the number of elements, and the like (including number, numerical value, quantity, range, or like), the number of elements is not limited to the specific number, but may be greater than or less than the specific number, unless otherwise specified, and except the case where the number is apparently limited to the specific number in principle, and other cases.

Further, in the following embodiments, the constituent elements (including element steps, or the like) are not always essential, unless otherwise specified, and except the case where they are apparently considered essential in principle, and other cases.

Similarly, in the following embodiments, when a reference is made to the shapes, positional relationships, or the like of the constituent elements, or the like, it is understood that they include ones substantially analogous or similar to the shapes or the like, unless otherwise specified, unless otherwise considered apparently in principle, and except for other cases. This also applies to the foregoing numerical values and the range.

Further, in all the drawings for illustrating the embodiments, the same members are given the same reference signs and numerals in principle, and a repeated description thereon is omitted. Incidentally, for ease of understanding of the drawings, hatching may be provided even in a plan view First Embodiment Configuration Example of Semiconductor Device (BGA Package)

The package structures of semiconductor devices include various types such as BGA (Ball Grid Array) package and QFP (Quad Flat Package) package. The technical idea of the present invention is applicable to the packages. Below, a description will be given to the configuration example of a semiconductor device formed of a BGA package, and the configuration example of a semiconductor device formed of a QFP package.

Figure 1:
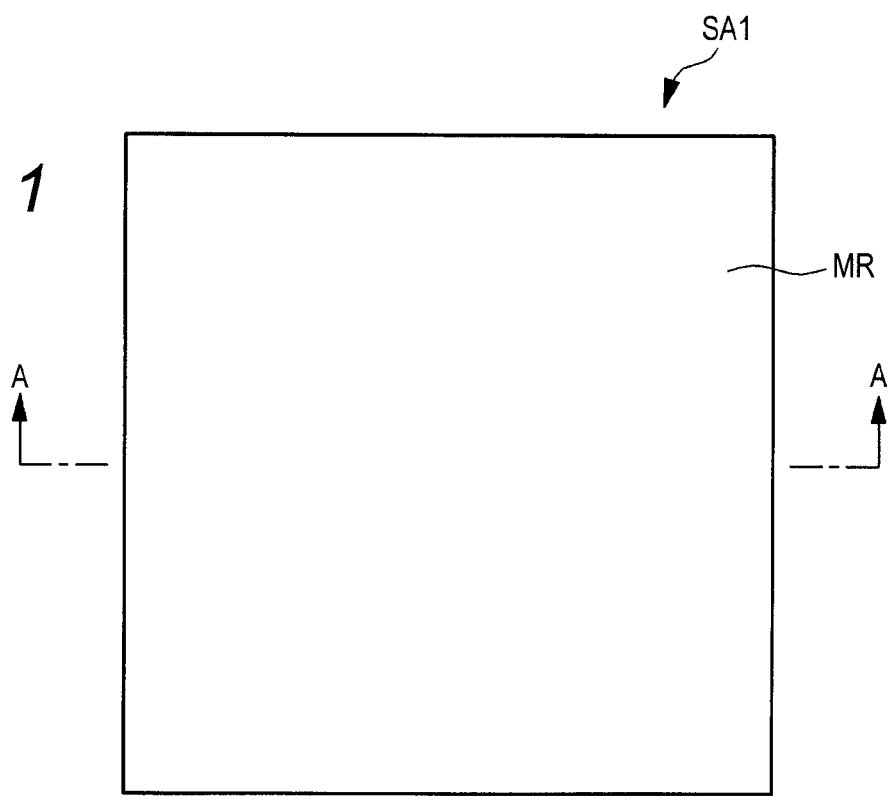
FIG. 1 is a plan view of a semiconductor device formed of a BGA package as seen from the top surface thereof.

First, a description will be given to the configuration example of a semiconductor device formed of a BGA package with reference to the accompanying drawings. FIG. 1 is a plan view of a semiconductor device SA1 formed of a BGA package as seen from the top surface thereof. As shown in FIG. 1, the semiconductor device SA1 in the present embodiment is in the shape of a rectangle, and the top surface of the semiconductor device SA1 is covered with a resin (sealing body) MR.

Figure 2:
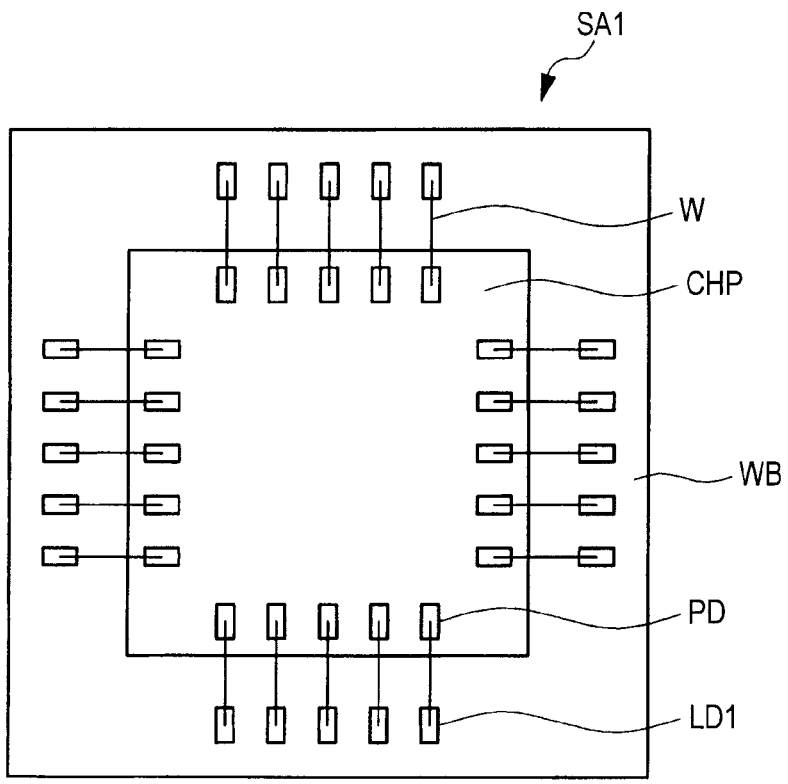
FIG. 2 is a view showing the semiconductor device as seen from the top surface thereof, and seen through a resin.

Subsequently, FIG. 2 is a view of the semiconductor device SA1 as seen from the top surface thereof, and seen through the resin MR. As shown in FIG. 2, in the inside of the semiconductor device SA1 seen through the resin MR, a wiring substrate board WB in a rectangular shape is present. Over the wiring substrate board WB, a semiconductor chip CHP is disposed. The semiconductor chip CHP is also in a rectangular shape. The size of the semiconductor chip CHP is smaller than the size of the wiring substrate board WB. The semiconductor chip CHP is disposed in such a manner as to be two-dimensionally included in the wiring substrate board WB. Particularly, the semiconductor chip CHP is disposed in such a manner that the four sides of the semiconductor chip CHP are mutually in parallel with their corresponding four sides of the wiring substrate board WB, respectively.

In the semiconductor chip CHP, an integrated circuit is formed. Specifically, over a semiconductor substrate forming the semiconductor chip CHP, a plurality of semiconductor elements such as MOSFETs are formed. Then, in layers overlying the semiconductor substrate, a multilayer wiring is formed via interlayer insulation films. The multilayer wiring is electrically coupled with a plurality of MOSFETs formed over the semiconductor substrate to form an integrated circuit. In other words, the semiconductor chip CHP has a semiconductor substrate including a plurality of MOSFETs formed thereover, and the multilayer wiring formed over the semiconductor substrate. Thus, in the semiconductor chip CHP, a plurality of the MOSFETs and the multilayer wiring form an integrated circuit. In order to establish an interface between the integrated circuit and an external circuit, pads PD are formed over the semiconductor chip CHP. The pads PD are each formed by exposing a part of the uppermost-layer wiring formed at the uppermost layer of the multilayer wiring.

As shown in FIG. 2, over the main surface (front surface or top surface) of the semiconductor chip CHP, there are formed a plurality of pads PD. Specifically, a plurality of pads PD are formed in such a manner as to be along respective four sides of the semiconductor chip CHP. Then, a plurality of land terminals LD1 are formed along respective four sides of the wiring substrate board WB in such a manner as to face a plurality of the pads PD formed over the semiconductor chip CHP, respectively. Then, the pads PD formed over the semiconductor chip CHP are electrically coupled with the land terminals LD1 formed over the wiring substrate board WB, respectively, via conductive members. Incidentally, the conductive member in the present embodiment is a wire W formed of, for example, copper (Cu).

Figure 3:
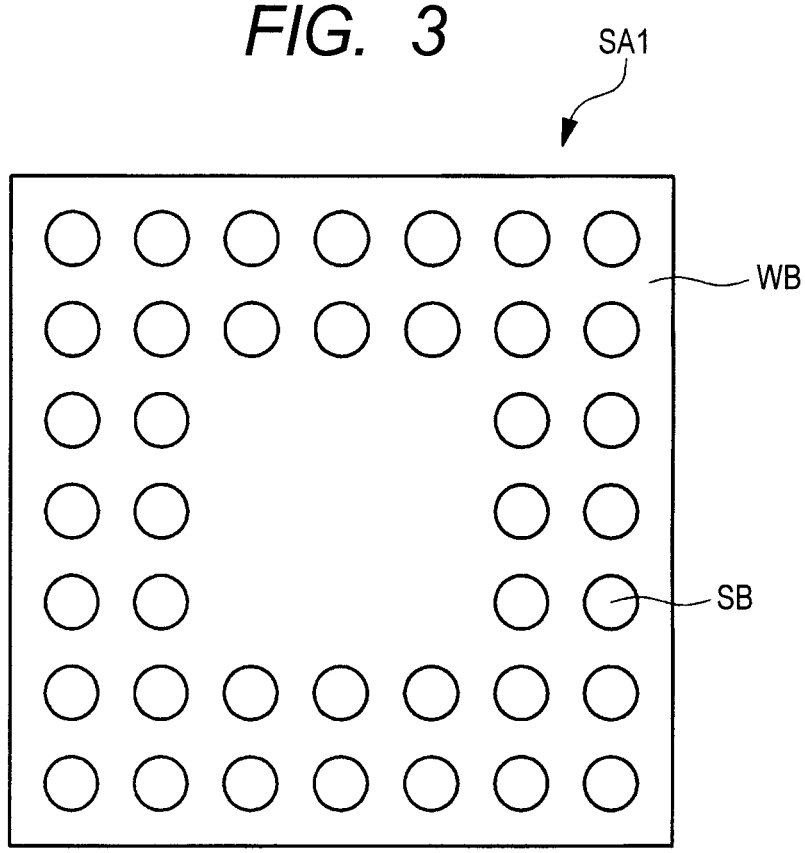
FIG. 3 is a view of a semiconductor device in first embodiment as seen from the back surface thereof.

Then, FIG. 3 is a view of the semiconductor device SA1 in the present first embodiment as seen from the back surface thereof. As shown in FIG. 3, over the back surface of the semiconductor device SA1, a plurality of the solder balls SB are disposed in an array (in rows). The solder balls SB function as external coupling terminals of the semiconductor device SA1.

Figure 4:
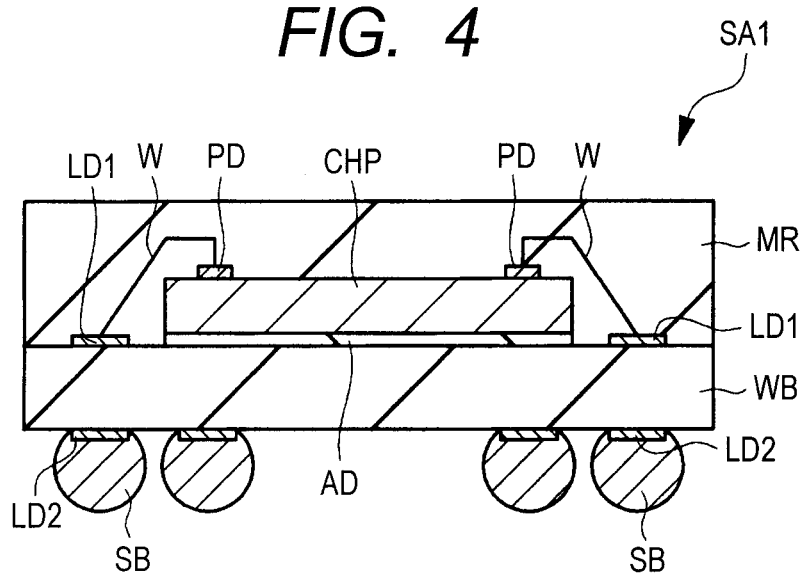
FIG. 4 is a cross-sectional view cut along line A-A of FIG. 1.

FIG. 4 is a cross-sectional view cut along line A-A of FIG. 1. In FIG. 4, over the top surface of the wiring substrate board WB, the land terminals LD1 are formed. Whereas, over the bottom surface of the wiring substrate board WB, terminals (bump lands or electrodes) LD2 are formed. In the inside of the wiring substrate board WB, a multilayer wiring and vias are formed. The land terminals LD1 formed over the top surface of the wiring substrate board WB and the terminals LD2 formed over the bottom surface of the wiring substrate board WB are electrically coupled with each other through the multilayer wiring formed in the inside of the wiring substrate board WB, and via wirings formed in the insides of the vias. The terminals LD2 formed over the bottom surface of the wiring substrate board WB are disposed in an array. Over the terminals LD2, the solder balls SB are mounted, respectively. As a result, over the back surface (bottom surface) of the wiring substrate board WB, the solder balls SB coupled with the terminals. LD2 are disposed in an array.

Over the top surface (front surface or main surface) of the wiring substrate board WB, the semiconductor chip CHP is mounted. The semiconductor chip CHP is bonded with the wiring substrate board WB by an insulating adhesive AD. Then, the pads PD formed over the main surface of the semiconductor chip CHP and the land terminals LD1 formed over the top surface of the wiring substrate board WB are coupled with each other by the wires W. Further, at the top surface of the wiring substrate board WB, a resin (sealing body) MR is formed in such a manner as to cover the semiconductor chip CHP and the wires W.

With the semiconductor device SA1 thus configured, the pads PD formed over the semiconductor chip CHP are coupled with the land terminals LD1 formed over the wiring substrate board WB via the wires W. The land terminals LD1 are electrically coupled with the terminals LD2 formed over the back surface of the wiring substrate board WB through the wires and the via wires formed in the inside of the wiring substrate board WB. Therefore, it is indicated that the integrated circuit formed at the semiconductor chip CHP is finally coupled with the solder ball SB through the path of from the pad PD through the wire W, the land terminal LD1, and the terminal LD2, to the solder balls SB. This indicates the following: by electrically coupling the external circuit with the solder balls SB formed at the semiconductor device SA1, it is possible to couple the integrated circuit formed at the semiconductor chip CHP with the external circuit.

Manufacturing Method of Semiconductor Device (BGA Package)

Figure 5:
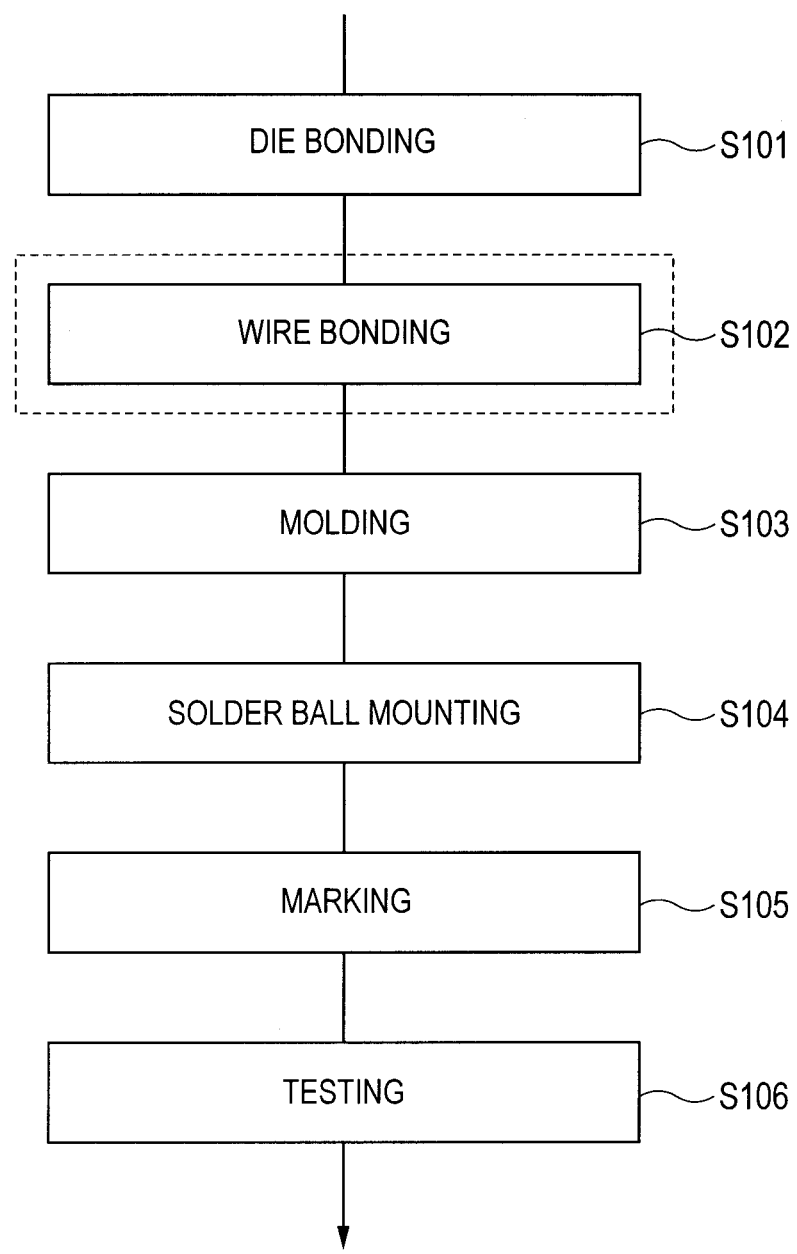
FIG. 5 is a flowchart showing the flow of steps of manufacturing a semiconductor device formed of a BGA package.

The semiconductor device SA1 formed of a BGA package is configured as described above. Below, the manufacturing method thereof will be described in brief. FIG. 5 is a flowchart showing the flow of steps of manufacturing the semiconductor device SA1 formed of a BGA package.

First, over respective chip regions of a semiconductor substrate (semiconductor wafer), semiconductor elements (MOSFETs), a multilayer wiring, and pads are formed. Then, the back surface grinding of the semiconductor substrate is carried out, thereby to reduce the thickness of the semiconductor substrate. Then, the chip regions formed in the semiconductor substrate are subjected to dicing. As a result, a plurality of semiconductor chips are formed.

Then, there is prepared a wiring substrate board including a plurality of land terminals formed over the front surface thereof, and including a plurality of terminals formed over the back surface opposite to the front surface. Then, an adhesive is applied to the chip mounting part (chip mounting region) present on the surface of the wiring substrate board. Thereafter, a semiconductor chip is mounted via the adhesive applied onto the chip mounting part of the wiring substrate board (die bonding step) (S101).

Subsequently, the pads formed over the semiconductor chip and the land terminals formed over the wiring substrate board are coupled by wires, respectively (wire bonding step) (S102). Specifically, first, a capillary is pressed against the pad formed over the semiconductor chip to perform bonding (first bonding). Then, the capillary is moved to bond a wire to the land terminal formed over the wiring substrate board (second bonding). Thus, the pads formed over the semiconductor chip and the land terminals formed over the wiring substrate board can be coupled by wires.

Then, a sealing body formed of, for example, a resin is formed in such a manner as to cover the semiconductor chip, the wires, and the surface of the wiring substrate board (molding step) (S103). Thereafter, solder balls (external coupling terminals) formed of, for example, solder are mounted to the terminals formed over the back surface of the wiring substrate board (solder ball mounting step) (S104). Then, the surface of the sealing body is inscribed with a mark including the manufacturer's serial number or the like, by, for example, a laser (marking step) (S105). The semiconductor devices SA1 thus manufactured are finally subjected to a test (testing step) (S106), and are sorted into good products and bad products. The semiconductor devices SA1 judged as good products are shipped.

The semiconductor device SA1 is a semiconductor device formed of a BGA package. However, the package form to which the technical idea of the present invention is applicable is not limited thereto. For example, the technical idea of the present invention is also applicable to the package form in which not a wiring substrate board but a lead frame is used as a base material (wiring board) for mounting a semiconductor chip thereover. Specifically, the technical idea of the present invention is also widely applicable to a QFP package and a QFN package. Particularly, below, a description will be given to the configuration example of a semiconductor device formed of a QFP package.

Configuration Example of Semiconductor Device (QFP Package)

Figure 6:
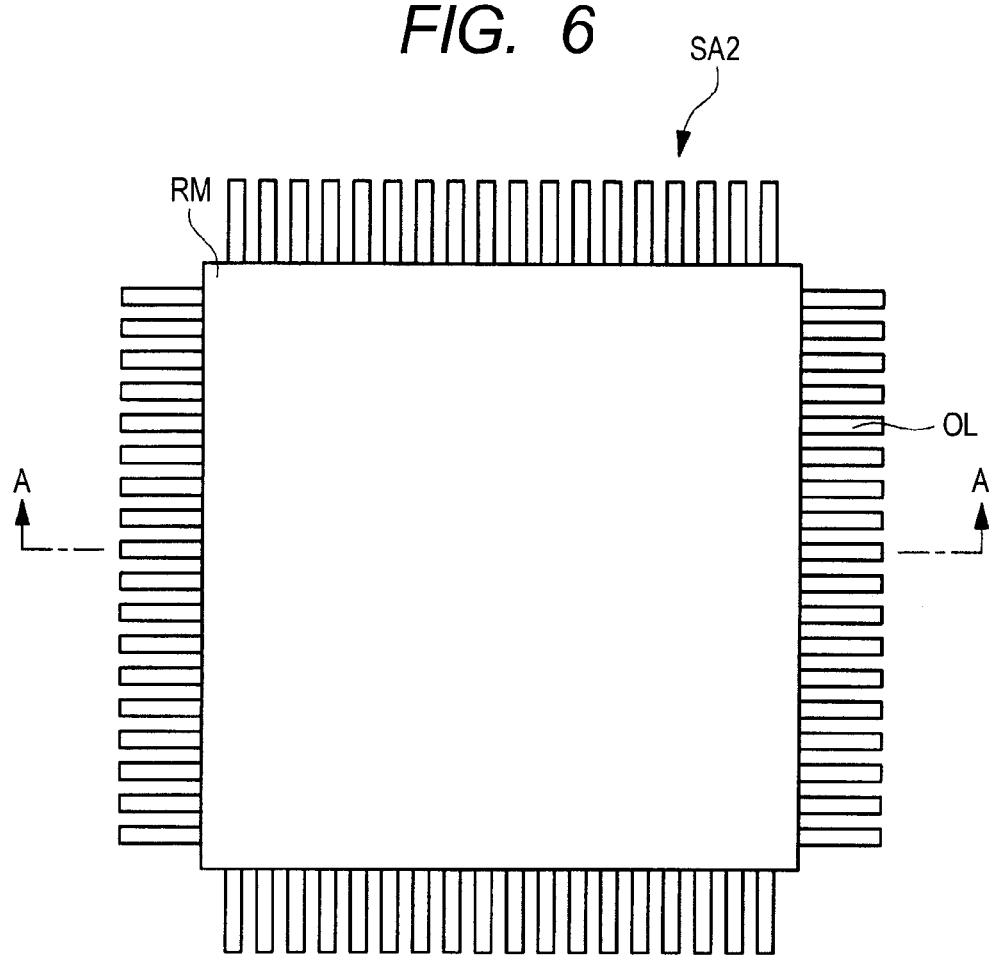
FIG. 6 is a plan view of a semiconductor device formed of a QFP package as seen from the top surface thereof.

First, the configuration of the semiconductor device formed of a QFP package will be described by reference to the accompanying drawings. FIG. 6 is a plan view of the semiconductor device SA2 formed of a QFP package as seen from the top surface thereof. As shown in FIG. 6, the semiconductor device SA2 is in the shape of a rectangle, and the top surface of the semiconductor device SA2 is covered with a resin (sealing body) RM. Then, outer leads OL protrude outwardly from the four sides defining the outside shape of the resin RM.

Figure 7:
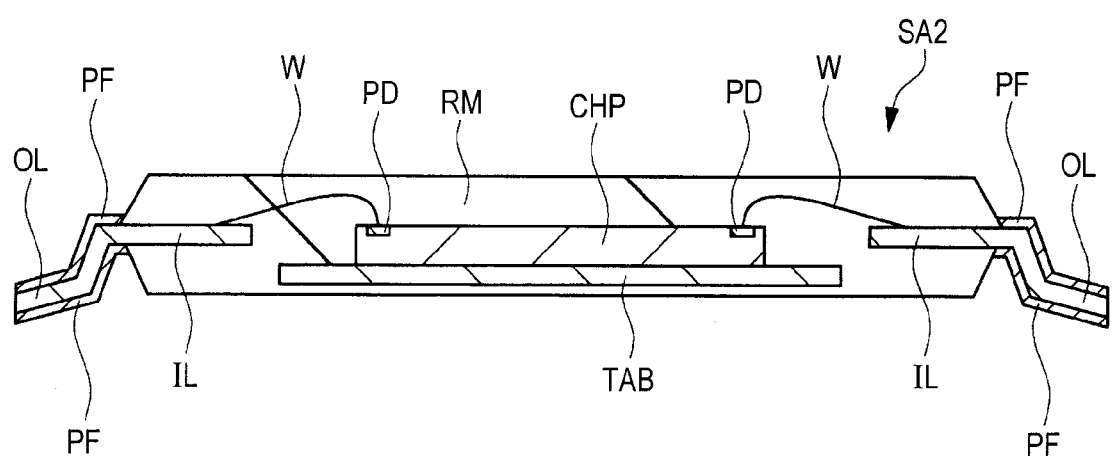
FIG. 7 is a cross-sectional view cut along line A-A of FIG. 6.

Subsequently, a description will be given to the internal structure of the semiconductor device SA2. FIG. 7 is a cross-sectional view cut along line A-A of FIG. 6. As shown in FIG. 7, the back surface of the chip mounting part TAB is covered with the resin RM. On the other hand, over the top surface of the chip mounting part TAB, a semiconductor chip CHP is mounted. Over the main surface of the semiconductor chip CHP, pads PD are formed. Then, the pads PD formed over the semiconductor chip CHP are electrically coupled with the inner leads IL by wires W, respectively. The semiconductor chip CHP, the wires W, and the inner leads IL are covered with the resin RM. Each outer lead OL integral with each inner lead IL protrudes from the resin RM. The outer lead OL protruding from the resin RM is formed in a gull-wing shape, and includes a plating film PF formed over the surface thereof.

The chip mounting part TAB, the inner leads IL, and the outer leads OL are formed of, for example, a copper material or 42 alloy which is an alloy of iron and nickel. The wire W is formed of, for example, a copper wire. The semiconductor chip CHP is formed of, for example, silicon or a compound semiconductor (such as GaAs). Over the semiconductor chip CHP, a plurality of semiconductor elements such as MOSFETs are formed. Then, a multilayer wiring is formed via interlayer insulation films over the semiconductor elements. At the uppermost layer of the multilayer wiring, there is formed the pad PD coupled with the multilayer wiring. This results in that the semiconductor elements formed over the semiconductor chip CHP are electrically coupled with the pads PD via the multilayer wiring. In other words, the semiconductor elements and the multilayer wiring formed over the semiconductor chip CHP form an integrated circuit. The one functioning as a terminal for coupling the integrated circuit and the outside of the semiconductor chip CHP is the pad PD. Each pad PD is coupled with each inner lead IL by the wire W, and coupled with the outer lead OL formed integrally with the inner lead IL. This indicates the following: the integrated circuit formed over the semiconductor chip CHP can be electrically coupled with the outside of the semiconductor device SA2 through the path of from the pad PD through the wire W, the inner lead IL, and the outer lead OL to an external coupling device. In other words, it is indicated as follows: by inputting electric signals from the outer leads OL formed over the semiconductor device SA2, it is possible to control the integrated circuit formed over the semiconductor chip CHP. Further, it is indicated as follows: it is also possible to extract output signals from the integrated circuit outward.

Manufacturing Method of Semiconductor Device (QFP Package)

Figure 8:
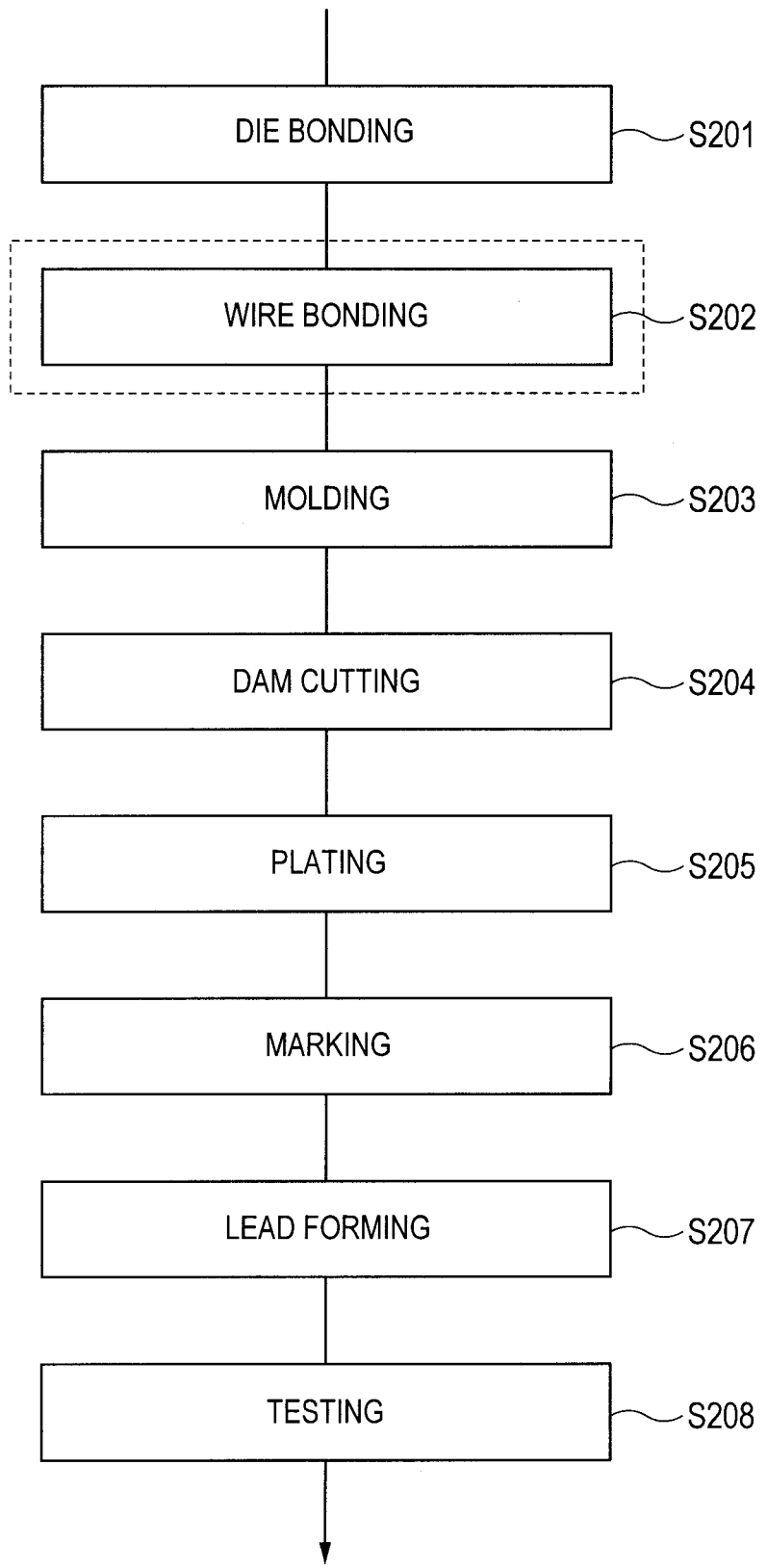
FIG. 8 is a flowchart showing the flow of the steps of forming an integrated circuit in a semiconductor chip, and then manufacturing a semiconductor device formed of a QFP package.

A semiconductor device SA2 formed of a QFP package is configured as described above. Below, a manufacturing method thereof will be described in brief. FIG. 8 is a flowchart showing the flow of the steps of forming an integrated circuit in a semiconductor chip, and then, manufacturing a semiconductor device formed of a QFP package after forming an integrated circuit over the semiconductor chip. First, after mounting a semiconductor chip at a chip mounting part formed in a lead frame (die bonding of S201), the pads formed over the semiconductor chip and the inner leads are coupled by wires (wire bonding of S202). Then, the chip mounting part, the semiconductor chip, the wire, and the inner leads are sealed with a resin (molding of S203). Then, after cutting the dam formed at the lead frame (dam cutting of S204), a plating film is formed over the surface of the outer lead exposed from the resin (plating of S205). Subsequently, after forming marks on the surface of the resin (marking of S206), the outer lead protruding from the resin is formed (lead forming of S207). After forming the semiconductor device SA2 in this manner, an electric characteristic test is carried out (testing of S208), the semiconductor devices SA2 judged as good products are shipped as products.

Details of Wire Bonding Step

As described above, as the configuration examples of the package of the semiconductor device, there were taken the semiconductor device SA1 formed of a BGA package and the semiconductor device formed of a QFP package SA2. However, the technical idea of the present invention is regarding the wire bonding step (S102 of FIG. 5, and S202 of FIG. 8) common to both. Thus, below, the details of the wire bonding step will be described. Then, a description will be given to the problems found by the present inventors, and the technical idea in the first embodiment in which an idea to solve the problems is implemented in this order.

Figure 9:
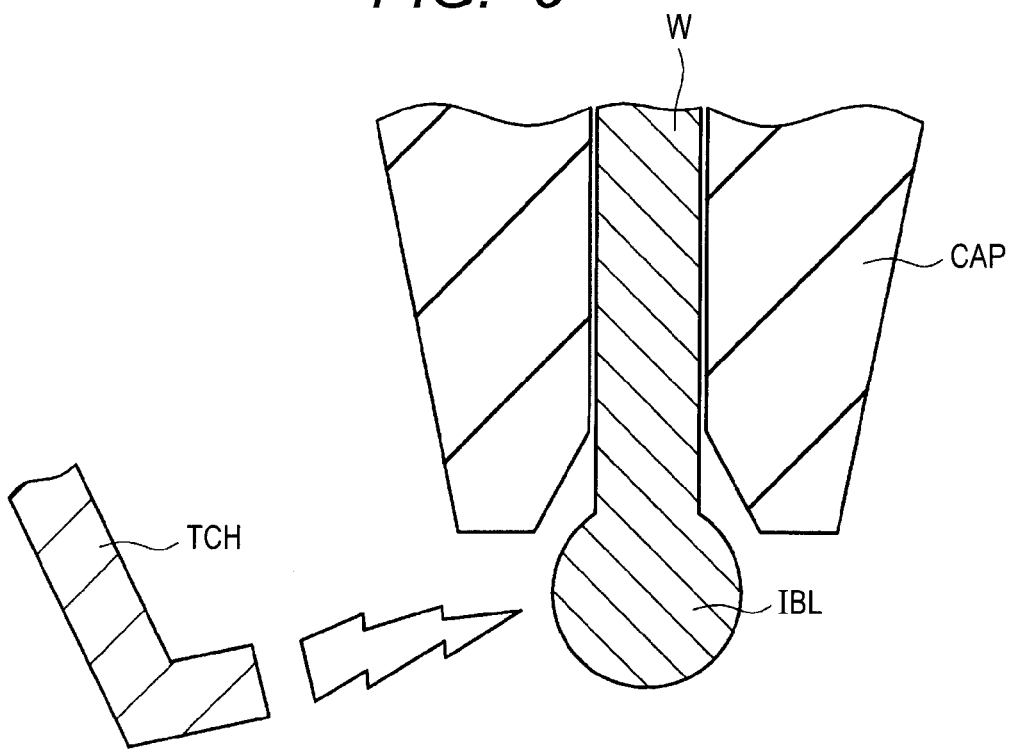
FIG. 9 is a view for illustrating a wire bonding step.

First, the details of the wire bonding step will be described by reference to the accompanying drawings. As shown in FIG. 9, by discharge with a discharge torch TCH, an initial ball IBL is formed at the tip part of the wire W led out from the capillary CAP.

Figure 10:
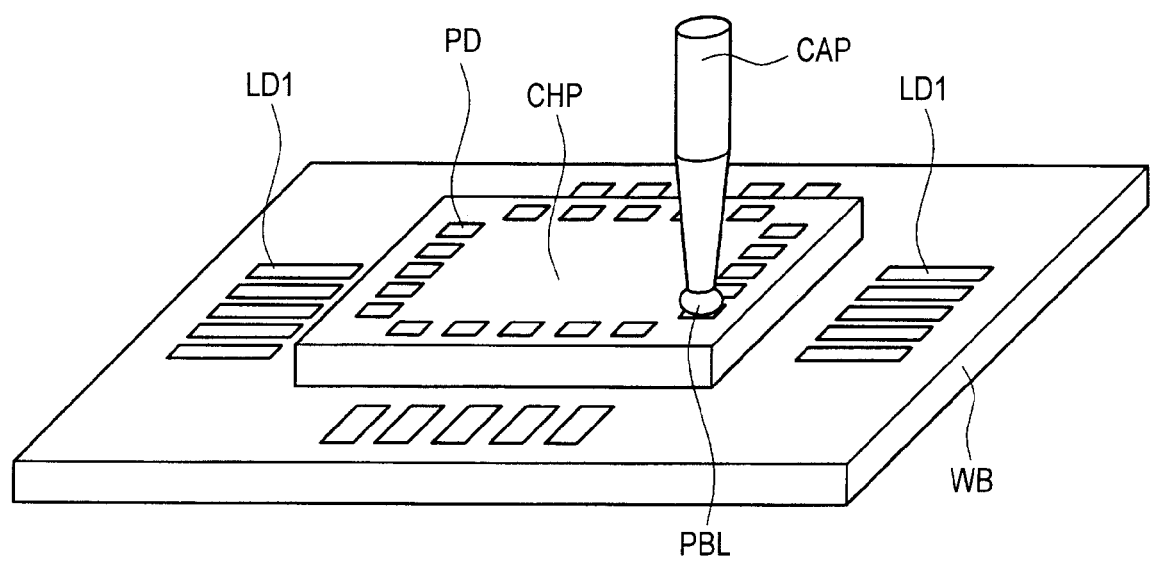
FIG. 10 is a view for illustrating a wire bonding step following FIG. 9.

Then, as shown in FIG. 10, the initial ball IBL formed at the tip part of the capillary CAP is bonded onto the pad PD of the semiconductor chip CHP mounted over the wiring substrate board WB (first bonding). At this step, the capillary CAP is applied with a load and an ultrasonic vibration. Accordingly, the initial ball IBL landed on the pad PD of the semiconductor chip CHP is deformed by the load and the ultrasonic vibration applied to the capillary CAP. This results in the formation of a press-bonded ball PBL having a large contact area with the pad PD.

Figure 11:
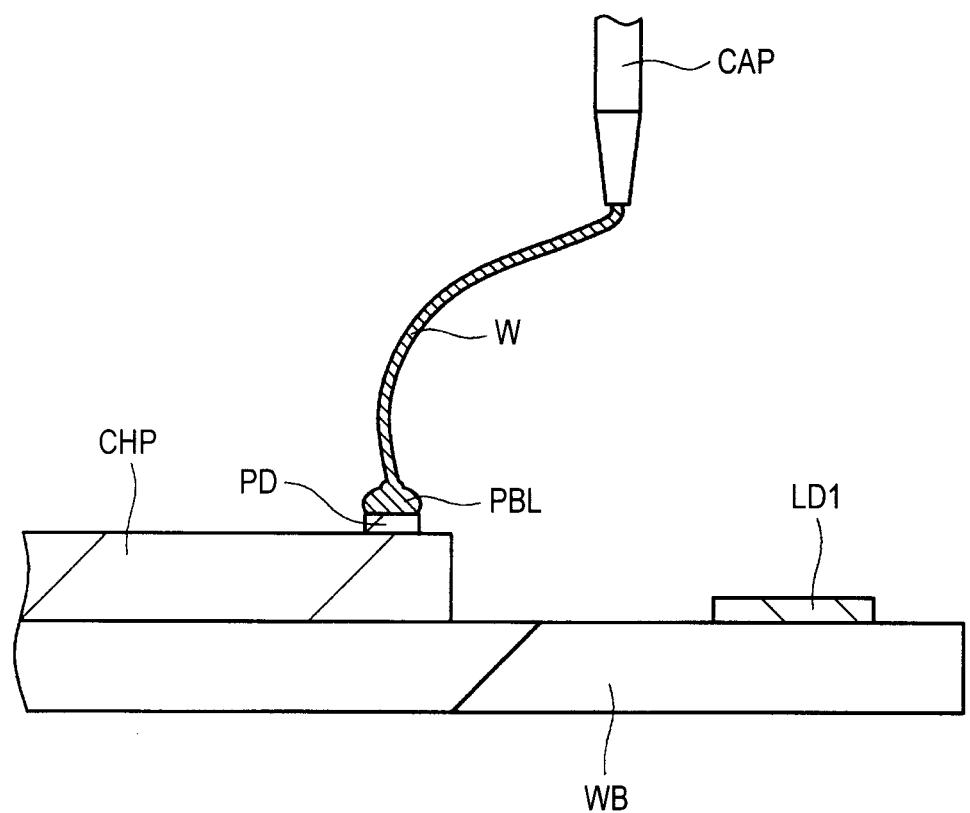
FIG. 11 is a view for illustrating a wire bonding step following FIG. 10.
Figure 12:
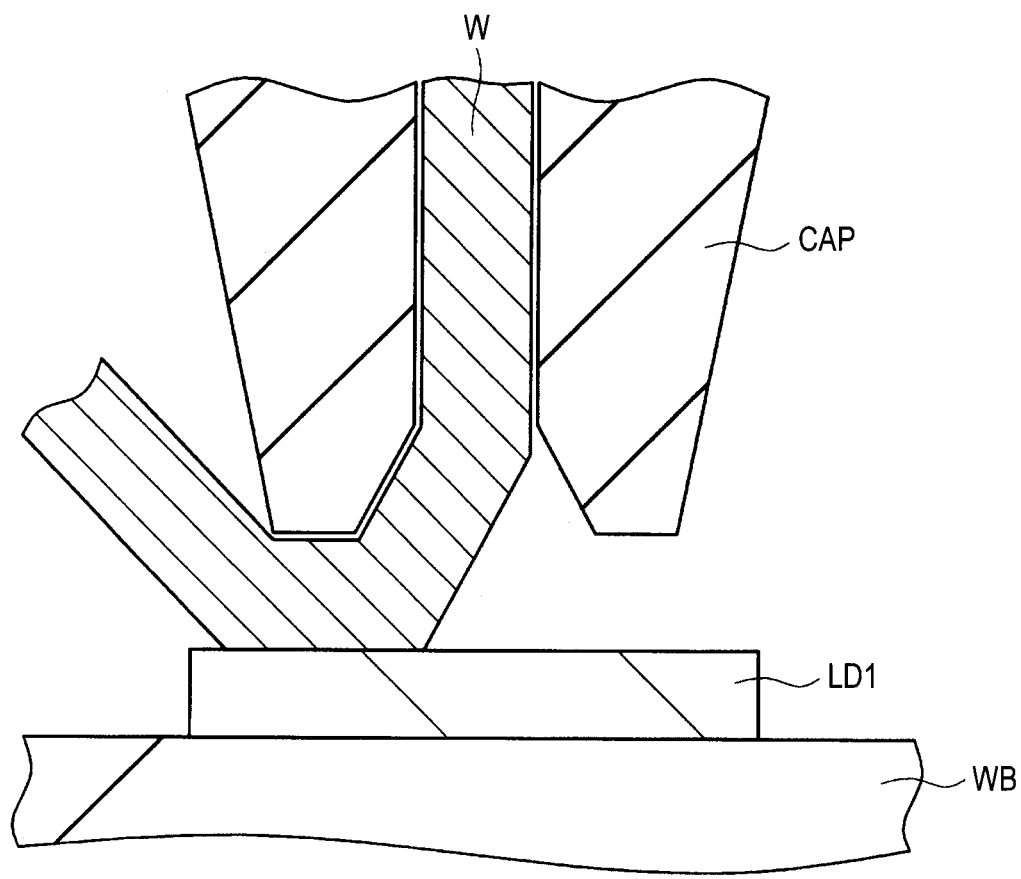
FIG. 12 is a view for illustrating a wire bonding step following FIG. 11.
Figure 13:
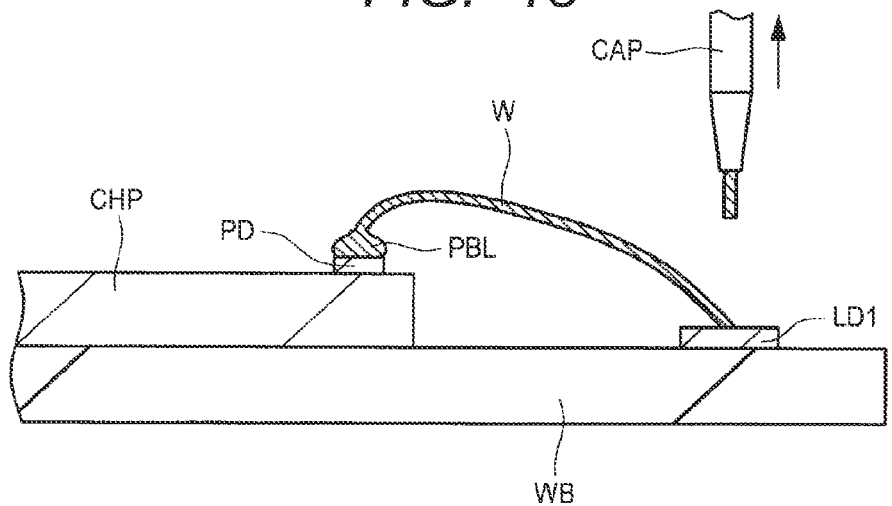
FIG. 13 is a view for illustrating a wire bonding step following FIG. 12.

Then, as shown in FIG. 11, the capillary CAP is moved from a position of the top of the semiconductor chip CHP at which the pad PD is formed, while leading out the wire W from the capillary CAP. Then, as shown in FIG. 12, the wire W is bonded to the land terminal LD1 formed over the wiring substrate board WB (second bonding). Thereafter, as shown in FIG. 13, the wire W subjected to second bonding is cut from the capillary CAP. Thus, the pad PD formed over the semiconductor chip CHP and the land terminal LD1 formed over the wiring substrate board WB can be coupled by the wire W.

Problems Found by the Present Inventors

In the wire bonding step, after landing the initial ball IBL over the semiconductor chip CHP, the initial ball IBL is deformed by the load and the ultrasonic vibration applied to the capillary CAP. As a result, a press-bonded ball PBL is formed. Then, when the capillary CAP is lifted, there becomes apparent a problem that the pad PD is peeled off together with the press-bonded ball PBL. This has been revealed by the study of the present inventors. This point will be described with reference to the accompanying drawings.

Figure 14:
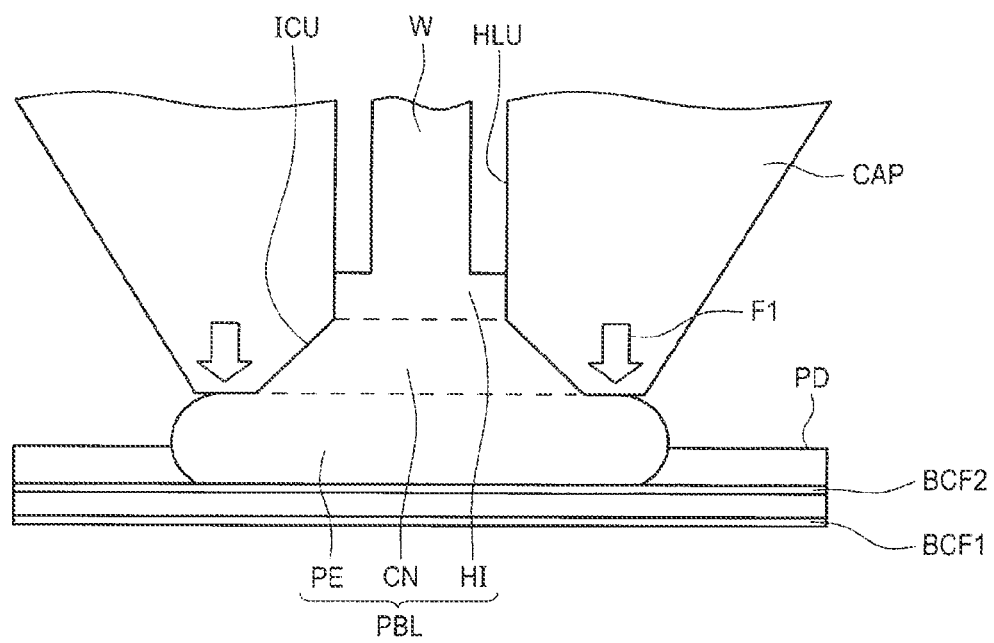
FIG. 14 is a view for illustrating a problem found by the present inventors.

As shown in FIG. 14, for example, the pad PD is formed of a barrier conductive film BCF1 formed of a titanium nitride film or a titanium film, a barrier conductive film BCF2, and an aluminum film (aluminum alloy film). Over the pad PD, a press-bonded ball PBL is formed by the capillary CAP. At this step, the capillary CAP has a hole part HLU for passing the wire W therethrough, and an inner chamfer part ICU in a tapered shape. The press-bonded ball PBL is formed in such a manner as to be along the shapes thereof. Specifically, the press-bonded ball PBL includes, as shown in FIG. 14, a pedestal part (annulus part) (first portion) PE in contact with the pad PD, a corn part (second portion) CN formed over the pedestal part PE, and a hole insertion part (third portion) HI formed over the corn part CN, and coupled with the wire W. Herein, the corn part CN of the press-bonded ball PBL is a portion shaped by the inner chamfer part ICU of the capillary CAP. The hole insertion part HI of the press-bonded ball PBL is a portion shaped by the hole part HLU of the capillary CAP.

Figure 15:
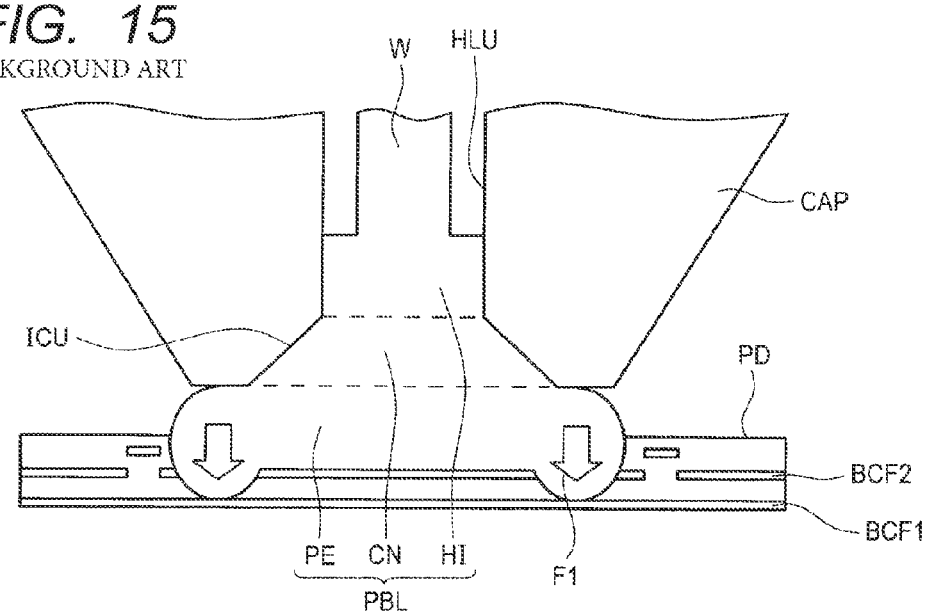
FIG. 15 is a view for illustrating a problem found by the present inventors.

As shown in FIG. 14, the press-bonded ball PBL is formed by a compressive load F1 applied by the capillary CAP. Particularly, the compressive load F1 applied to the outer edge part of the press-bonded ball PBL is increased. Accordingly, for example, as shown in FIG. 15, the compressive load F1 locally applied to the outer edge part of the press-bonded ball PBL causes the outer edge part in the pedestal part PE of the press-bonded ball PBL to enter the inside of the pad PD. As a result, the barrier conductive film BCF2 formed at the outer edge part of the pad PD is broken. Further, the compressive load applied to the press-bonded ball PBL also increases the thickness of the hole insertion part HI to be inserted (forced) into the hole part HLU of the capillary CAP.

Figure 16:
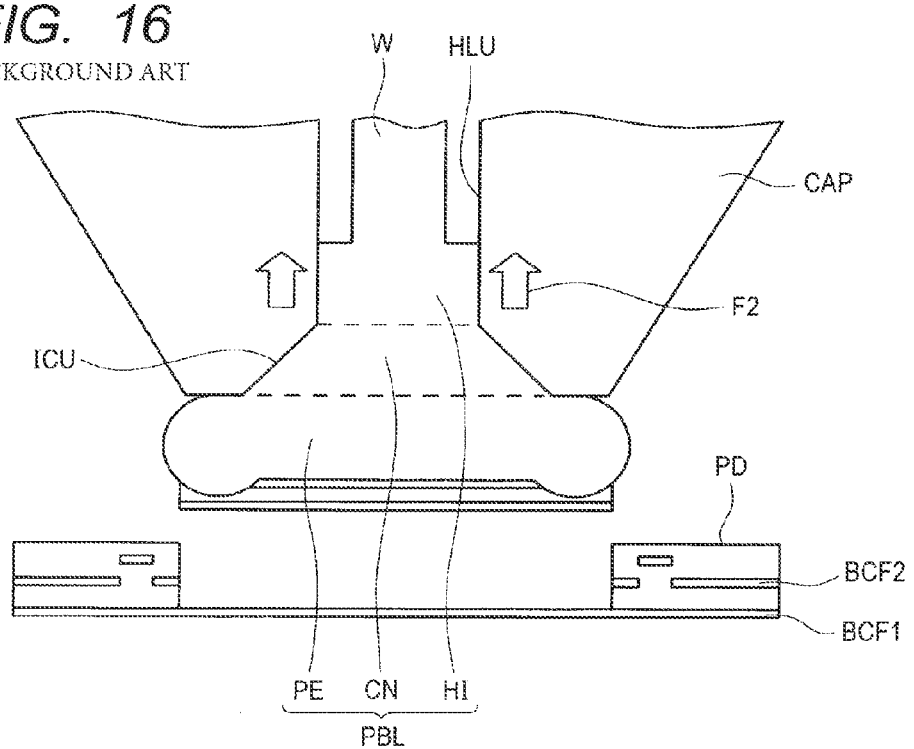
FIG. 16 is a view for illustrating a problem found by the present inventors.

As a result, as shown in FIG. 16, when the capillary CAP is lifted, a part of the pad PD caught in the outer edge part of the pedestal part PE entered the pad PD is peeled off due to a tensile load F2 based on the frictional force between the hole part HLU of the capillary CAP and the hole insertion part HI of the press-bonded ball PBL.

In other words, in the wire bonding step, first, there is the following first factor: the compressive load applied from the capillary. CAP to the outer edge part of the press-bonded ball PBL is increased; this causes the outer edge part of the pedestal part PE of the press-bonded ball PBL to enter the inside of the pad. Further, there is the following second factor: the increase in compressive load increases the insertion pressure on the hole insertion part HI; this results in an increase in frictional force between the hole insertion part HI of the press-bonded ball PBL and the hole part of the capillary CAP; accordingly, the tensile stress for lifting the capillary CAP increases. Then, the first factor and the second factor conceivably cause peeling of the pad PD.

Herein, as the material for the wire W, for example, gold is often used. However, with a recent increase in demand for gold, the price has increased. For this reason, in order to suppress the material cost in the manufacturing process of a semiconductor device, a study has been conducted on the use of a copper wire formed of copper lower in price than gold. Particularly, the copper wire has a characteristic of being lower not only in cost but also in electric resistivity than a gold wire. For this reason, the copper wire is also excellent in electric characteristics, and receives attention. However, when a material containing copper as a main component is used as the wire W, particularly, the pad peeling becomes apparent. Below, while performing comparison with the case where gold is used as the material for the wire W, a description will be given to the mechanism in which pad peeling often occurs when a material containing copper as a main component is used as the material for the wire W.

Mechanism in which Pad Peeling Often Occurs when a Copper Wire is Used

Figure 17:
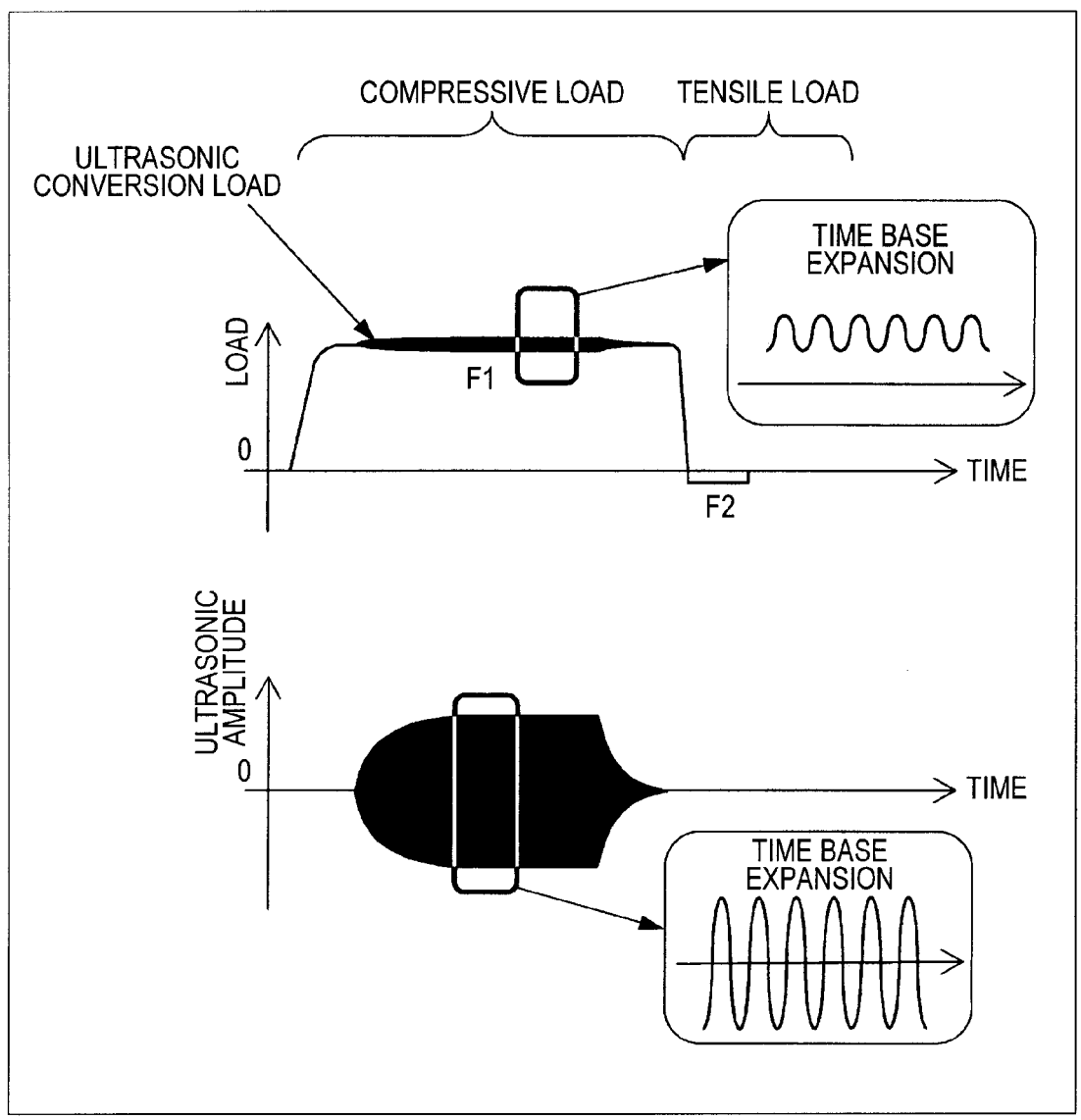
FIG. 17 shows graphs showing the compressive load and the tensile load to be applied to the press-bonded ball when a gold wire is used, and showing the ultrasonic amplitude to be applied to the press-bonded ball.

First, a description will be given to the case where wire bonding is performed using a gold wire. FIG. 17 shows graphs showing the compressive load and the tensile load to be applied to the press-bonded ball when a gold wire is used, and showing the ultrasonic amplitude to be applied to the press-bonded ball. In the upper graph of FIG. 17, first, in the wire bonding step, a compressive load F1 is applied to the initial ball. The compressive load F1 includes a compressive load caused by pressing of the capillary itself, and an ultrasonic conversion load resulting from the conversion of the ultrasonic amplitude applied in the horizontal direction of the pad due to the structure of the capillary. Then, the initial ball is applied with a compressive load, thereby to form a press-bonded ball. Thereafter, when the capillary is lifted, the press-bonded ball is applied with a tensile load F2.

Herein, gold is soft, and tends to be deformed. For this reason, the compressive load F1 to be applied for deformation from the initial ball into the press-bonded ball is relatively small. Further, the ultrasonic amplitude is applied in order to rub the press-bonded ball against the pad, and thereby to remove the oxide film formed over the surface of the press-bonded ball, and the oxide film formed over the pad surface (generally, often, an aluminum film). When a gold wire is used, gold is not oxidized. For this reason, the ultrasonic amplitude to be applied to the capillary is relatively small. Accordingly, the ultrasonic conversion load converted from the ultrasonic amplitude is also reduced.

Figure 18:
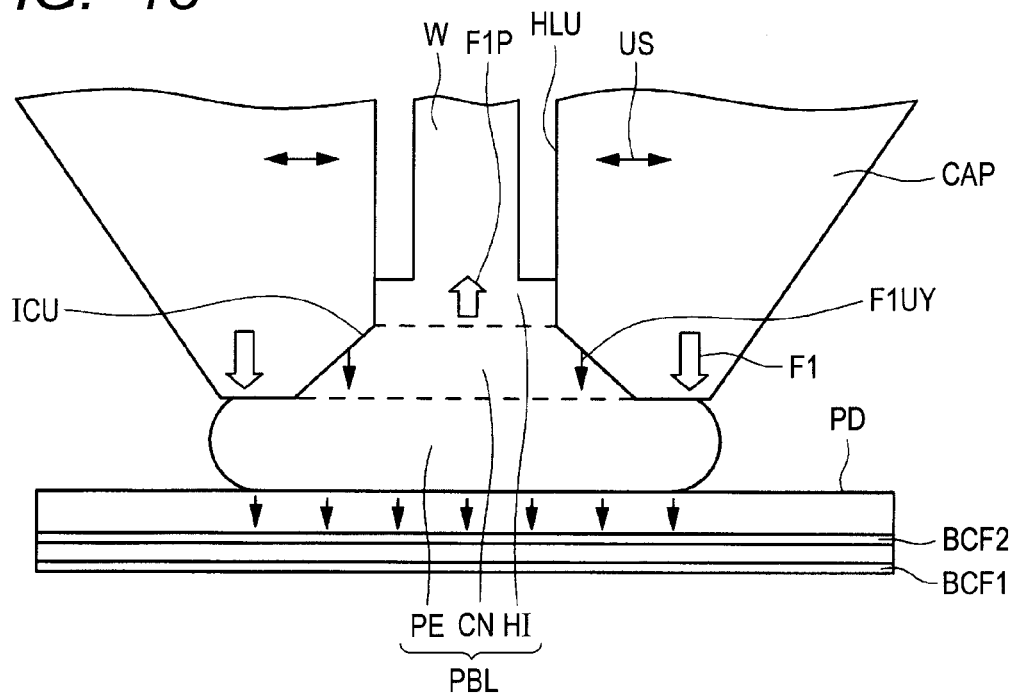
FIG. 18 is a view showing the manner in which a press-bonded ball formed of gold is formed over a pad.

Specifically, FIG. 18 is a view showing the manner in which a press-bonded ball PBL formed of gold is formed over a pad. As shown in FIG. 18, the press-bonded ball PBL is applied with a compressive load F1. The compressive load F1 includes a load caused by pressing of the capillary CAP, and an ultrasonic conversion load F1UY resulting from the conversion of the ultrasonic vibration US into the vertical direction due to the tapered shape by the inner chamfer part ICU of the capillary CAP. At this step, gold itself is soft, and tends to be deformed. For this reason, the load caused by pressing of the capillary CAP is also reduced, and gold itself is not oxidized. Accordingly, the ultrasonic vibration US is also reduced. As a result, the ultrasonic conversion load F1UY is also reduced. This also results in reduction of the compressive load F1 including the load caused by pressing of the capillary CAP, and the ultrasonic conversion load F1UY added thereto. For this reason, as shown in FIG. 18, the outer edge part of the press-bonded ball PBL is not locally applied with a large compressive load F1, and the contact portion between the pedestal part PE and the pad PD is roughly uniformly applied with a load. This indicates as follows: when a gold wire is used, the outer edge part of the pedestal part PE does not enter the pad PD. As a result, the first factor causing pad peeling scarcely occurs. Further, the magnitude of the compressive load F1 itself is also reduced. Accordingly, the injection pressure F1P of the capillary CAP into the hole part HLU is also reduced. This results in the reduction of the thickness of the hole insertion part HI of the press-bonded ball PBL.

Figure 19:
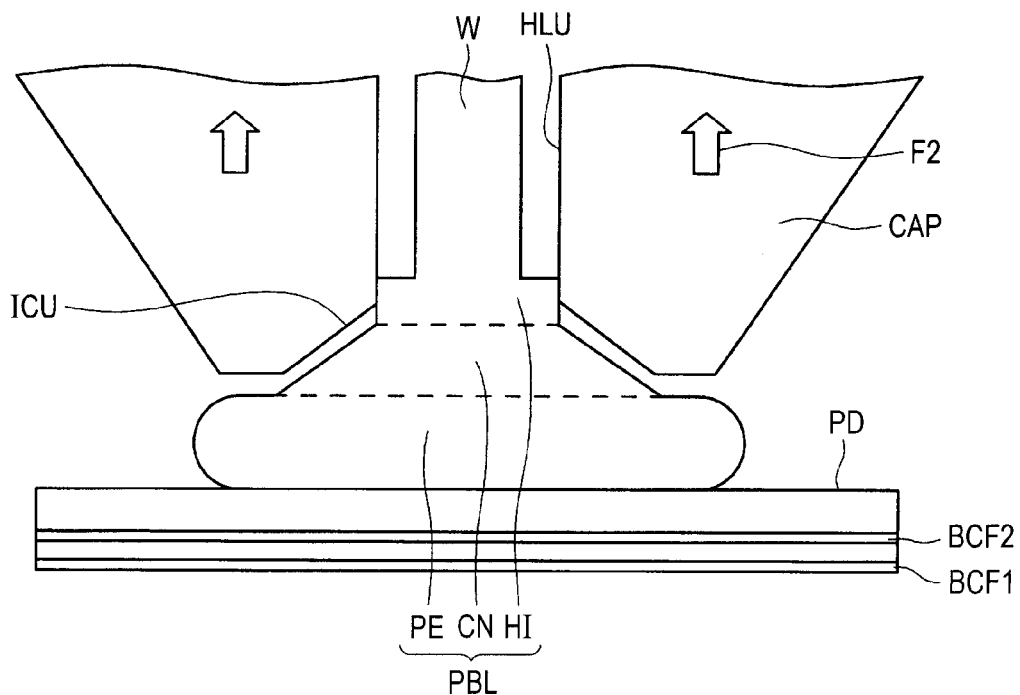
FIG. 19 is a view showing the manner in which a capillary is lifted upward after forming the press-bonded ball.

Subsequently, FIG. 19 is a view showing the manner in which the capillary CAP is lifted upward after forming the press-bonded ball PBL. In FIG. 19, when a gold wire is used, as described above, the hole insertion part HI of the press-bonded ball PBL to be inserted into the hole part HLU of the capillary CAP is small in thickness. Accordingly, the frictional force between the hole part HLU of the capillary CAP and the hole insertion part HI of the press-bonded ball PBL is also reduced. This also results in the reduction of the tensile load. F2 to be applied to the press-bonded ball PBL. For this reason, when a gold wire is used, the effect of the second factor is also reduced. Thus, it is indicated as follows: in wire bonding using a gold wire, the first factor and the second factor do not become apparent; accordingly, pad peeling caused by the first factor and the second factor becomes less likely to occur.

Figure 20:
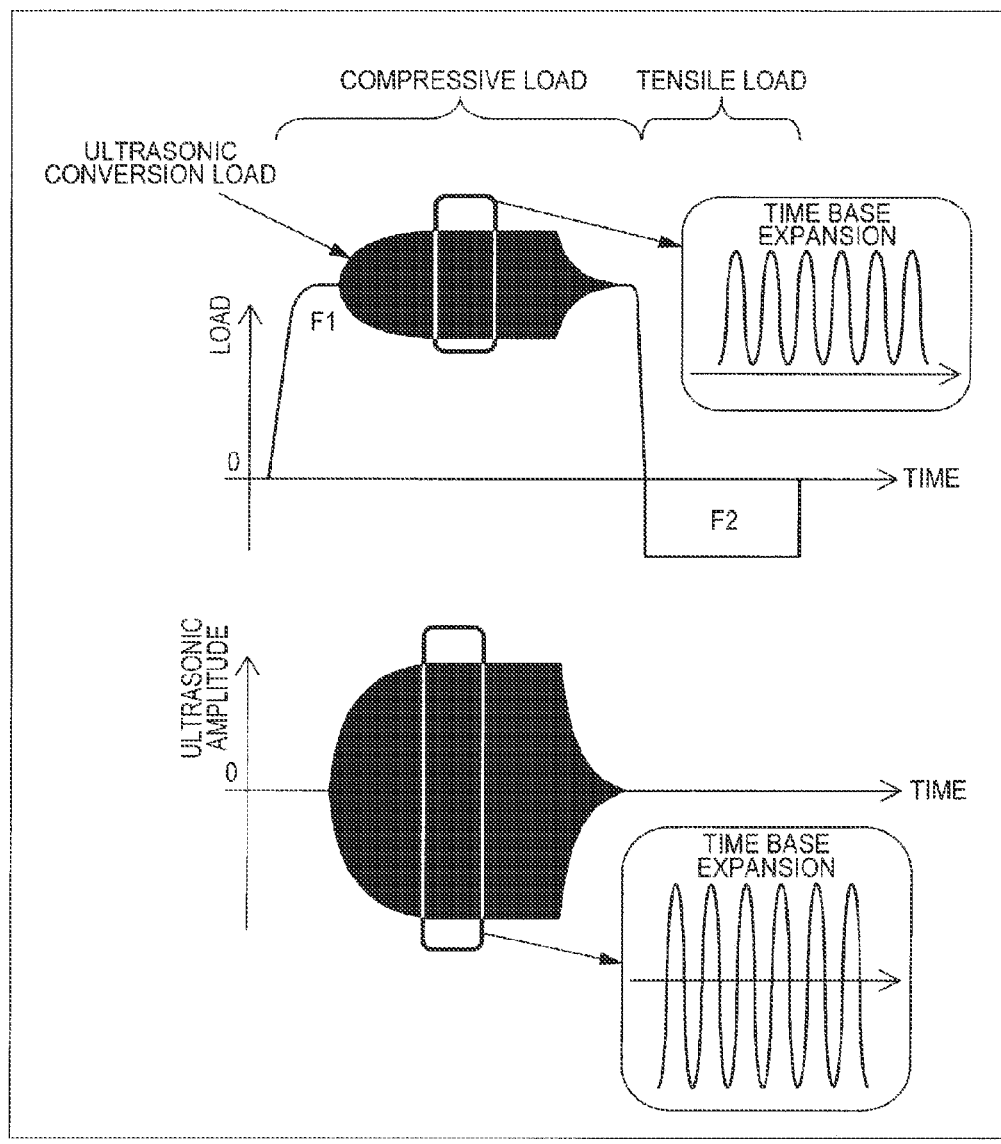
FIG. 20 shows graphs showing the compressive load and the tensile load to be applied to the press-bonded ball when a copper wire is used, and showing the ultrasonic amplitude to be applied to the press-bonded ball.

Then, a description will be given to the case where wire bonding is performed using a copper wire. FIG. 20 shows graphs showing the compressive load and the tensile load to be applied to the press-bonded ball when a copper wire is used, and showing the ultrasonic amplitude to be applied to the press-bonded ball. In the upper graph of FIG. 20, first, in the wire bonding step, the initial ball is applied with a compressive load F1. The compressive load F1 includes a compressive load caused by pressing of the capillary itself, and an ultrasonic conversion load resulting from the conversion of the ultrasonic amplitude applied in the horizontal direction of the pad due to the structure of the capillary. Then, the initial ball is applied with a compressive load, thereby to form a press-bonded ball. Thereafter, when the capillary is lifted, the press-bonded ball is applied with a tensile load F2.

Herein, copper is harder than gold. For this reason, in order to deform the initial ball formed of copper, and to form a press-bonded ball, a larger compressive load F1 than in the case of gold wire is required to be applied. Further, copper is oxidized as distinct from gold. Accordingly, the oxide film formed over the contact surface of the press-bonded ball with the pad is required to be removed. This also results in an increase in ultrasonic vibration (ultrasonic amplitude) to be applied to the press-bonded ball.

Figure 21:
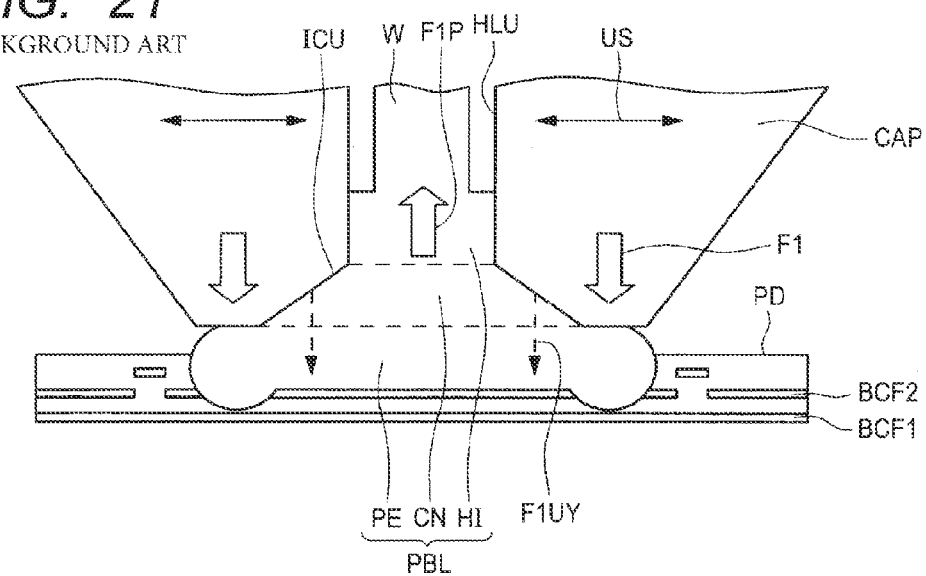
FIG. 21 is a view showing the manner in which a press-bonded ball formed of copper is formed over a pad.

Specifically, FIG. 21 is a view showing the manner in which a press-bonded ball PBL formed of copper is formed over a pad PD. As shown in FIG. 21, the press-bonded ball PBL is applied with a compressive load F1. The compressive load F1 includes a load caused by pressing of the capillary CAP, and an ultrasonic conversion load F1UY resulting from the conversion of the ultrasonic vibration US into the vertical direction due to the tapered shape by the inner chamfer part ICU of the capillary CAP. At this step, copper, is harder than gold. For this reason, the load caused by pressing of the capillary CAP is also increased, and copper itself is oxidized. Accordingly, the ultrasonic vibration US is also increased. As a result, the ultrasonic conversion load F1UY is also increased. This also results in an increase in the compressive load F1 including the load caused by pressing of the capillary CAP, and the ultrasonic conversion load F1UY added thereto. For this reason, as shown in FIG. 21, the outer edge part of the press-bonded ball PBL is locally applied with a large compressive load F1. Accordingly, the outer edge part of the pedestal part PE enters the inside of the pad PD, and locally breaks the barrier conductive film BCF2 present in the inside of the pad PD. Namely, use of a copper wire increases the possibility that the outer edge part of the pedestal part PE enters the pad PD. This makes apparent the first factor causing pad peeling. Further, the magnitude of the compressive load F1 itself increases. Accordingly, the injection pressure F1P of the capillary CAP into the hole part HLU is also increased. This also results in an increase in thickness of the hole insertion part HI of the press-bonded ball PBL.

Figure 22:
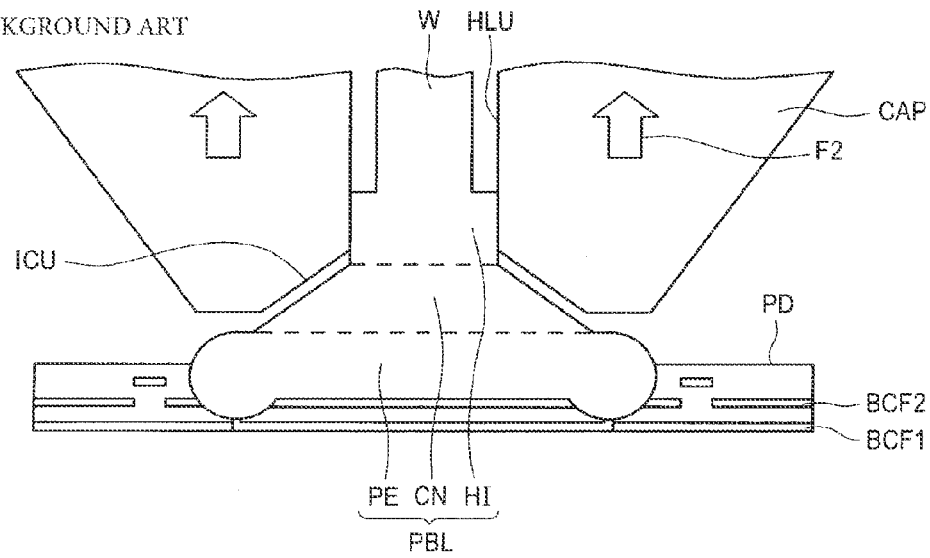
FIG. 22 is a view showing the manner in which a capillary is lifted upward after forming the press-bonded ball.

Subsequently, FIG. 22 is a view showing the manner in which the capillary CAP is lifted upward after forming the press-bonded ball PBL. In FIG. 22, when a copper wire is used, as described above, the hole insertion part HI of the press-bonded ball PBL to be inserted into the hole part HLU of the capillary CAP is large in thickness. Accordingly, the frictional force between the hole part HLU of the capillary CAP and the hole insertion part HI of the press-bonded ball PBL is also increased. This also results in an increase in tensile load F2 to be applied to the press-bonded ball PBL. For this reason, when a copper wire is used, the second factor also becomes apparent. Thus, it is indicated as follows: in wire bonding using a copper wire, the first factor and the second factor become apparent; accordingly, pad peeling caused by the first factor and the second factor becomes more likely to occur.

Under such circumstances, in the present first embodiment, there is implemented an idea capable of suppressing pad peeling (one mode of damages to be applied to the pad) in the wire bonding step using a copper wire. Below, a description will be given to the technical idea in the present first embodiment in which this idea is implemented.

Features in First Embodiment

The technical idea in the present first embodiment focuses on the point that the ultrasonic vibration to be applied in the direction (horizontal direction) in parallel with the surface of the pad is converted into the ultrasonic conversion load in the direction perpendicular to the surface of the pad due to the tapered shape of the inner chamfer part of the capillary. Namely, an increase in ultrasonic conversion load results in an increase in compressive load to be applied to the press-bonded ball. This causes pad peeling. For this reason, in the present first embodiment, an idea is implemented so as to minimize the ultrasonic conversion load.

Figure 23:
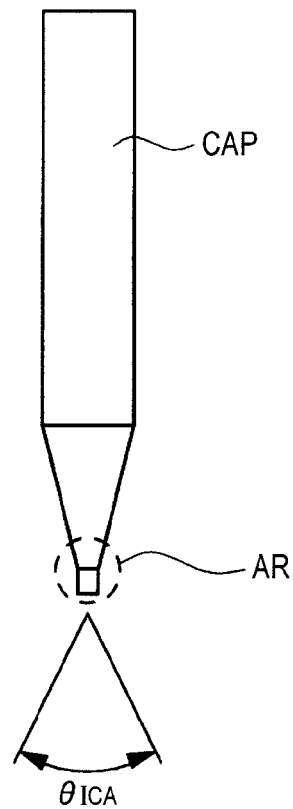
FIG. 23 is a view showing the outward configuration of the capillary.
Figure 24:
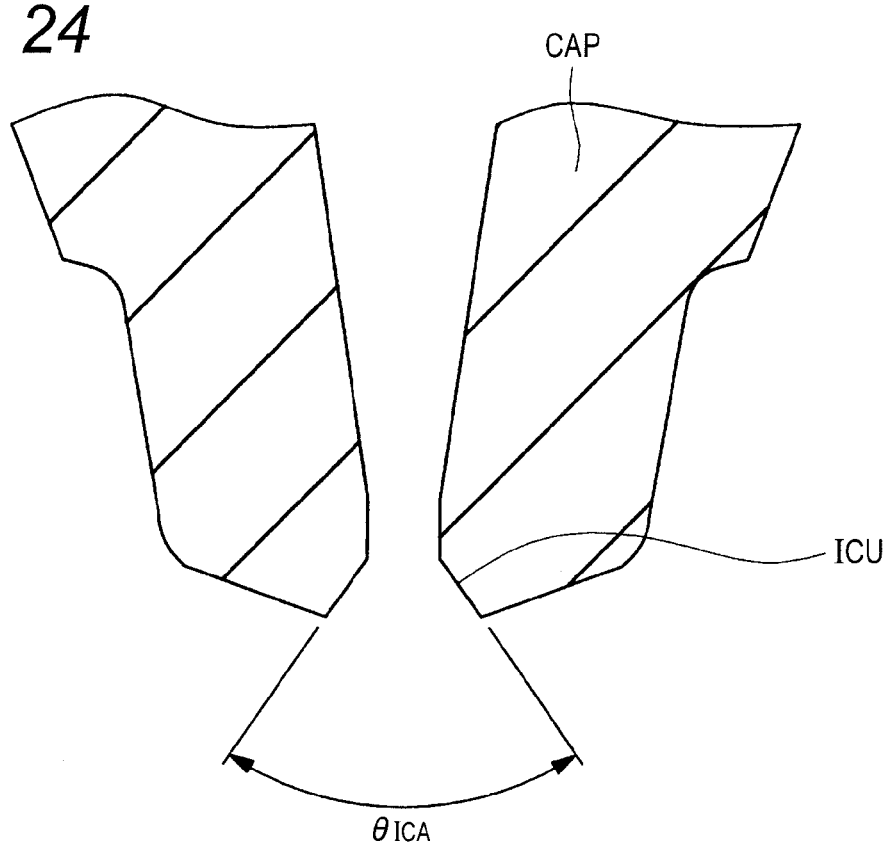
FIG. 24 is a view of a partial region of FIG. 23 on an enlarged scale.

First, FIG. 23 is a view showing the outward configuration of the capillary CAP. As shown in FIG. 23, the capillary CAP is reduced in thickness with approach toward the tip part. At the tip part, there is a divergence angle $\theta_{ICA}$. Specifically, the divergence angle $\theta_{ICA}$ will be described by an enlarged view thereof. FIG. 24 is a view of a region AR of FIG. 23 on an enlarged scale. As shown in FIG. 24, at the tip part of the capillary CAP, there is an inner chamfer part ICU in a tapered shape. The angle indicative of the spread of the inner chamfer part ICU is the divergence angle $\theta_{ICA}$. The divergence angle $\theta_{ICA}$ is also called the inner chamfer angle.

When the press-bonded ball PBL is formed over the pad PD by the capillary CAP, the ultrasonic vibration US in a direction in parallel with the surface of the pad PD is applied. At this step, the ultrasonic vibration US to be applied to the capillary CAP is converted into an ultrasonic conversion load due to the tapered shape of the inner chamfer part ICU formed at the tip part of the capillary CAP. The mechanism will be described with reference to FIG. 25.

Figure 25:
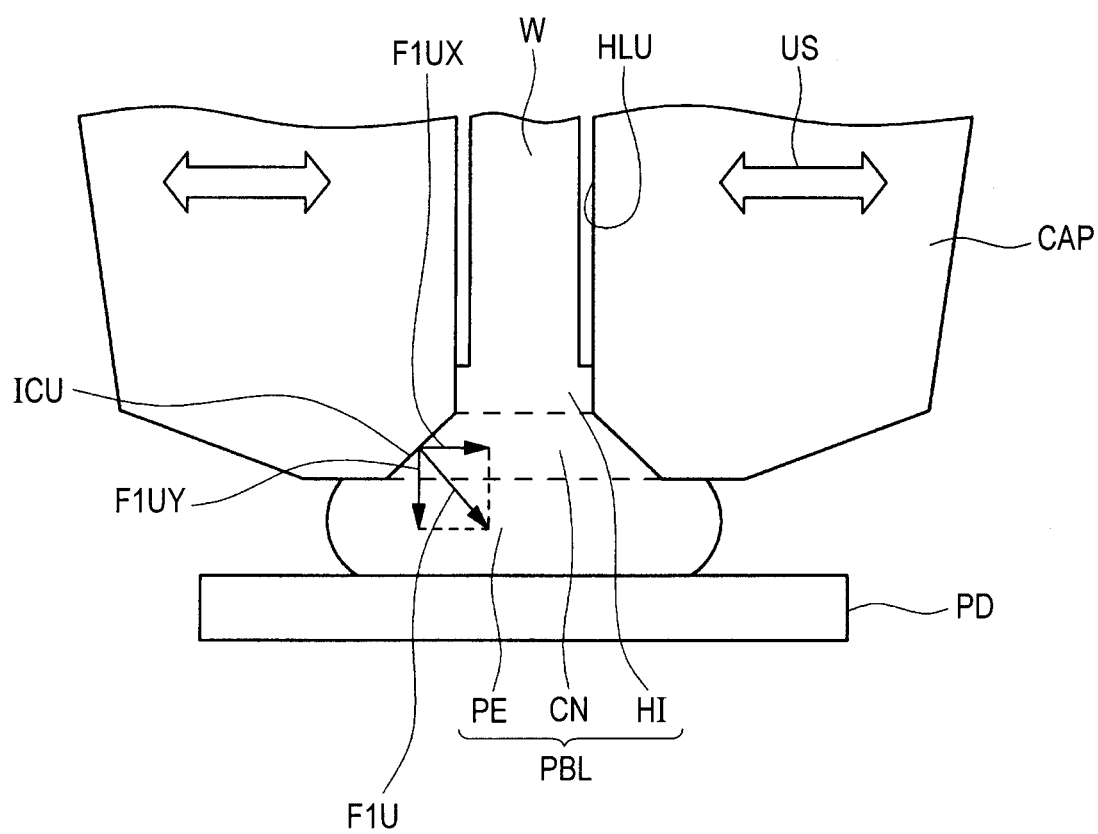
FIG. 25 is a view showing the manner in which a press-bonded ball is formed over a pad by the capillary.

FIG. 25 is a view showing the manner in which the press-bonded ball PBL is formed over a pad PD by the capillary CAP. As shown in FIG. 25, in the capillary CAP, there are formed a hole part HLU for passing a wire W therethrough, and an inner chamfer part ICU in a tapered shape. A press-bonded ball PBL is formed in such a manner as to be along the shapes of the hole part HLU and the inner chamfer part ICU. Specifically, the press-bonded ball PBL is formed of a pedestal part (annulus part) (first portion) PE in contact with the pad PD, a corn part (second portion) CN formed over the pedestal part PE, and a hole insertion part (third portion) HI formed over the corn part CN, and coupled with the wire W. At this step, the corn part CN of the press-bonded ball PBL is formed so as to reflect the tapered shape of the inner chamfer part ICU of the capillary CAP. The hole insertion part HI of the press-bonded ball PBL is formed so as to reflect the shape of the hole part HLU of the capillary CAP.

Herein, as shown in FIG. 25, the capillary CAP is applied with an ultrasonic vibration US in a direction in parallel with the surface of the pad PD. The ultrasonic vibration US generates a force causing the surface of the pad PD and the bottom surface of the press-bonded ball PBL to rub against each other therebetween. This can remove the oxide films formed over the bottom surface of the press-bonded ball PBL and the surface of the pad PD.

As shown in FIG. 25, the ultrasonic vibration US itself is applied in a direction in parallel with the surface of the pad PD. However, the inner chamfer part ICU of the capillary CAP is in a tapered shape. For this reason, the tapered shape converts the ultrasonic vibration US into an oblique ultrasonic conversion load F1U. The oblique ultrasonic conversion load F1U is perpendicular to the tapered surface of the inner chamfer part ICU of the capillary CAP. Then, it results in that the oblique ultrasonic conversion load F1U has the ultrasonic conversion load F1UX in a direction in parallel with the surface of the pad PD, and the ultrasonic conversion load F1UY in a direction perpendicular to the surface of the pad PD as components. Herein, it is indicated as follows: the ultrasonic conversion load F1UY in a direction perpendicular to the surface of the pad PD does not function as a force causing the surface of the pad PD and the bottom surface of the press-bonded ball PBL to rub against each other, but becomes a part of the compressive load pressing the press-bonded ball PBL against the pad PD. Therefore, when the ultrasonic conversion load F1UY in a direction perpendicular to the surface of the pad PD increases, a large compressive load is locally applied to the outer edge part of the press-bonded ball PBL. This results in an increase in possibility that the outer edge part of the pedestal part PE enters the inside of the pad PD. Accordingly, the first factor causing pad peeling becomes more likely to become apparent. Further, the magnitude of the compressive load itself increases, and hence, the injection pressure into the hole part HLU of the capillary CAP also increases. This also results in an increase in thickness of the hole insertion part HI of the press-bonded ball PBL. Thus, when the capillary CAP is lifted, the frictional force between the hole insertion part HI of the press-bonded ball PBL and the hole part HLU of the capillary CAP also increases. Accordingly, the second factor causing pad peeling also becomes more likely to become apparent. Thus, it is indicated as follows: when the ultrasonic conversion load F1UY in a direction perpendicular to the surface of the pad PD increases, the first factor and the second factor causing pad peeling become more likely to become apparent; for this reason, from the viewpoint of preventing pad peeling, the ultrasonic conversion load F1UY in a direction perpendicular to the surface of the pad PD is required to be minimized.

In this respect, the focus of attention of the present inventors is as follows: the magnitude of the ultrasonic conversion load F1UY in a direction perpendicular to the surface of the pad PD varies depending upon the tapered shape of the inner chamfer part ICU of the capillary CAP. This will be further described by reference to FIGS. 26A to 26C.

Figure 26:
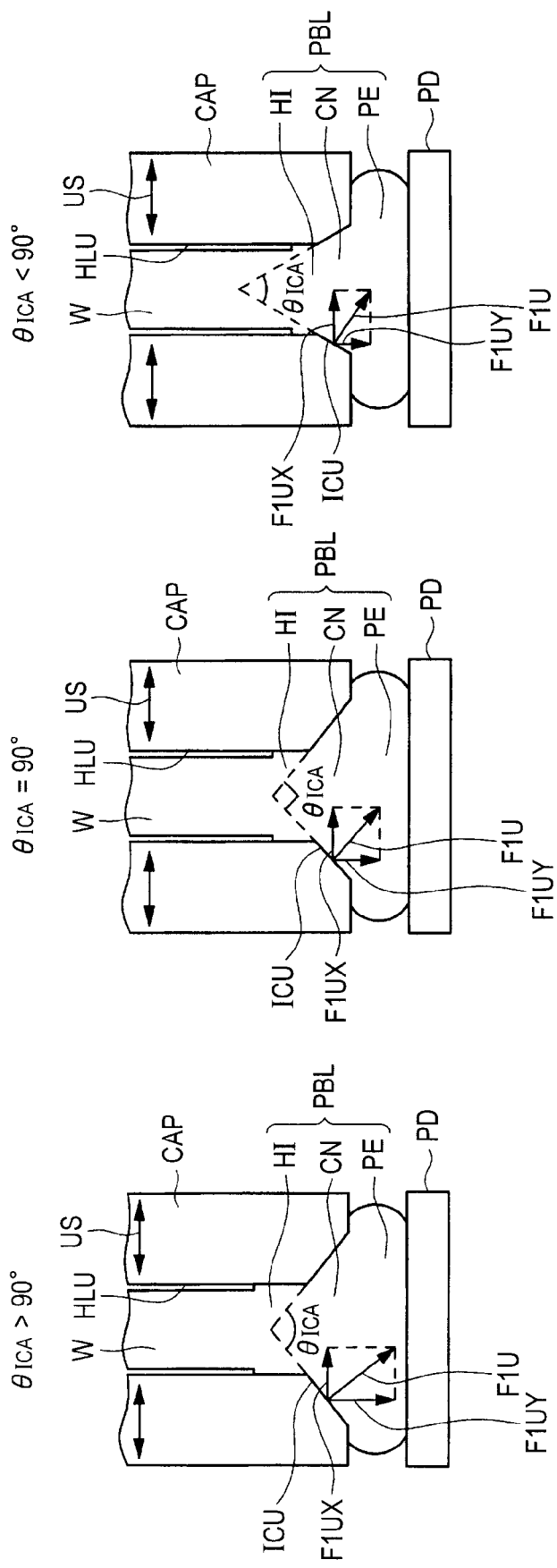
FIG. 26A shows the case where the divergence angle of the inner chamfer part is larger than 90 degrees.
FIG. 26B shows the case where the divergence angle of the inner chamfer part is 90 degrees, and FIG. 26 C shows the case where the divergence angle of the inner chamfer part is smaller than 90 degrees.

FIGS. 26A to 26C are views for illustrating how the magnitude of the ultrasonic conversion load F1UY in a direction perpendicular to the surface of the pad PD changes by changing the divergence angle $\theta_{ICA}$ of the inner chamfer part ICU of the capillary CAP. Specifically, FIG. 26A shows the case where the divergence angle $\theta_{ICA}$ of the inner chamfer part ICU is larger than 90 degrees. FIG. 26B shows the case where the divergence angle $\theta_{ICA}$ of the inner chamfer part ICU is 90 degrees. Whereas, FIG. 26C shows the case where the divergence angle $\theta_{ICA}$ of the inner chamfer part ICU is smaller than 90 degrees.

First, as shown in FIG. 26A, it is indicated as follows: when the divergence angle $\theta_{ICA}$ of the inner chamfer part ICU is larger than 90 degrees, the ultrasonic conversion load F1UY in a direction perpendicular to the surface of the pad PD increases in magnitude. In other words, it is indicated as follows: in the case of FIG. 26A, the magnitude of the ultrasonic conversion load F1UY in a direction perpendicular to the surface of the pad PD is larger than the magnitude of the ultrasonic conversion load F1UX in a direction in parallel with the surface of the pad PD; therefore, when the divergence angle $\theta_{ICA}$ of the inner chamfer part ICU is larger than 90 degrees, it is not possible to reduce the magnitude of the ultrasonic conversion load F1UY in a direction perpendicular to the surface of the pad PD; accordingly, the first factor and the second factor causing pad peeling become more likely to become apparent.

Subsequently, as shown in FIG. 26B, when the divergence angle $\theta_{ICA}$ of the inner chamfer part ICU is 90 degrees, the magnitude of the ultrasonic conversion load F1UY in a direction perpendicular to the surface of the pad PD becomes smaller than that in the case of FIG. 26A, but has not yet come to be sufficiently reduced. In other words, in the case of FIG. 26B, the magnitude of the ultrasonic conversion load F1UY in a direction perpendicular to the surface of the pad PD becomes comparable to the ultrasonic conversion load F1UX in a direction in parallel with the surface of the pad PD. However in this case, it cannot be said that the magnitude of the ultrasonic conversion load F1UY in a direction perpendicular to the surface of the pad PD is sufficiently small. It is indicated that the magnitude has not yet come to be capable of sufficiently suppressing the first factor and the second factor causing pad peeling.

In contrast, as shown in FIG. 26C, it is indicated as follows: when the divergence angle $\theta_{ICA}$ of the inner chamfer part ICU is smaller than 90 degrees, the magnitude of the ultrasonic conversion load F1UY in a direction perpendicular to the surface of the pad PD becomes much smaller than the cases of FIGS. 26A and 26B. In other words, in the case of FIG. 26C, the magnitude of the ultrasonic conversion load F1UY in a direction perpendicular to the surface of the pad PD becomes sufficiently smaller than the magnitude of the ultrasonic conversion load F1UX in a direction in parallel with the surface of the pad PD. As a result, it is, indicated as follows: when the divergence angle $\theta_{ICA}$ of the inner chamfer part ICU is smaller than 90 degrees, the magnitude of the ultrasonic conversion load F1UY in a direction perpendicular to the surface of the pad PD can be sufficiently reduced: this can sufficiently suppress the first factor and the second factor causing pad peeling.

For this reason, in the present first embodiment, the divergence angle $\theta_{ICA}$ of the inner chamfer part ICU of the capillary CAP forming the corn part CN of the press-bonded ball PBL is set smaller than 90 degrees. Thus, the wire bonding step is carried out. In other words, a feature of the present first embodiment resides in that the press-bonded ball PBL is formed over the pad PD with the divergence angle $\theta_{ICA}$ of the inner chamfer part ICU of the capillary CAP set smaller than 90 degrees.

As a result, the magnitude of the ultrasonic conversion load F1UY in a direction perpendicular to the surface of the pad PD becomes smaller than the magnitude of the ultrasonic conversion load F1UX in a direction in parallel with the surface of the pad PD. Accordingly, it is possible to suppress a large compressive load from being locally applied to the outer edge part of the press-bonded ball PBL. In other words, in accordance with the present first embodiment, it is possible to reduce the possibility that the outer edge part of the pedestal part PE enters the inside of the pad PD. Accordingly, it is possible to suppress the first factor causing pad peeling from becoming apparent. Further, the magnitude of the ultrasonic conversion load F1UY in a direction perpendicular to the surface of the pad PD becomes smaller than the magnitude of the ultrasonic conversion load F1UX in a direction in parallel with the surface of the pad PD. Accordingly, the overall magnitude of the compressive loads is also reduced, so that the injection pressure into the hole part HLU of the capillary CAP is also reduced. This also results in a decrease in thickness of the hole insertion part HI of the press-bonded ball PBL. For this reason, when the capillary CAP is lifted, it is also possible to reduce the frictional force between the hole insertion part HI of the press-bonded ball PBL and the hole part HLU of the capillary CAP. This can also suppress the second factor causing pad peeling from becoming apparent.

Thus, in accordance with the present first embodiment, the divergence angle $\theta_{ICA}$ of the inner chamfer part ICU of the capillary CAP is set smaller than 90 degrees. As a result, the magnitude of the ultrasonic conversion load F1UY in a direction perpendicular to the surface of the pad PD can be set smaller than the magnitude of the ultrasonic conversion load F1UX in a direction in parallel with the surface of the pad PD. For this reason, in accordance with the present first embodiment, it is possible to suppress the first factor and the second factor causing pad peeling from becoming apparent. Accordingly, it is possible to prevent pad peeling.

Namely, in the present first embodiment, the divergence angle $\theta_{ICA}$ of the inner chamfer part ICU of the capillary CAP is set smaller than 90 degrees. As the direct effect thereof, the ultrasonic conversion load F1UY in a direction perpendicular to the surface of the pad PD can be set smaller than the ultrasonic conversion load F1UX in a direction in parallel with the surface of the pad PD. This can reduce the overall magnitude of the compressive loads to be applied to the outer edge part of the press-bonded ball PBL. Accordingly, it is possible to effectively prevent the first factor of pad peeling that the outer edge part of the press-bonded ball PBL enters the pad PD. Then, further, in the present first embodiment, the ultrasonic conversion load F1UY in a direction perpendicular to the surface of the pad PD can be set smaller in magnitude than the ultrasonic conversion load F1UX in a direction in parallel with the surface of the pad PD. As the indirect effect thereof, it is possible to reduce the injection pressure into the hole part HLU of the capillary CAP. This also results in a decrease in thickness of the hole insertion part HI of the press-bonded ball PBL to be injected into the hole part HLU of the capillary CAP. This can reduce the frictional force between the hole part HLU and the hole insertion part HI generated upon lifting the capillary CAP. As a result, it is possible to reduce the tensile load to be applied to the press-bonded ball PBL when the capillary CAP is lifted. Accordingly, it is also possible to effectively prevent the second factor of pad peeling.

As described up to this point, the feature of the present first embodiment resides in that the divergence angle $\theta_{ICA}$ of the inner chamfer part ICU of the capillary CAP is set smaller than 90 degrees. However, further, from the viewpoint of reducing the ultrasonic conversion, load F1UY in a direction perpendicular to the surface of the pad PD which is the factor causing pad peeling, the divergence angle $\theta_{ICA}$ of the inner chamfer part ICU of the capillary CAP is desirably set within the range of 50 degrees to 70 degrees. This is due to the following: the smaller the divergence angle $\theta_{ICA}$ is set, the more the ultrasonic conversion load F1UY in a direction perpendicular to the surface of the pad PD can be reduced. However, there is a reason why the inner chamfer, part ICU in a tapered shape is formed at the tip part of the capillary CAP. Namely, at the tip part of the capillary CAP, the initial ball is formed by a discharge torch. In order to fix the initial ball, the inner chamfer part ICU in a tapered shape is disposed at the tip part of the capillary CAP. In other words, a part of the initial ball is inserted into the inner chamfer part ICU in a tapered shape. Thus, the initial ball is fixed. This enables the initial ball to land on the pad PD without deviation. Therefore, from the viewpoint of minimizing the ultrasonic conversion load F1UY in a direction perpendicular to the surface of the pad PD, it is desirable that the divergence angle $\theta_{ICA}$ is reduced. However, too much reduction of the divergence angle $\theta_{ICA}$ results in an obstacle from the viewpoint of fixing the initial ball. Thus, in the present first embodiment, in view of the compatibility between the viewpoint of minimizing the ultrasonic conversion load F1UY in a direction perpendicular to the surface of the pad PD, and the viewpoint of fixing the initial ball with reliability, it is regarded as desirable that the divergence angle $\theta_{ICA}$ of the inner chamfer part ICU is set within the range of 50 degrees to 70 degrees. A divergence angle $\theta_{ICA}$ within this range can sufficiently reduce the ultrasonic conversion load F1UY in a direction perpendicular to the surface of the pad PD, and also can fix the initial ball with reliability.

Figure 27:
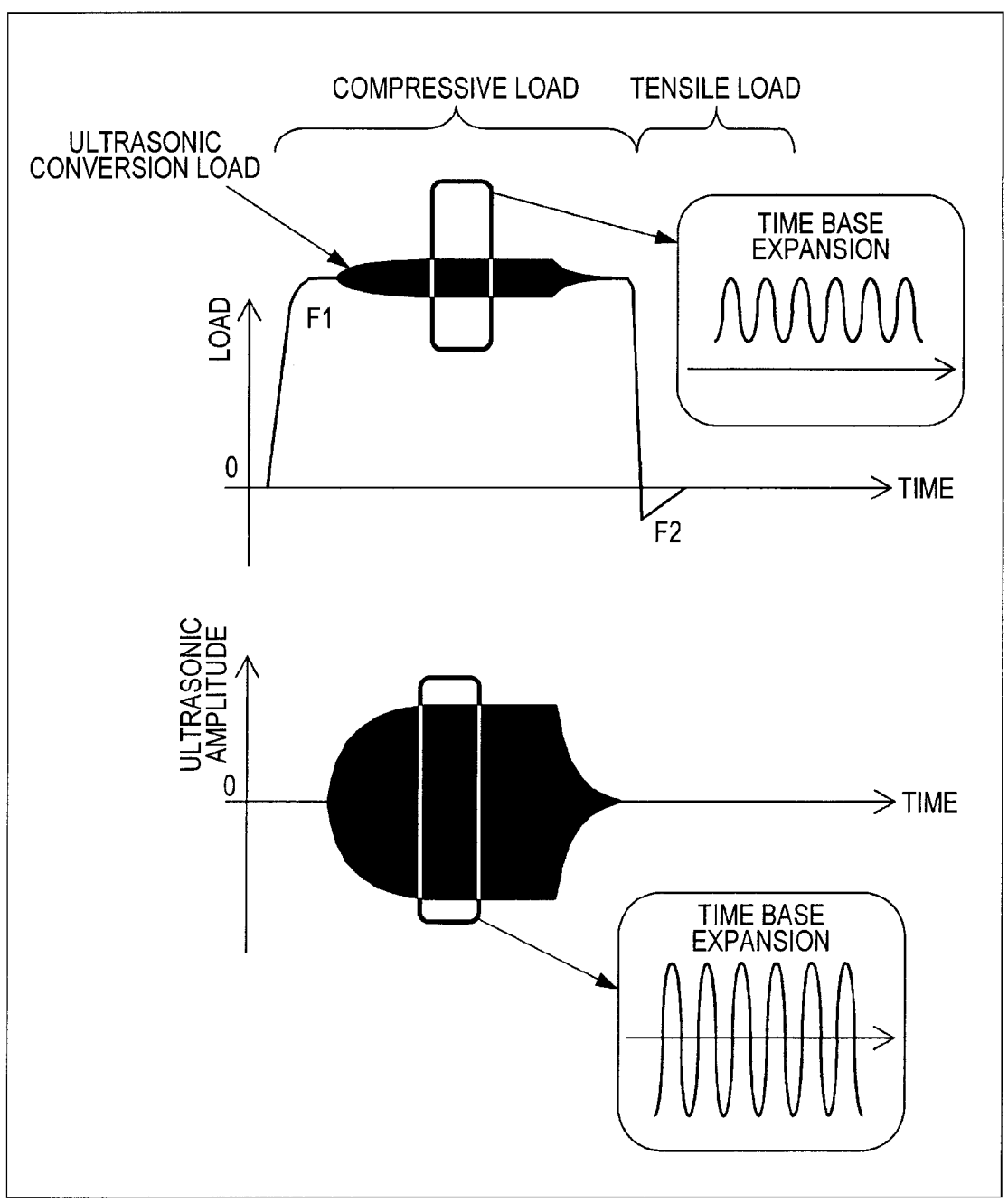
FIG. 27 shows graphs showing the compressive load and the tensile load to be applied to the press-bonded ball when a copper wire is used, and showing the ultrasonic amplitude to be applied to the press-bonded ball.

Subsequently, a description will be given to the wire bonding step in the present first embodiment. FIG. 27 shows graphs showing the compressive load and the tensile load to be applied to the press-bonded ball when a copper wire is used, and showing the ultrasonic amplitude to be applied to the press-bonded ball. In the upper graph of FIG. 27, first, in the wire bonding step, the initial ball is applied with a compressive load F1. The compressive load F1 includes a compressive load caused by pressing of the capillary itself, and an ultrasonic conversion load resulting from the conversion of the ultrasonic amplitude applied in the horizontal direction of the pad due to the structure of the capillary. Then, the initial ball is applied with a compressive load, thereby to form a press-bonded ball. Thereafter, when the capillary is lifted, the press-bonded ball is applied with a tensile load F2. Herein, as indicated from the comparison between FIG. 20 and FIG. 27, in contrast to the general wire bonding step by a copper wire (see FIG. 20), in the wire bonding step (see FIG. 27) in accordance with the present first embodiment, both of the ultrasonic conversion load and the tensile load F2 are reduced.

In other words, it is indicated as follows: with respect to the ultrasonic conversion load, the wire bonding step in accordance with the present first embodiment (see FIG. 27) is a process as follows: as compared with the general wire bonding step by a copper wire (see FIG. 20), even when a comparable ultrasonic wave (energy or power) is applied, the compressive load F1 is more suppressed; this can more improve the adhesion between the press-bonded ball and the pad. The ultrasonic conversion load F1UY in a direction perpendicular to the surface of the pad PD being smaller than the ultrasonic conversion load F1UX in a direction in parallel with the surface of the pad PD (the ultrasonic conversion load F1UX in a direction in parallel with the surface of the pad PD being larger than the ultrasonic conversion load F1UY in a direction perpendicular to the surface of the pad PD) means as follows: the proportion of the applied ultrasonic wave to contribute to the adhesion has been increased. This is important in enhancing the adhesion property of the copper wire which is less likely to be bonded to the pad PD than a gold wire.

Further, for the wire bonding step in accordance with present first embodiment (see FIG. 27), the tensile load F2 is smaller than that in the general wire bonding step by a copper wire (see FIG. 20). This means the following: with the wire bonding step in accordance with the present first embodiment (see FIG. 27), the hole insertion part of the press-bonded ball pressed into the hole part of the capillary is reduced in thickness (reduced in volume); accordingly, when the capillary is lifted, the hole insertion part of the press-bonded ball becomes more likely to come out of the hole part. This is important in suppressing pad peeling.

Figure 28:
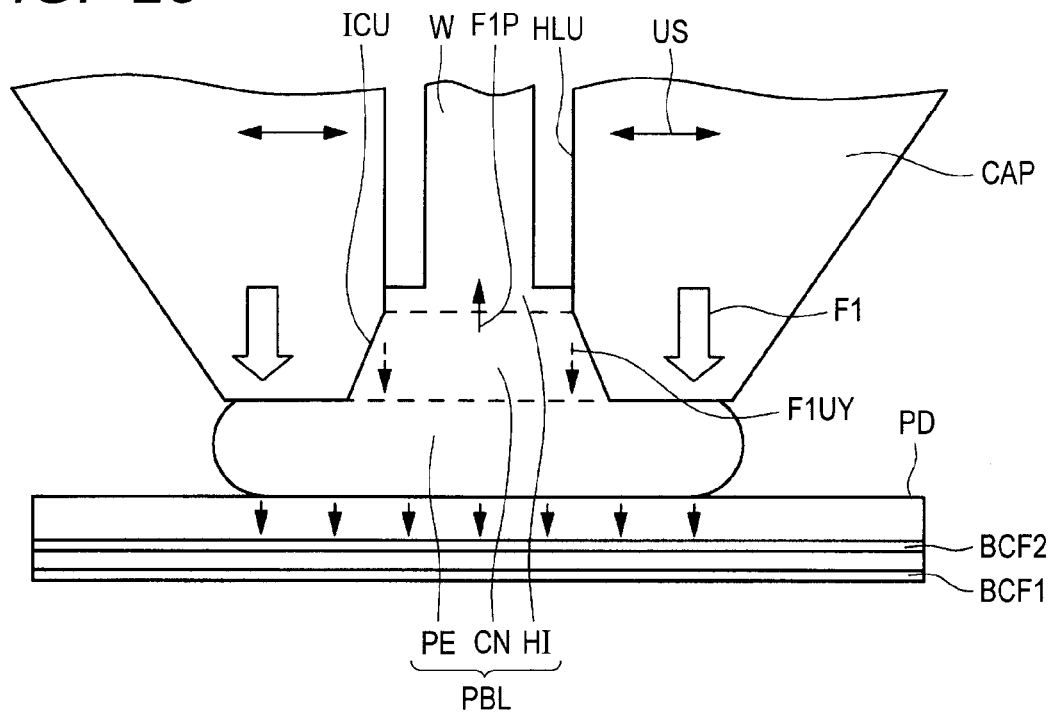
FIG. 28 is a view showing the manner in which press-bonded ball formed of copper is formed over a pad in the first embodiment.

Specifically, FIG. 28 is a view showing the manner in which the press-bonded ball BPL formed of copper is formed over a pad in the first embodiment. As shown in FIG. 28, the press-bonded ball PBL is applied with a compressive load F1. The compressive load F1 includes the load caused by pressing of the capillary CAP, and an ultrasonic conversion load F1UY resulting from the conversion of the ultrasonic vibration US into the vertical direction due to the tapered shape by the inner chamfer part ICU of the capillary CAP. At this step, in the present first embodiment, the divergence angle $\theta_{ICA}$ of the inner chamfer part ICU of the capillary CAP (not shown in FIG. 28) is smaller than 90 degrees. Accordingly, the ultrasonic conversion load F1UY in a direction perpendicular to the surface of the pad PD becomes smaller than the ultrasonic conversion load F1UX in a direction in parallel with the surface of the pad PD. Therefore, it is possible to reduce the compressive load F1 including the load caused by pressing of the capillary CAP, and the ultrasonic conversion load F1UY added thereto. For this reason, as shown in FIG. 28, it is possible to reduce the magnitude of the compressive load F1 to be applied to the outer edge part of the press-bonded ball PBL. This results in the reduction of the possibility that the outer edge part of the pedestal part PE enters the inside of the pad PD. This suppresses the first factor causing pad peeling from becoming apparent. Further, the ultrasonic conversion load F1UY in a direction perpendicular to the surface of the pad PD is small. Accordingly, the magnitude of the compressive load F1 itself is also reduced, also resulting in the reduction of the injection pressure F1P into the hole part HLU of the capillary CAP. As a result, the hole insertion part HI of the press-bonded ball PBL is also reduced in thickness.

Figure 29:
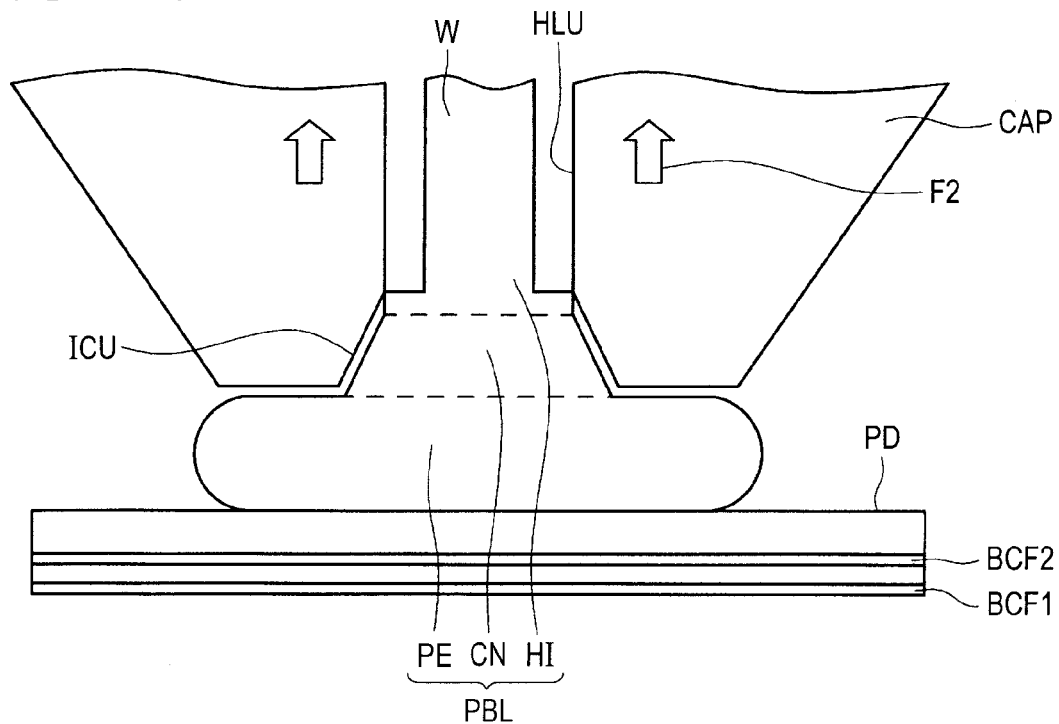
FIG. 29 is a view showing the manner in which the capillary is lifted upward after forming the press-bonded ball.

Subsequently, FIG. 29 is a view showing the manner in which the capillary CAP is lifted after forming the press-bonded ball PBL. In FIG. 29, in the present first embodiment, as described above, the hole insertion part HI of the press-bonded ball PBL to be inserted into the hole part HLU of the capillary CAP is reduced in thickness. Accordingly, it is also possible to reduce the frictional force between the hole part HLU of the capillary CAP and the hole insertion part HI of the press-bonded ball PBL. As a result, it is possible to reduce the tensile load F2 to be applied to the press-bonded ball PBL. For this reason, in accordance with the present first embodiment, the second factor is also suppressed from becoming apparent. Thus, in the wire bonding in the present first embodiment, the first factor and the second factor are suppressed from becoming apparent. For this reason, it is possible to effectively suppress the pad peeling caused by the first factor and the second factor.

Feature in Terms of Structure of Press-Bonded Ball in the Present First Embodiment As described above, the present first embodiment has a feature in that wire bonding of a copper wire is carried out with the divergence angle $\theta_{ICA}$ of the inner chamfer part ICU of the capillary CAP set smaller than 90 degrees. However, in the structure of the press-bonded ball PBL formed according to the feature in the wire bonding step, the feature in the manufacturing step is clearly manifested as the sign thereof. The feature in structure of the press-bonded ball PBL will be described with comparison with the structure of the press-bonded ball PBL (P) formed by a general wire bonding step.

Figure 30:
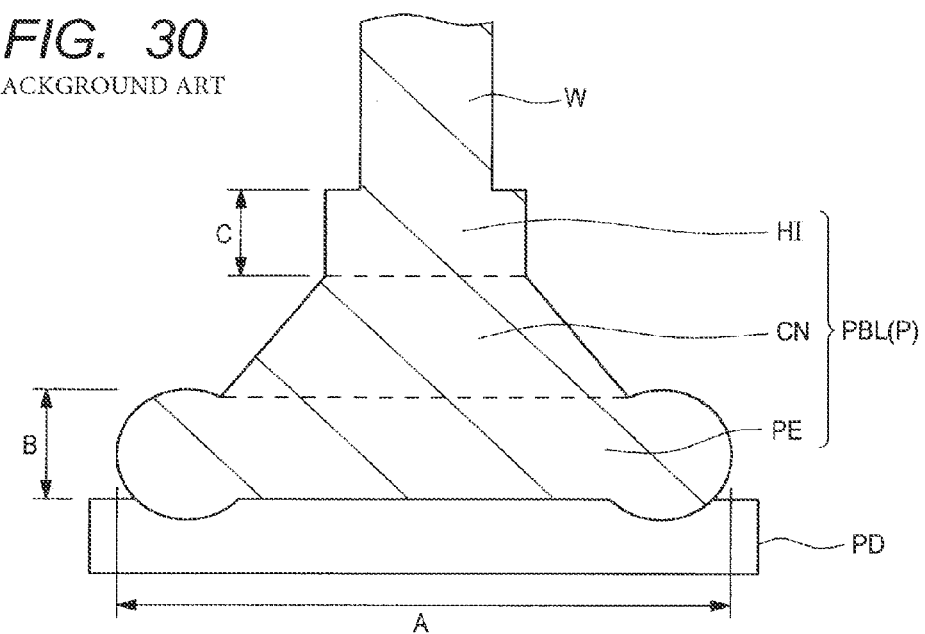
FIG. 30 is a view showing the structure of the press-bonded ball formed through a general wire bonding step.

FIG. 30 is a view showing the structure of the press-bonded ball PBL (P) formed through a general wire bonding step. In FIG. 30, a general press-bonded ball PBL (P) includes a pedestal part PE formed over the pad PD, a corn part CN formed over the pedestal part PE, and a hole insertion part HI formed over the corn part CN. Then, when A represents the press-bonding diameter of the press-bonded ball PBL (P) in contact with the pad PD, B represents the thickness of the pedestal part PE, and C represents the thickness of the hole insertion part HI, the following relationships hold. Namely, $B \leq A/10$, and $C \geq A/6$ hold. Further, the outer edge part of the pedestal part PE enters the inside of the pad PD, and the divergence angle of the corn part CN is larger than 90 degrees.

Figure 31:
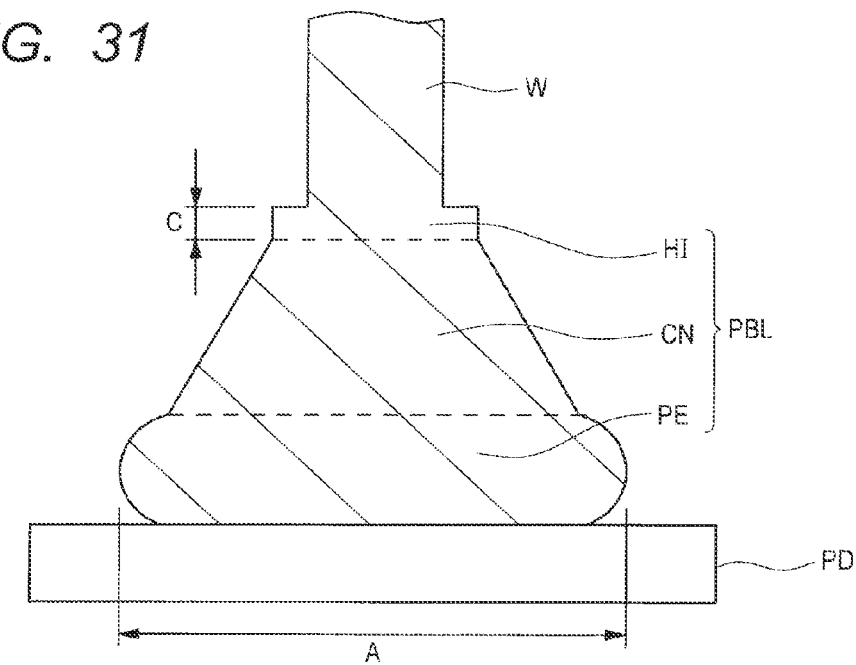
FIG. 31 is a view showing the structure of the press-bonded ball formed through the wire bonding step in the first embodiment.

In contrast, FIG. 31 is a view showing the structure of the press-bonded ball PBL formed through the wire bonding step in the present first embodiment. In FIG. 31, the press-bonded ball PBL in the present first embodiment includes the pedestal part PE formed over the pad PD, a corn part CN formed over the pedestal part PE, and a hole insertion part HI formed over the corn part CN. Then, when A represents the press-bonding diameter of the press-bonded ball PBL in contact with the pad PD, and C represents the thickness of the hole insertion part HI, the following relationship holds. Namely, $C < A/6$ holds. This is based on the following: in the present first embodiment, the ultrasonic conversion load F1UY in a direction perpendicular to the surface of the pad PD is sufficiently reduced, resulting in the reduction of the injection pressure on the hole insertion part HI. Further, the outer edge part of the pedestal part PE is prevented from entering the inside of the pad PD. This is also due to the reduction of the compressive load caused by the sufficient reduction of the ultrasonic conversion load F1UY in a direction perpendicular to the surface of the pad PD. Further, the divergence angle of the corn part CN is smaller than 90 degrees. This is due to the following: in the present first embodiment, wire bonding of a copper wire is carried out with the divergence angle $\theta_{ICA}$ of the inner chamfer part ICU of the capillary CAP set smaller than 90 degrees; accordingly, the divergence angle of the corn part CN formed reflecting the shape of the inner chamfer part ICU also becomes smaller than 90 degrees. As described up to this point, it is indicated as follows: the press-bonded ball PBL formed by carrying out the wire bonding step in the present first embodiment, the feature in the manufacturing method is clearly manifested as the feature in the structure of the press-bonded ball PBL.

Modified Example

Then, a description will be given to a modified example of the present first embodiment. As described above, in the present first embodiment, the description was given by taking the wire bonding step using a copper wire as an example. However, the technical idea in the present first embodiment is also widely applicable to the step of forming a stud bump electrode formed of copper. This is for the following reason. The stud bump electrode is also formed in the following manner: after landing the initial ball formed at the tip part on the pad by the capillary, the initial ball is applied with a compressive load and an ultrasonic vibration, thereby to be deformed, resulting in the formation of a press-bonded ball. At the tip part of the press-bonded ball, the copper wire is cut, thereby to form the stud bump electrode. In other words, the wire bonding step with a copper wire and the stud bump electrode forming step share in common the point that the press-bonded ball is formed by being applied with a compressive load and an ultrasonic vibration. For this reason, it is considered that the problem of pad peeling also becomes apparent in the stud bump electrode forming step. Therefore, by also applying the technical idea of the present invention to the stud bump electrode forming step, it is possible to effectively prevent pad peeling.

Figure 32:
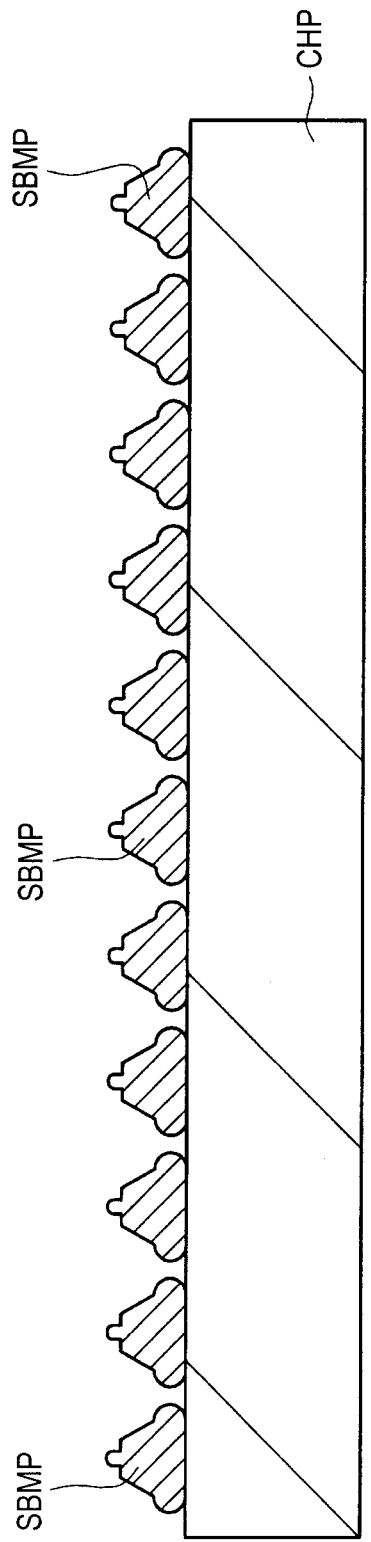
FIG. 32 is a view showing a plurality of stud bump electrodes formed over a semiconductor chip.

Below, a description will be given to the configuration example of the stud bump electrode. FIG. 32 is a view showing plurality of stud bump electrodes SBMP formed over a semiconductor chip CHP. In FIG. 32, although not shown, over the pads formed on the surface of the semiconductor chip CHP, the stud bump electrodes SBMP are disposed. The semiconductor chip CHP including the stud bump electrodes SBMP thus formed thereover is mounted over a wiring substrate board by, for example, face-down bonding.

Figure 33:
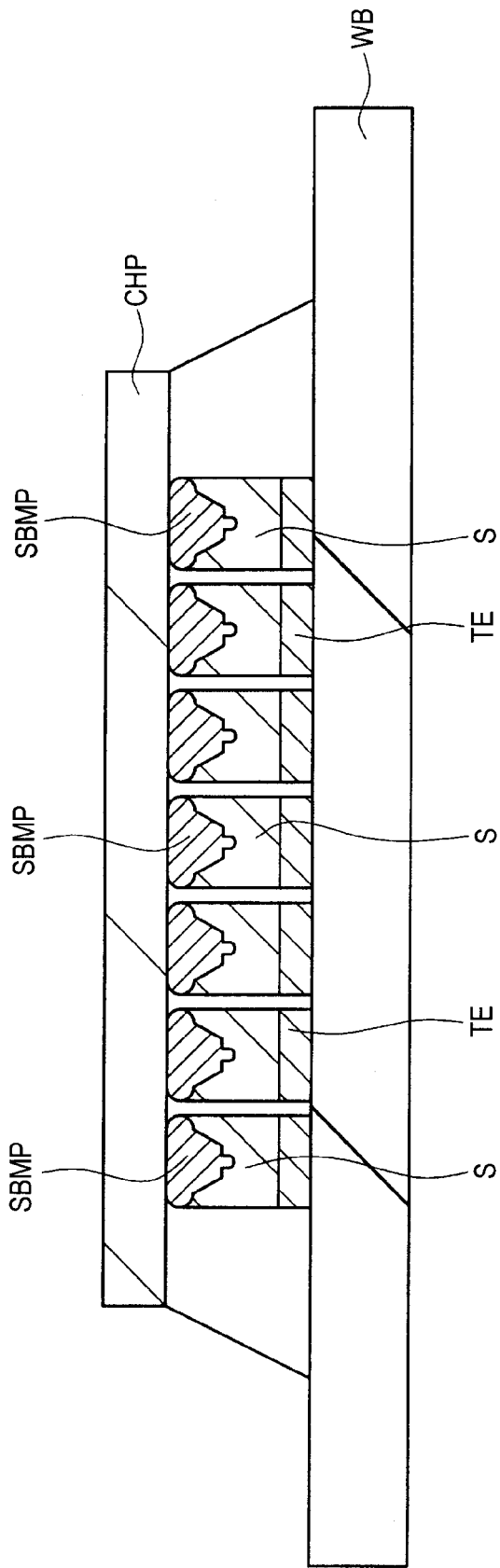
FIG. 33 is a view showing one example in which the semiconductor chip including the stud bump electrodes formed thereover is mounted over a wiring substrate board.

FIG. 33 is a view showing one example in which the semiconductor chip CHP including the stud bump electrodes SBMP formed thereover is mounted on a wiring substrate board WB. As shown in FIG. 33, terminals TE are formed over the wiring substrate board WB, and are disposed so that the terminals TE and the stud bump electrodes SBMP formed over the semiconductor chip CHP face each other. Then, the stud bump electrodes SBMP mounted over the semiconductor chip CHP and the terminals TE formed over the wiring substrate board WB are coupled by, for example, solders S. In the foregoing manner, the semiconductor chip CHP including the stud bump electrodes SBMP formed thereover can be mounted over the wiring substrate board WB.

Second Embodiment

The technical idea in the present second embodiment also has an object of preventing pad peeling as with the technical idea in the first embodiment. However, in the present second embodiment, a description will be given to an example in which pad peeling is prevented with a different approach from that in the first embodiment. Specifically, in the present second embodiment, a description will be given to the technical idea having a main viewpoint of minimizing the tensile load onto the press-bonded ball generated upon lifting the capillary.

Feature of Second Embodiment

Figure 34:
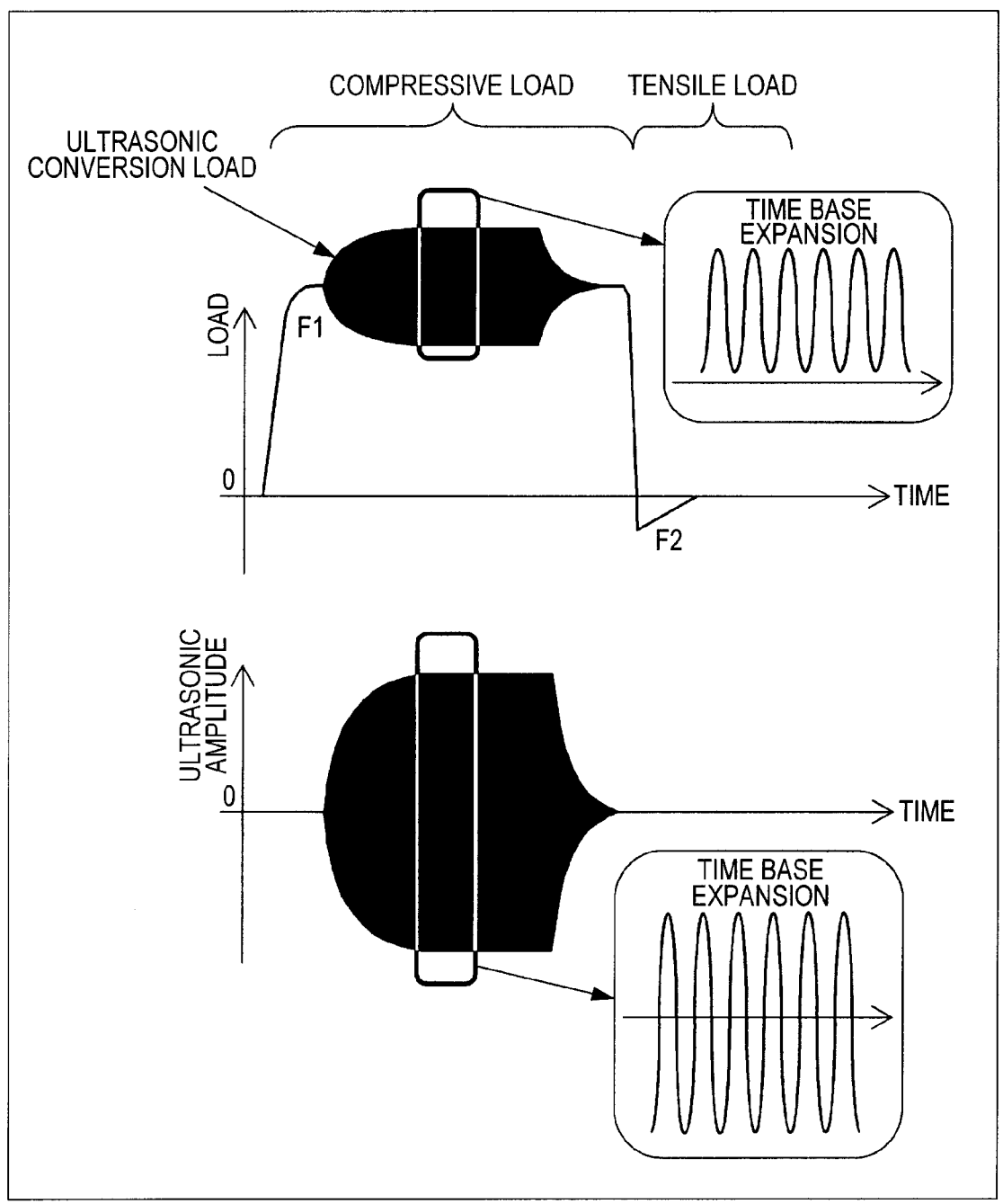
FIG. 34 show graphs showing the compressive load and the tensile load to be applied to the press-bonded ball when a copper wire is used, and showing the ultrasonic amplitude to be applied to the press-bonded ball.

First, a description will be given to the wire bonding step in the present second embodiment. FIG. 34 show graphs showing the compressive load and the tensile load to be applied to the press-bonded ball when a copper wire is used, and showing the ultrasonic amplitude to be applied to the press-bonded ball. In the upper graph of FIG. 34, first, in the wire bonding step, the initial ball is applied with a compressive load F1. The compressive load F1 includes a compressive load caused by pressing of the capillary itself, and an ultrasonic conversion load resulting from the conversion of the ultrasonic amplitude applied in the horizontal direction of the pad due to the structure of the capillary. Then, the initial ball is applied with a compressive load, thereby to form a press-bonded ball. Thereafter, when the capillary is lifted, the press-bonded ball is applied with a tensile load F2. Herein, as indicated from the comparison between FIG. 27 and FIG. 34, in contrast to the wire bonding step in the first embodiment (see FIG. 27), in the wire bonding step (see FIG. 34) in accordance with the present second embodiment, the ultrasonic conversion load is increased. Nonetheless, the tensile load F2 is also reduced in the present second embodiment. In the first embodiment, the following means is adopted: the divergence angle of the inner chamfer part of the capillary is set smaller than 90 degrees; this reduces the magnitude of the ultrasonic conversion load in a direction perpendicular to the surface of the pad. In contrast, in the present second embodiment, different idea from the idea of reducing the ultrasonic conversion load is implemented, thereby to reduce the tensile load to be applied to the press-bonded ball. Below, the idea in the present second embodiment will be described by reference to the accompanying drawings.

Figure 35:
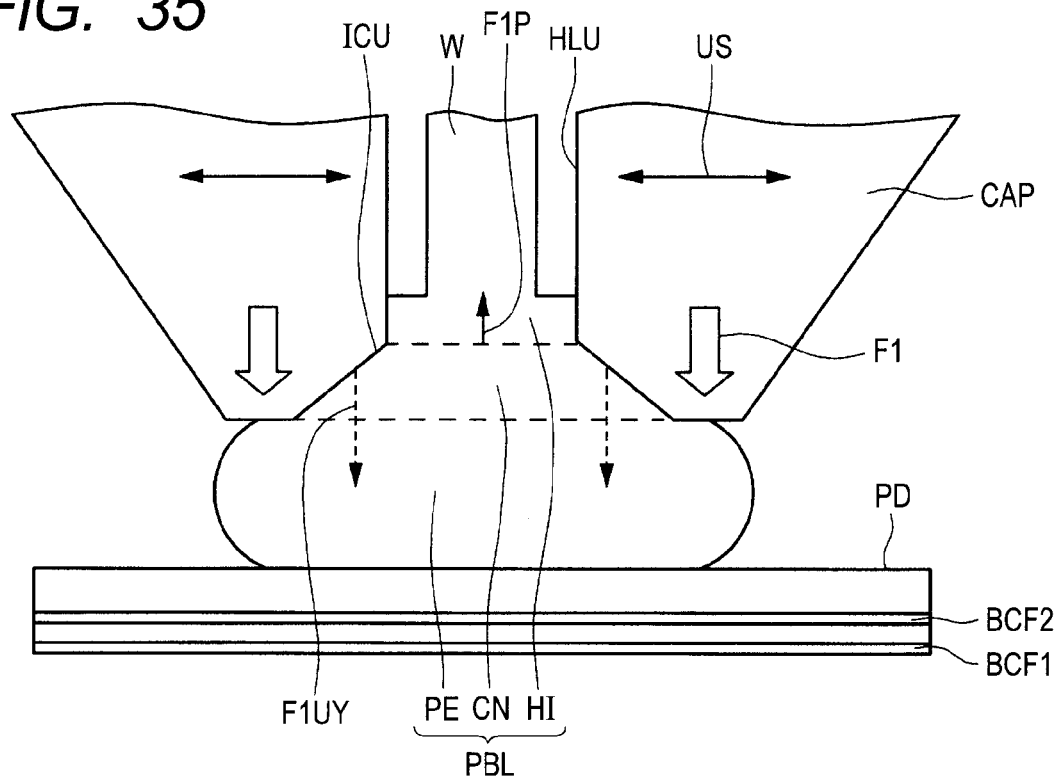
FIG. 35 is a view showing the manner in which a press-bonded ball formed of copper is formed over a pad in second embodiment.

Specifically, FIG. 35 is a view showing the manner in which a press-bonded ball PBL formed of copper is formed over a pad PD in the present second embodiment. As shown in FIG. 35, the press-bonded ball PBL is applied with a compressive load F1. The compressive load F1 includes the load caused by pressing of the capillary CAP, and an ultrasonic conversion load F1UY resulting from the conversion of the ultrasonic vibration US into the vertical direction due to the tapered shape by the inner chamfer part ICU of the capillary CAP. At this step, in the present second embodiment, as distinct from the first embodiment, the divergence angle $\theta_{ICA}$ of the inner chamfer part ICU of the capillary CAP (not shown in FIG. 35) is smaller than 90 degrees. Accordingly, the ultrasonic conversion load F1UY in a direction perpendicular to the surface of the pad PD is the same as that in the related art, and does not become as small as that in the first embodiment. Therefore, the compressive load F1 including the load caused by pressing of the capillary CAP, and the ultrasonic conversion load F1UY added thereto is not reduced so much. However, in the present second embodiment, as shown in FIG. 35, the injection pressure F1P into the hole part HLU of the capillary CAP is reduced. Therefore, in accordance with the present second embodiment, the injection pressure F1P is reduced. This also results in the reduction of the thickness of the hole insertion part HI forming the press-bonded ball PBL. As a result, it is possible to reduce the frictional force generated between the hole part HLU of the capillary CAP and the hole insertion part HI of the press-bonded ball PBL generated upon lifting the capillary CAP. Accordingly, it is possible to reduce the tensile load to be applied the press-bonded ball BPL. For this reason, in accordance with the present second embodiment, it is possible to prevent pad peeling.

Then, a description will be given to how to reduce the injection pressure F1P into the hole part HLU of the capillary CAP in the present second embodiment. As shown in FIG. 35, in the present second embodiment, the thickness of the pedestal part PE is larger than the thickness of the corn part CN. In other words, a feature of the present second embodiment resides in that the thickness of the pedestal part PE is set sufficiently large. This results in an increase in volume of the pedestal part PE in the press-bonded ball PBL. The increase in volume of the pedestal part PE means a decrease in load per unit volume in the press-bonded ball. PBL assuming that the compressive load F1 is not changed. Therefore, in the present second embodiment, by increasing the thickness of the pedestal part PE, it is possible to reduce the load per unit volume. With this configuration, it is possible to reduce the injection pressure F1P into the hole part HLU of the capillary CAP. Then, this results in the reduction of the thickness of the hole insertion part HI of the press-bonded ball PBL.

Figure 36:
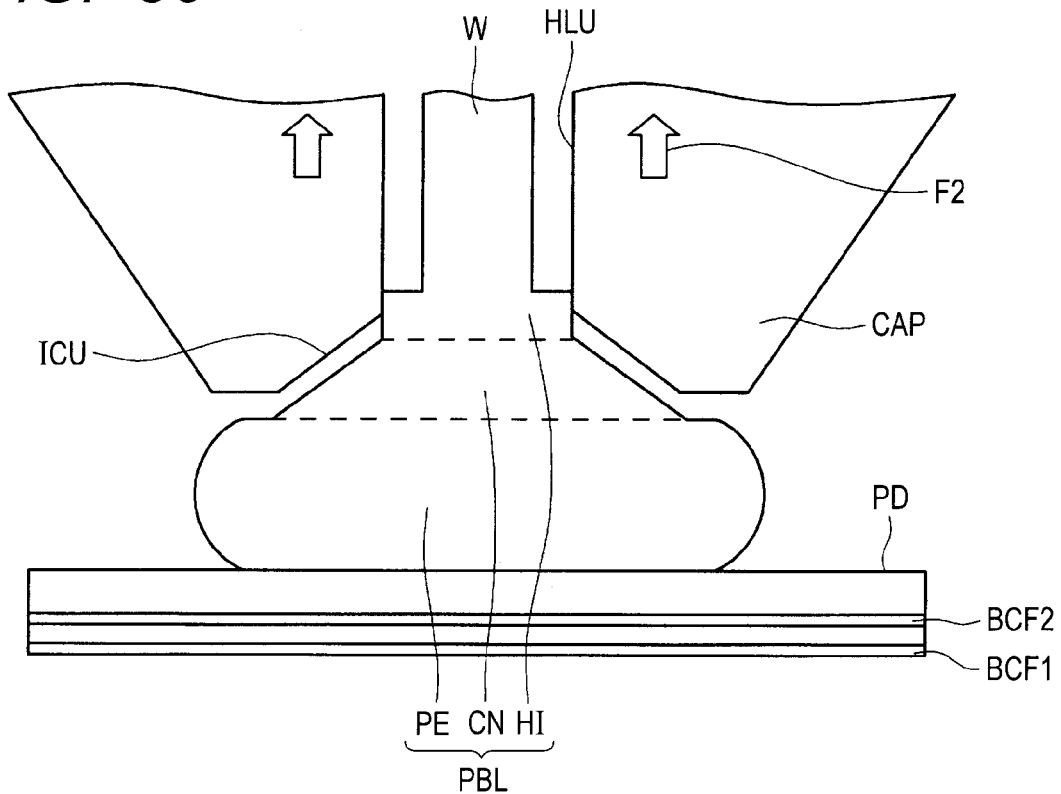
FIG. 36 is a view showing the manner in which a capillary is lifted upward after forming the press-bonded ball.

Subsequently, FIG. 36 is a view showing the manner in which the capillary CAP is lifted upward after forming the press-bonded ball PBL. In FIG. 36, in the present second embodiment, as described above, the thickness of the hole insertion part HI of the press-bonded ball PBL to be inserted into the hole part HLU of the capillary CAP is reduced. Accordingly, it is also possible to reduce the frictional force between the hole part HLU of the capillary CAP and the hole insertion part HI of the press-bonded ball PBL. As a result, it is possible to reduce the tensile load F2 to be applied to the press-bonded ball PBL. For this reason, in accordance with the present second embodiment, the second factor is suppressed from becoming apparent. Further, in the present second embodiment, by the feature of setting the thickness of the pedestal part PE large, it is possible to reduce the load per unit volume. Accordingly, it is also possible to reduce the magnitude of the compressive load F1 itself to be applied to the outer edge part of the press-bonded ball PBL. This results in a reduction of the possibility that the outer edge part of the pedestal part PE enters the inside of the pad PD. Accordingly, the first factor causing pad peeling is also suppressed from becoming apparent. Thus, in the wire bonding in the present second embodiment, it is also possible to suppress the first factor and the second factor from becoming apparent. This can effectively suppress the pad peeling caused by the first factor and the second factor.

Herein, the present second embodiment has a feature in that the thickness of the pedestal part PE is set sufficiently larger than the thickness of the corn part CN. The feature configuration can be implemented by, for example, increasing the size of the initial ball formed at the tip part of the capillary CAP. Specifically, the increase in size of the initial ball can be achieved by increasing the discharge energy by a discharge torch. For example, the increase in discharge energy by the discharge torch can be carried out by increasing the discharge current, or elongating the discharge time. For example, by setting the diameter of the initial ball at 55 to 57 µm, it is possible to set the thickness of the pedestal part PE sufficiently large.

Feature in Structure of Press-Bonded Ball in Second Embodiment

As described above, the feature in the manufacturing step is clearly manifested as the sign thereof in the structure of the press-bonded ball PBL formed in accordance with the feature in the wire bonding step in the present second embodiment. A description will be given to the feature point in the structure of the press-bonded ball PBL.

Figure 37:
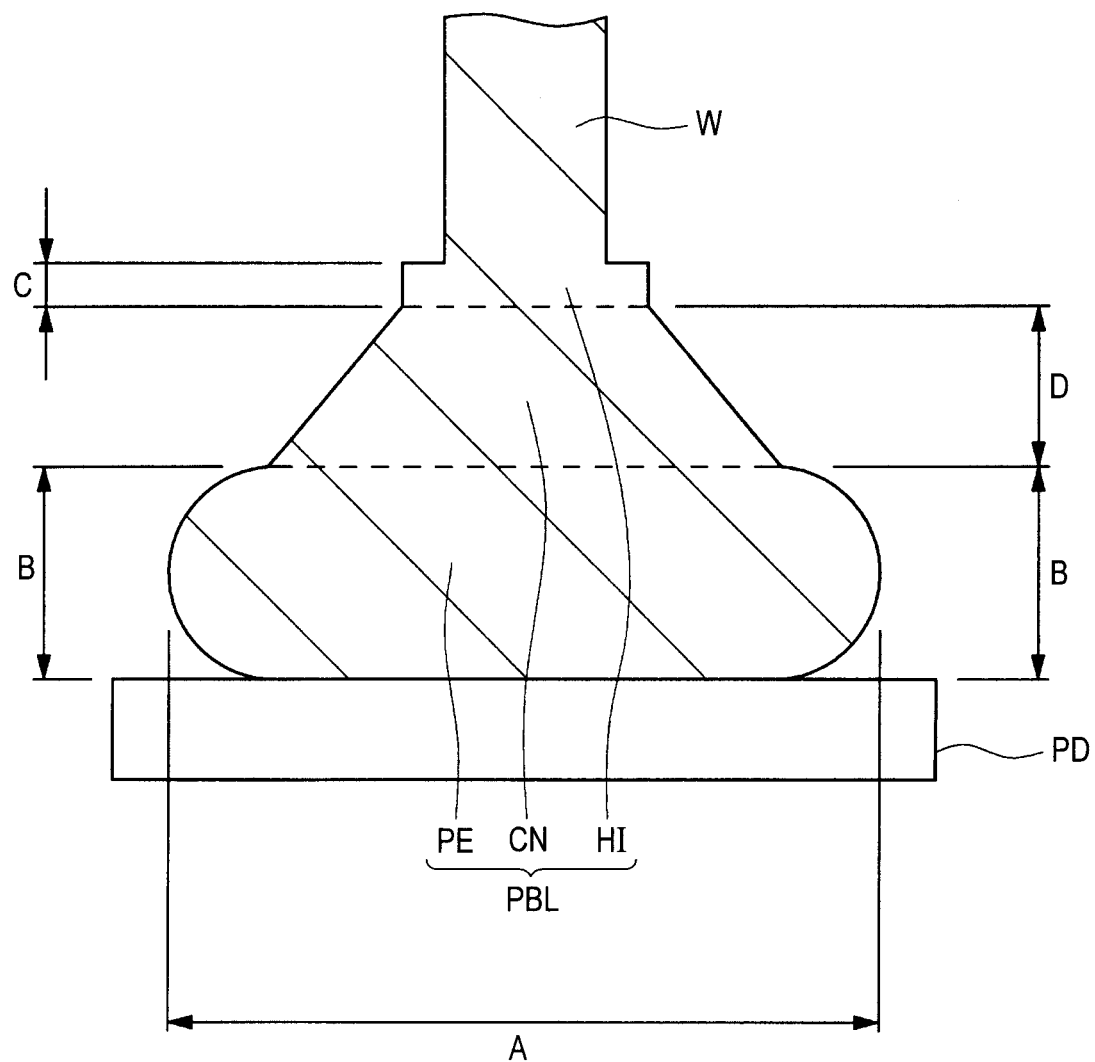
FIG. 37 is a view showing the structure of the press-bonded ball formed through the wire bonding step in the second embodiment.

FIG. 37 is a view showing the structure of the press-bonded ball PBL formed through the wire bonding step in the present second embodiment. In FIG. 37, the press-bonded ball PBL in the present second embodiment includes the pedestal part PE formed over the pad PD, a corn part CN formed over the pedestal part PE, and a hole insertion part HI formed over the corn part CN. Then, the following relationships hold when A represents the press-bonding diameter of the press-bonded ball PBL in contact with the pad PD, B represents the thickness of the pedestal part PE, C represents the thickness of the hole insertion part HI, and D represents the thickness of the corn part CN. Namely, in the present second embodiment, B>A/9, C<A/6, and B≥5D/4 (B is 1.25 times or more of D) hold. This indicates as follows: in the present second embodiment, the size of the initial ball is increased than that in the related art; as a result, the thickness of the pedestal part PE becomes larger than ⅔ times the press-bonding diameter, and the thickness of the pedestal part PE becomes 1.25 times or more the thickness of the corn part CN. Further, C A/6 is based on the following: an increase in thickness of the pedestal part PE results in a sufficient decrease in load per unit volume; this leads to the reduction of the injection pressure into the hole insertion part HI. Further, the outer edge part of the pedestal part PE is also prevented from entering the inside of the pad PD. This is also due to the reduction of the compressive load caused by the sufficient decrease in load per unit volume. As described up to this point, it is indicated as follows: in the press-bonded ball PBL formed by carrying out the wire bonding step in the present second embodiment, the feature in the manufacturing method is clearly manifested as the feature in the structure of the press-bonded ball PBL.

Third Embodiment

The technical idea in the present third embodiment also has an object of preventing pad peeling as with the technical idea in the first embodiment or the second embodiment. However, in the present third embodiment, a description will be given to an example in which pad peeling is prevented with a different approach from that in the first embodiment or the second embodiment. Specifically, in the present third embodiment, a description will be given to the technical idea having a main viewpoint of infinitely making, the tensile load onto the press-bonded ball generated upon lifting the capillary, close to zero.

Features of Third Embodiment

Figure 38:
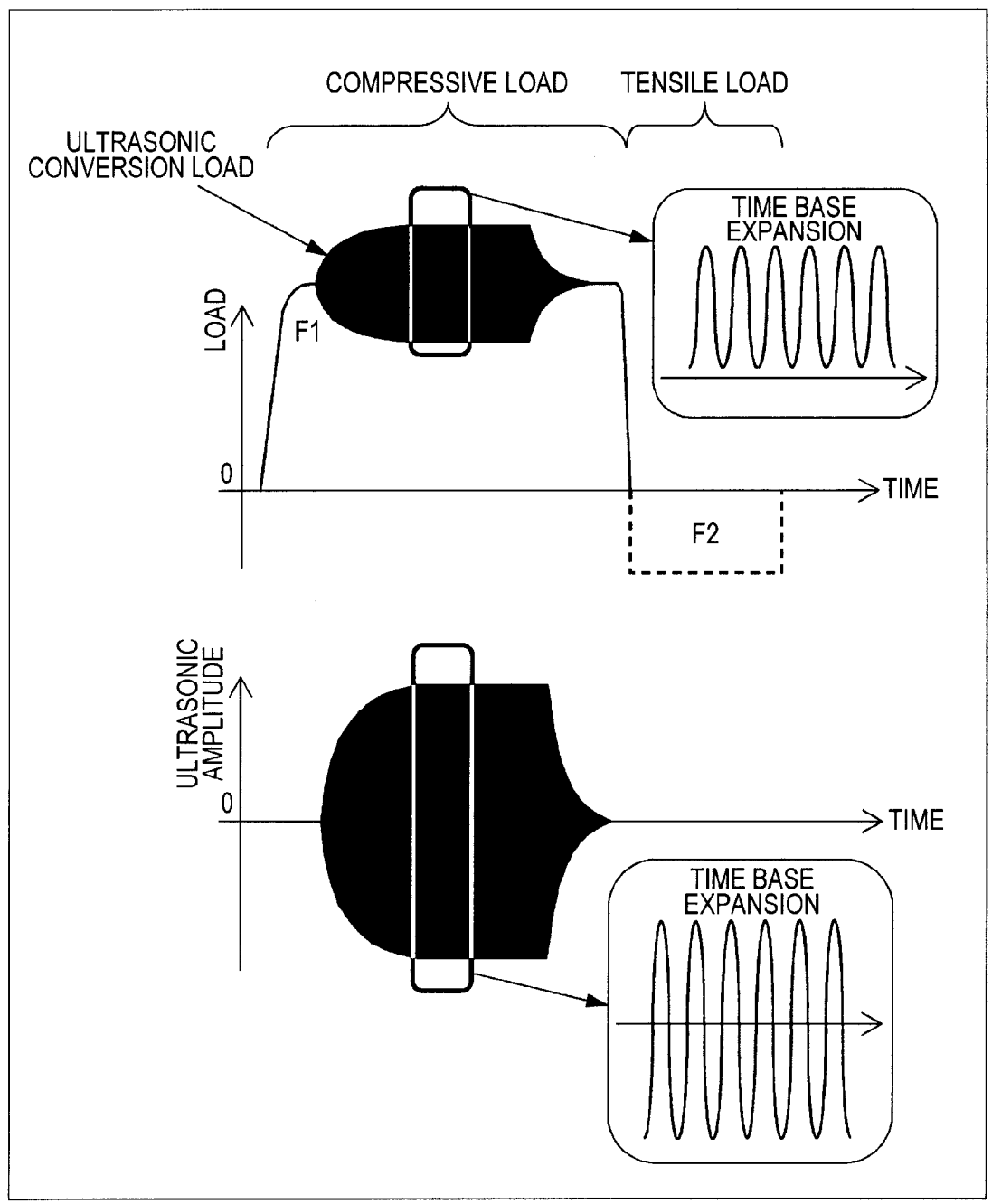
FIG. 38 shows graphs showing the compressive load and the tensile load to be applied to the press-bonded ball when a copper wire is used, and showing the ultrasonic amplitude to be applied to the press-bonded ball.

First, a description will be given to the wire bonding step in the present third embodiment. FIG. 38 shows graphs showing the compressive load and the tensile load to be applied to the press-bonded ball when a copper wire is used, and showing the ultrasonic amplitude to be applied to the press-bonded ball. In the upper graph of FIG. 38, first, in the wire bonding step, the initial ball is applied with a compressive load F1. The compressive load F1 includes a compressive load caused by pressing of the capillary itself, and an ultrasonic conversion load resulting from the conversion of the ultrasonic amplitude applied in the horizontal direction of the pad due to the structure of the capillary. Then, the initial ball is applied with a compressive load, thereby to form a press-bonded ball. Thereafter, when the capillary is lifted, in the present third embodiment, the tensile load to be applied to the press-bonded ball infinitely approaches zero. Thus, the present third embodiment has a feature in that the tensile load to be applied to the press-bonded ball is infinitely made close to zero. The idea for realizing the feature is implemented. Below, the idea in the present third embodiment will be described by reference to the accompanying drawings.

Figure 39:
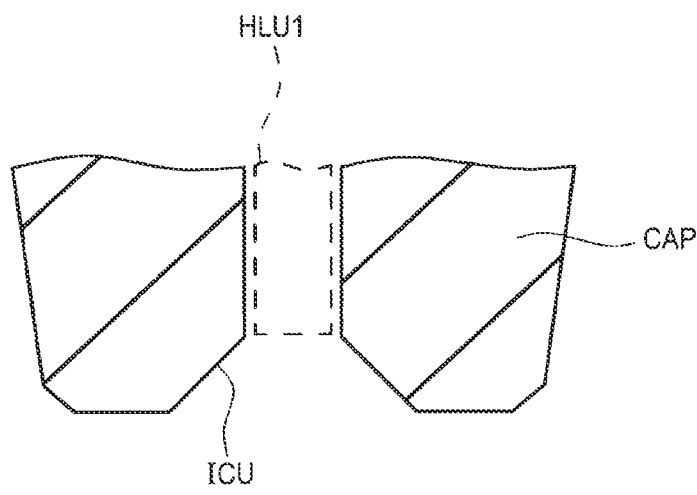
FIG. 39 is a view showing the shape of the tip part of a related-art capillary.
Figure 40:
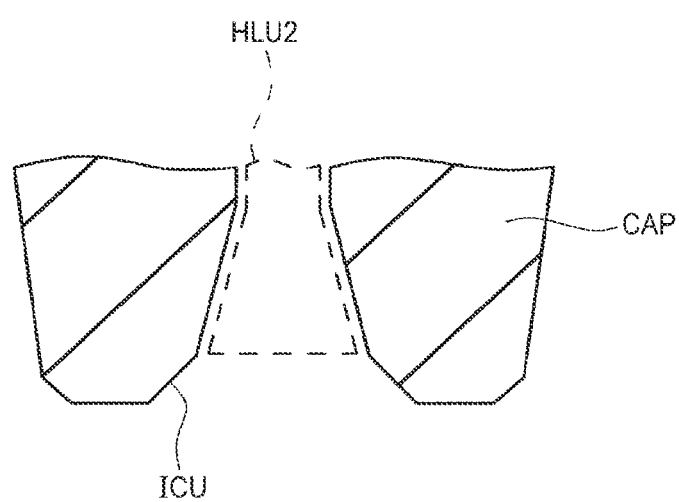
FIG. 40 is a view showing the shape of the tip part of a capillary used in a third embodiment.

In the present third embodiment, an idea is realized in the shape of the tip part of the capillary CAP. Therefore, the idea will be described. FIG. 39 is a view showing the shape of the tip part of a related-art capillary. In FIG. 39, at the tip part of the capillary CAP, there is formed an inner chamfer part ICU in a tapered shape. At the upper part of the inner chamfer part ICU, there is formed a hole part HLU1 for passing a wire therethrough. The side surface of the hole part HLU1 is generally in a vertical shape. In contrast, FIG. 40 is a view showing the shape of the tip part of a capillary CAP used in the present third embodiment. As shown in FIG. 40, in the present third embodiment, at the tip part of the capillary CAP, there is formed an inner chamfer part ICU in a tapered shape.

At the upper part of the inner chamfer part ICU, there is formed a hole part HLU2 for passing a wire therethrough. The present third embodiment has a feature in the shape of the hole part HLU2, and specifically has a feature in that the longitudinal sectional shape of the hole part HLU2 is a tapered shape.

Below, the advantages of the present third embodiment will be described by comparison between the wire bonding step using a related-art capillary CAP shown in FIG. 39 and the wire bonding step using the capillary CAP in the present third embodiment shown in FIG. 40.

Figure 41A:
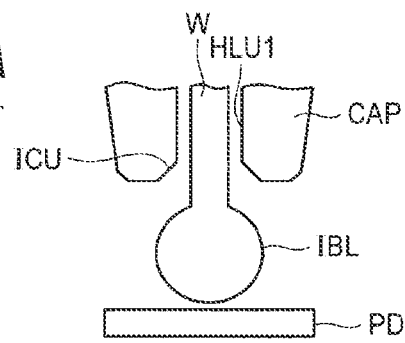
FIGS. 41A to 41C are views for illustrating the wire bonding steps using a related-art capillary.
Figure 41B:
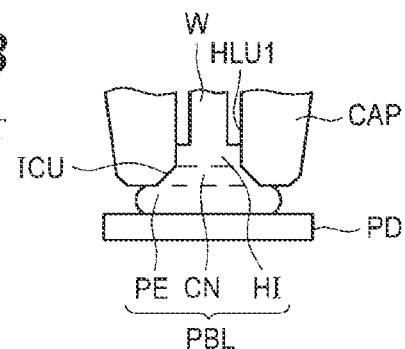
Figure 41C:
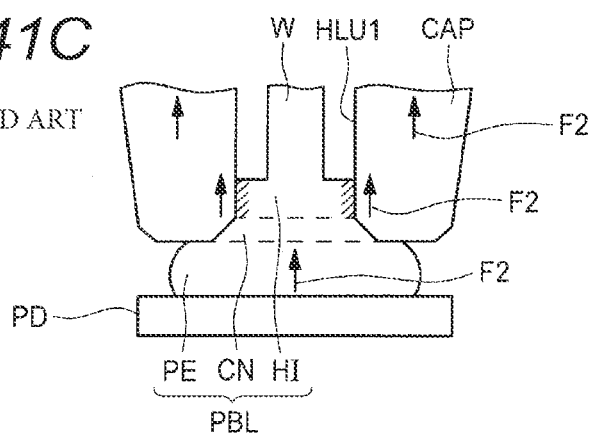

FIGS. 41A to 41C are views for illustrating the wire bonding steps using a related-art capillary. First, as shown in FIG. 41A, an initial ball IBL is formed at the tip part of the capillary CAP. Then, as shown in FIG. 41B, after landing the initial ball IBL formed at the tip part of the capillary CAP over the pad PD, the initial ball IBL is applied with a compressive load and an ultrasonic vibration from the capillary CAP. As a result, a press-bonded ball PBL is formed. At this step, the compressive load from the capillary CAP inserts a part of the press-bonded ball PBL into the hole part HLU1 of the capillary CAP. The site of the press-bonded ball PBL becomes a hole insertion part HI. Subsequently, as shown in FIG. 41C, the capillary CAP is lifted. At this step, for a related-art capillary CAP, the longitudinal sectional shape of the hole part HLU1 is a vertical shape. Accordingly, when the capillary CAP is lifted, there is generated a frictional force between the side surface of the hole part HLU1 of the capillary CAP and the side surface of the hole insertion part HI of the press-bonded ball PBL (the diagonally shaded portion of FIG. 41C). This results in that the press-bonded ball PBL is applied with a tensile load F2 caused by the frictional force. The increase in tensile load F2 to be applied to the press-bonded ball PBL results in a factor causing the press-bonded ball PBL to move up with the capillary CAP, and also causing pad peeling.

Figure 42A:
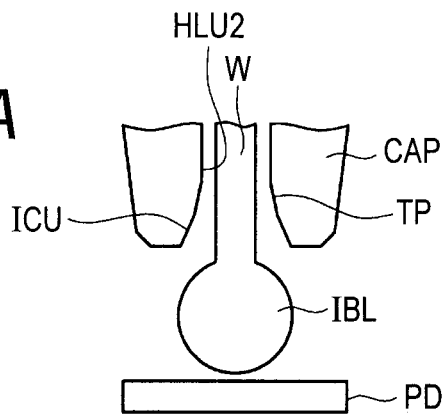
FIGS. 42A to 42C are views for illustrating the wire bonding steps using a capillary in the third embodiment.
Figure 42B:
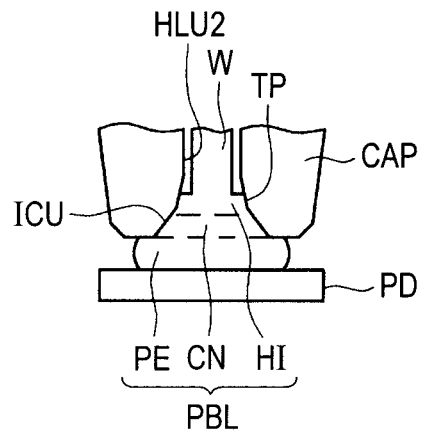
Figure 42C:
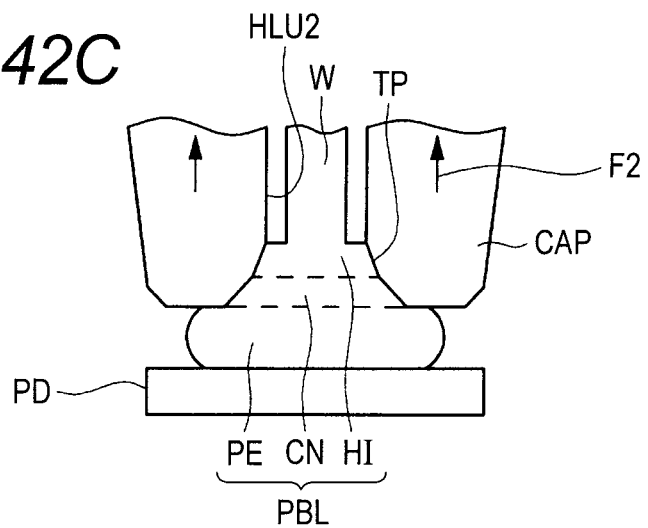

Then, FIGS. 42A to 42C are views illustrating the wire bonding steps using the capillary CAP in the present third embodiment. First, as shown in FIG. 42A, an initial ball IBL is formed at the tip part of the capillary CAP. Then, as shown in FIG. 42B, after landing the initial ball IBL formed at the tip part of the capillary CAP over the pad PD, the initial ball IBL is applied with a compressive load and an ultrasonic vibration from the capillary CAP. As a result, a press-bonded ball PBL is formed. At this step, the compressive load from the capillary CAP inserts a part of the press-bonded ball PBL into the hole part HLU of the capillary CAP 1. The site of the press-bonded ball PBL becomes a hole insertion part HI. Subsequently, as shown in FIG. 42C, the capillary CAP is lifted. At this step, for the capillary CAP in the present third embodiment, the longitudinal sectional shape of the hole part HLU2 is a tapered shape TP. Accordingly, when the capillary CAP is lifted, there is scarcely generated a frictional force between the side surface of the hole part HLU2 of the capillary CAP and the side surface of the hole insertion part HI of the press-bonded ball PBL. This is for the following reason: the capillary CAP itself is lifted vertically upward with the cross-sectional shape of the side surface of the hole part HLU2 in a tapered shape TP; accordingly, rubbing is scarcely caused between the side surface of the hole part HLU of the capillary CAP 1 and the side surface of the hole insertion part HI of the press-bonded ball PBL. Therefore, it is indicated as follows: in accordance with the present third embodiment, the press-bonded ball PBL is scarcely applied with the tensile load F2 caused by the frictional force. In other words, the tensile load applied to the press-bonded ball PBL infinitely approaches zero. Accordingly, in the present third embodiment, it is possible to effectively prevent pad PD peeling due to the application of a tensile load onto the press-bonded ball PBL. Thus, in the present third embodiment, the cross-sectional shape of the hole part HLU2 of the capillary CAP is formed into a tapered shape. As a result, it is possible to make almost zero the tensile load to be applied to the press-bonded ball PBL when the capillary CAP is lifted. This can prevent the pad peeling based on the tensile load.

Feature in Structure of Press-Bonded Ball in Third Embodiment

As described above, the feature in the manufacturing step is clearly manifested as the sign thereof in the structure of the press-bonded ball PBL formed in accordance with the feature in the wire bonding step in the present third embodiment. A description will be given to the feature point in the structure of the press-bonded ball PBL.

Figure 43:
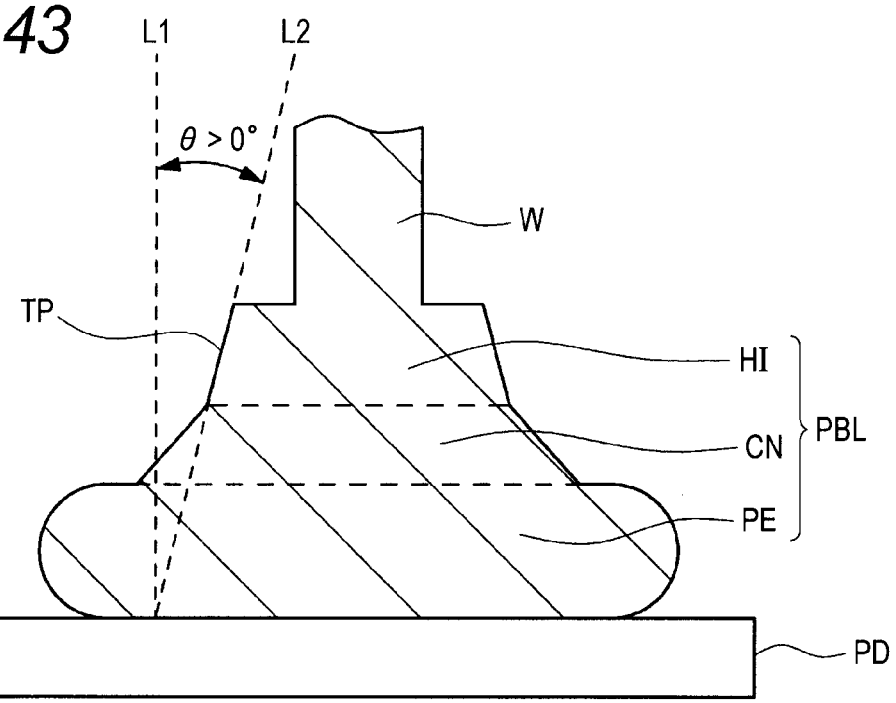
FIG. 43 is a view showing the structure of the press-bonded ball formed through the wire bonding step in the third embodiment.

FIG. 43 is a view showing the structure of the press-bonded ball PBL formed through the wire bonding step in the present third embodiment. In FIG. 43, the press-bonded ball PBL in the present third embodiment includes the pedestal part PE formed over the pad PD, a corn part CN formed over the pedestal part PE, and a hole insertion part HI formed over the corn part CN. Then, in the present third embodiment, the cross-sectional shape of the hole part HLU2 of the capillary CAP 2 is a tapered shape. Accordingly, the side surface of the hole insertion part HI of the press-bonded ball PBL formed reflecting the shape of the hole part HLU2 also becomes a tapered shape TP. This point is the feature in the structure of the press-bonded ball PBL in the present third embodiment. In other words, the feature in the structure of the press-bonded ball PBL in the present third embodiment can be said as follows: as shown in FIG. 43, when an imaginary vertical line L1 perpendicular to the surface of the pad PD is drawn, the taper angle formed between the imaginary vertical line L1 and a straight line L2 passing through the side surface of the hole insertion part HI is 0 degree or more ($\theta>0$). Thus, the present third embodiment has a feature in that the taper angle is 0 degree or more. However, particularly, the taper angle desirably falls within the range of 10 degrees to 20 degrees. This is for the following reason: when the taper angle falls within the range of 10 degrees to 20 degrees, it is possible to surely make almost zero the frictional force generated between the hole part HLU2 of the capillary CAP and the hole insertion part HI of the press-bonded ball PBL upon moving up the capillary CAP. On the other hand, when the taper angle is set too large, a copper material becomes more likely to be injected into hole insertion part HI. For this reason, the taper angle desirably falls within the 10 degrees to 20 degrees. Further, the feature in the structure of the press-bonded ball PBL in the present third embodiment can be paraphrased as follows: the tapered shape of the hole insertion part HI is a shape broadening in a direction from the root part toward the tip part of the capillary CAP. Alternatively, it can also be said that, in the hole insertion part HI of the press-bonded ball PBL, the diameter of the bottom surface of the hole insertion part HI in contact with the corn part CN is larger than the diameter of the top surface of the hole insertion part HI in contact with the wire W (copper wire).

Modified Example

Figure 44:
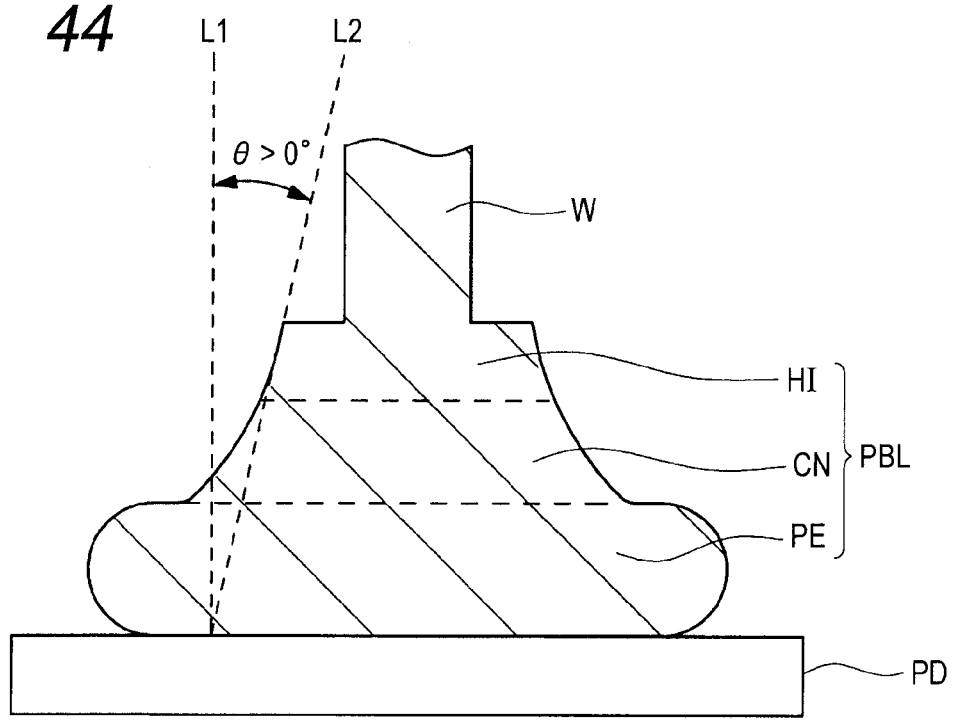
FIG. 44 is a view showing the structure of a press-bonded ball in a modified example.

Incidentally, even when the shape of the hole part HLU2 of the capillary CAP is processed so that the structure of the press-bonded ball PBL becomes, for example, the shape as shown in FIG. 44, it is possible to obtain the same effect as that of the present third embodiment. FIG. 44 is a view showing the structure of the press-bonded ball PBL in a modified example. In FIG. 44, the press-bonded ball PBL in the present modified example includes the pedestal part PE formed over the pad PD, a corn part CN formed over the pedestal part PE, and a hole insertion part HI formed over the corn part CN. Then, in the present modified example, the side surface of the hole insertion part HI of the press-bonded ball PBL and the side surface of the corn part CN are formed in an integral curve. Also in this case, as shown in FIG. 44, when an imaginary vertical line L1 perpendicular to the surface of the pad PD is drawn, the taper angle formed between the imaginary vertical line L1 and a straight line L2 in contact with the side surface of the hole insertion part HI is 0 degree or more ($\theta>0$). Thus, the present modified example also has a feature in that the taper angle is 0 degree or more. However, particularly, the taper angle desirably falls within the range of 10 degrees to 20 degrees. This is for the following reason: when the taper angle falls within the range of 10 degrees to 20 degrees, it is possible to surely make almost zero the frictional force generated between the hole part HLU of the capillary CAP 2 and the hole insertion part HI of the press-bonded ball PBL upon moving up the capillary CAP. On the other hand, when the taper angle is set too large, a copper material becomes more likely to be injected into hole insertion part HI. For this reason, the taper angle desirably falls within the 10 degrees to 20 degrees.

As described up to this point, it is indicated as follows: for the press-bonded ball PBL formed by carrying out the wire bonding step in the present third embodiment or the present modified embodiment, the feature in the manufacturing step (herein, the shape of the capillary CAP) is clearly manifested as the feature in the structure of the press-bonded ball PBL.

Fourth Embodiment

The technical idea in the present fourth embodiment is a combination of the technical ideas in the first to third embodiments.

Feature of Fourth Embodiment

Figure 45:
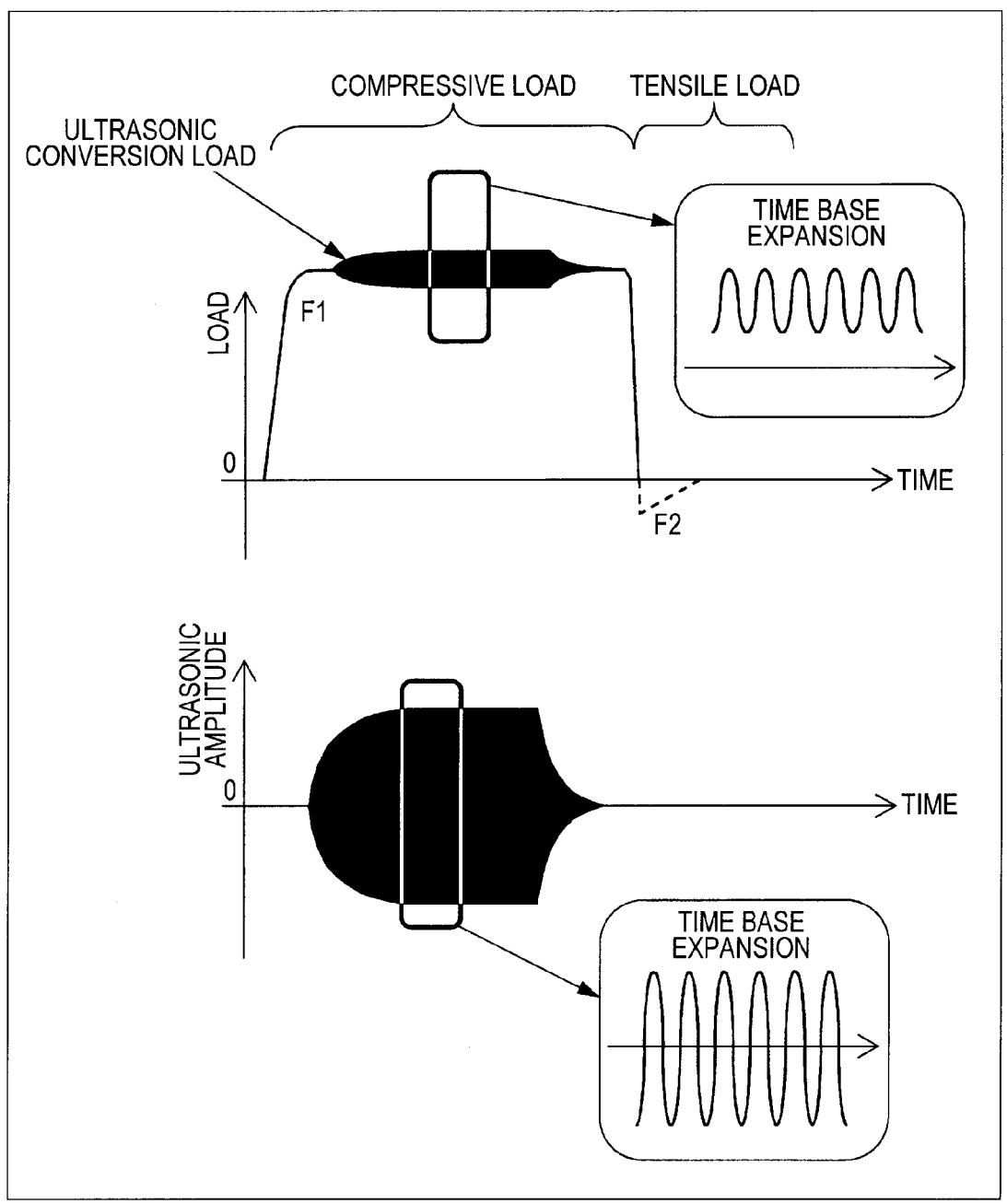
FIG. 45 shows graphs showing the compressive load and the tensile load to be applied to the press-bonded ball when a copper wire is used, and showing the ultrasonic amplitude to be applied to the press-bonded ball.

First, a description will be given to the wire bonding step in the present fourth embodiment. FIG. 45 shows graphs showing the compressive load and the tensile load to be applied to the press-bonded ball when a copper wire is used, and showing the ultrasonic amplitude to be applied to the press-bonded ball. In the upper graph of FIG. 45, first, in the wire bonding step, the initial ball is applied with a compressive load F1. The compressive load F1 includes a compressive load caused by pressing of the capillary itself, and an ultrasonic conversion load resulting from the conversion of the ultrasonic amplitude applied in the horizontal direction of the pad due to the structure of the capillary. Then, the initial ball is applied with a compressive load, thereby to form a press-bonded ball. Then, when the capillary is lifted, the press-bonded ball is applied with a tensile load F2.

Herein, as indicated from the comparison between FIG. 20 and FIG. 45, in contrast to the general wire bonding step by a copper wire (see FIG. 20), in the wire bonding step (see FIG. 34) in accordance with the present fourth embodiment, the ultrasonic conversion load is reduced. Further, also in the present fourth embodiment, the tensile load F2 is reduced, or infinitely approaches zero.

Figure 46:
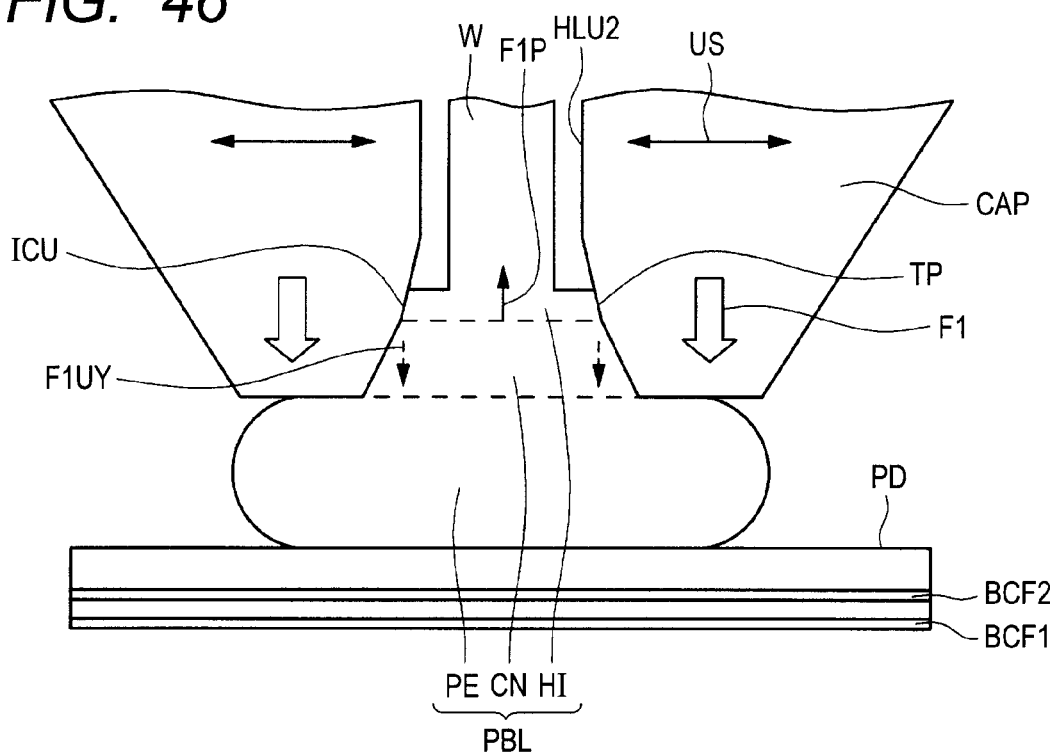
FIG. 46 is a view showing the manner in which a press-bonded ball formed of copper is formed over a pad in fourth embodiment.

Specifically, FIG. 46 is a view showing the manner in which a press-bonded ball PBL formed of copper is formed over a pad PD in the present fourth embodiment. As shown in FIG. 46, the press-bonded ball PBL is applied with a compressive load F1. The compressive load F1 includes the load caused by pressing of the capillary CAP, and an ultrasonic conversion load F1UY resulting from the conversion of the ultrasonic vibration US into the vertical direction due to the tapered shape by the inner chamfer part ICU of the capillary CAP. At this step, in the present fourth embodiment, the divergence angle $\theta_{ICA}$ of the inner chamfer part ICU of the capillary CAP (not shown in FIG. 46) is smaller than 90 degrees. Accordingly, the ultrasonic conversion load F1UY in a direction perpendicular to the surface of the pad PD is reduced. Therefore, the compressive load F1 including the load caused by pressing of the capillary CAP, and the ultrasonic conversion load F1UY added thereto can be reduced. As a result of this, as shown in FIG. 46, it is possible to reduce the magnitude of the compressive load F1 to be applied to the outer edge part of the press-bonded ball PBL. This results in a reduction of the possibility that the outer edge part of the pedestal part PE enters the inside of the pad PD. Accordingly, the first factor causing pad peeling is suppressed from becoming apparent. Further, the ultrasonic conversion load F1UY in a direction perpendicular to the surface of the pad PD is small. Accordingly, the magnitude of the compressive load F1 itself is also reduced, also resulting in the reduction of the injection pressure F1P into the hole part HLU of the capillary CAP. As a result, the thickness of the hole insertion part HI of the press-bonded ball PBL is also reduced.

Further, in the present fourth embodiment, as shown in FIG. 46, the thickness of the pedestal part PE is larger than the thickness of the corn part CN. In other words, also in the present fourth embodiment, the thickness of the pedestal part PE is set sufficiently large. This results in an increase in volume of the pedestal part PE in the press-bonded ball PBL. The increase in volume of the pedestal part PE means a decrease in load per unit volume in the press-bonded ball PBL assuming that the compressive load F1 is not changed. Therefore, in the present fourth embodiment, by increasing the thickness of the pedestal part PE, it is possible to reduce the load per unit volume. With this configuration, it is possible to reduce the injection pressure F1P into the hole part HLU of the capillary CAP. Then, this results in the reduction of the thickness of the hole insertion part HI of the press-bonded ball PBL.

Figure 47:
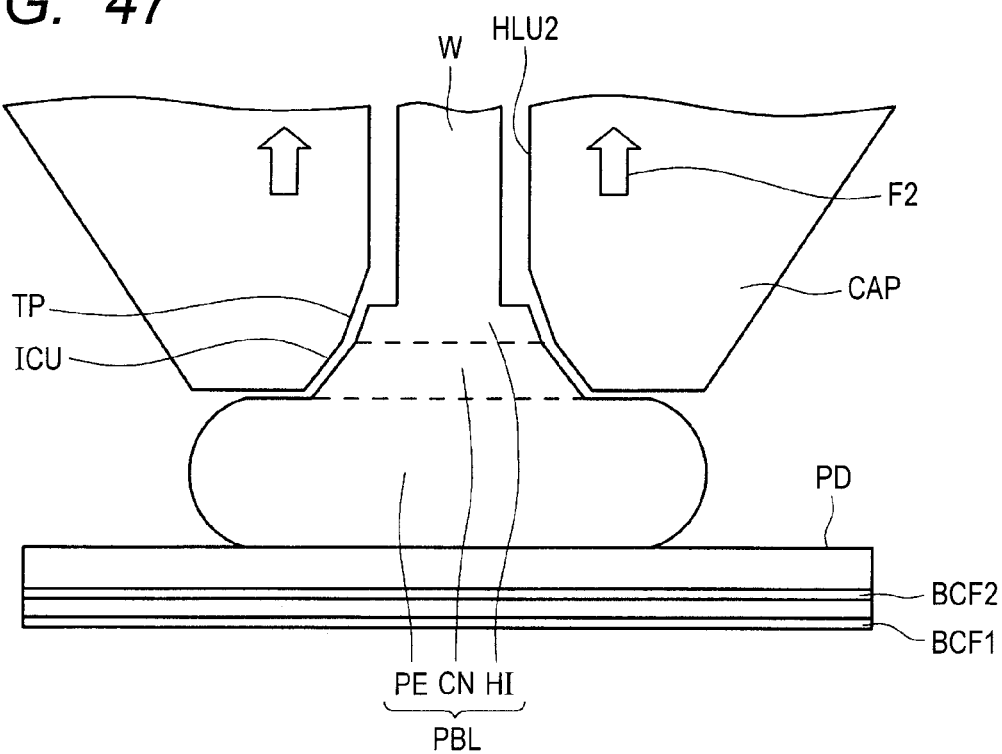
FIG. 47 is a view showing the manner in which a capillary is lifted upward after forming the press-bonded ball.

Subsequently, FIG. 47 is a view showing the manner in which a capillary CAP is lifted upward after forming the press-bonded ball PBL. In FIG. 47, in the present fourth embodiment, as described above, the thickness of the hole insertion part HI of the press-bonded ball PBL to be inserted into the hole part HLU2 of the capillary CAP is reduced. Accordingly, it is also possible to reduce the frictional force between the hole part HLU of the capillary CAP and the hole insertion part HI of the press-bonded ball PBL. As a result, it is possible to reduce the tensile load F2 to be applied to the press-bonded ball PBL. Further, in the present fourth embodiment, the longitudinal sectional shape of the hole part HLU2 of the capillary CAP is a tapered shape TP. Accordingly, when the capillary CAP is lifted, there is scarcely generated a frictional force between the side surface of the hole part HLU2 of the capillary CAP and the side surface of the hole insertion part HI of the press-bonded ball PBL. Therefore, in accordance with the present fourth embodiment, the press-bonded ball PBL is scarcely applied with the tensile load F2 caused by the frictional force. Thus, in the present fourth embodiment, the tensile load F2 applied to the press-bonded ball PBL infinitely approaches zero. Accordingly, it is possible to effectively prevent pad PD peeling due to the application of a tensile load onto the press-bonded ball PBL.

Feature in Structure of Press-Bonded Ball in Fourth Embodiment

As described above, the feature in the manufacturing step is clearly manifested as the sign thereof in the structure of the press-bonded ball PBL formed in accordance with the feature in the wire bonding step in the present fourth embodiment. A description will be given to the feature point in the structure of the press-bonded ball PBL.

Figure 48:
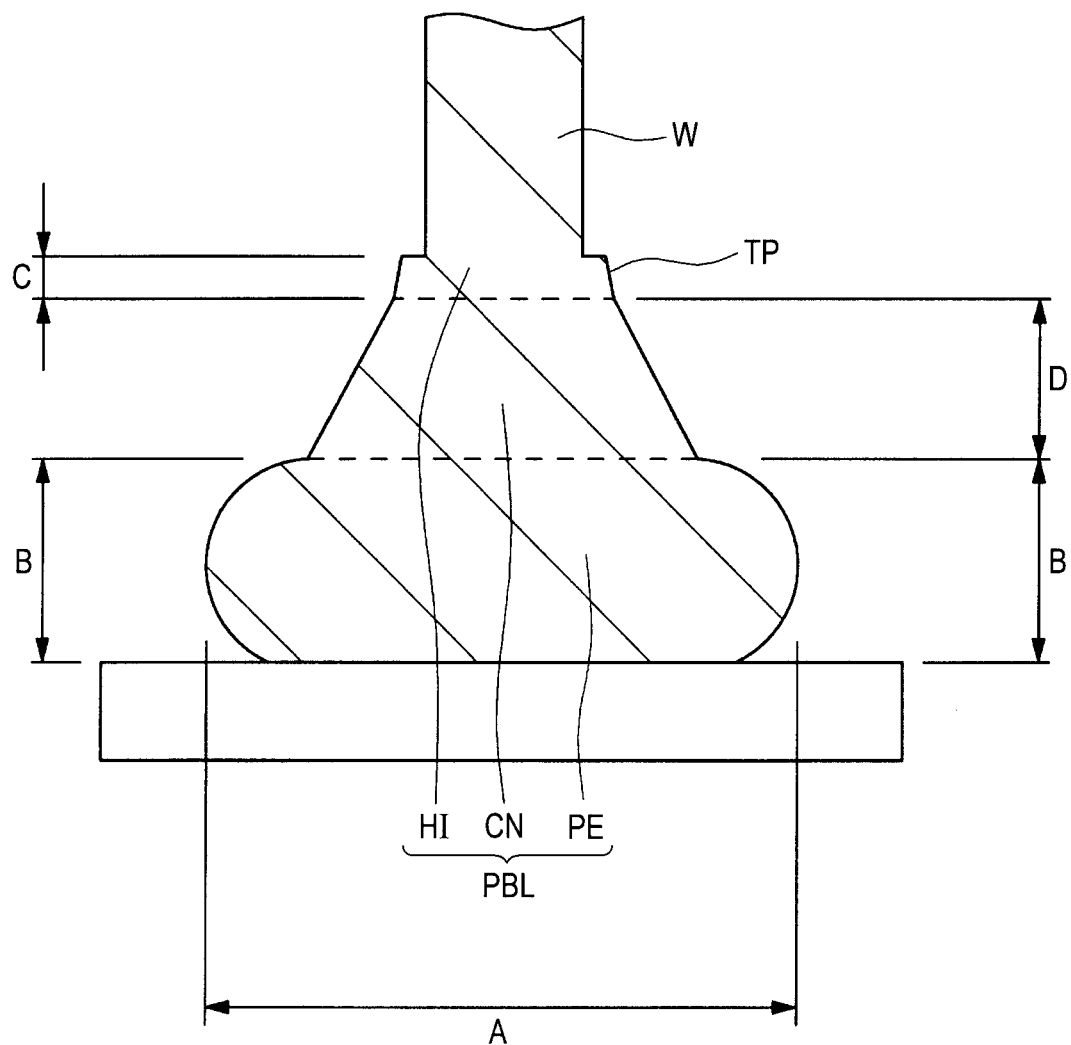
FIG. 48 is a view showing the structure of the press-bonded ball formed through a wire bonding step in the fourth embodiment.

FIG. 48 is a view showing the structure of the press-bonded ball PBL formed through the wire bonding step in the present fourth embodiment. In FIG. 48, the press-bonded ball PBL in the present fourth embodiment includes the pedestal part PE formed over the pad PD, a corn part CN formed over the pedestal part PE, and a hole insertion part HI formed over the corn part CN.

At this step, when A represents the press-bonding diameter of the press-bonded ball PBL in contact with the pad PD, and C represents the thickness of the hole insertion part HI, the following relationship holds. Namely, $C<A/6$ holds. This is based on the following: in the present fourth embodiment, the ultrasonic conversion load F1UY in a direction perpendicular to the surface of the pad PD is sufficiently reduced, resulting in the reduction of the injection pressure into the hole insertion part HI. Further, the outer edge part of the pedestal part PE is prevented from entering the inside of the pad PD. This is also due to the reduction of the compressive load caused by the sufficient reduction of the ultrasonic conversion load F1UY in a direction perpendicular to the surface of the pad PD. Further, the divergence angle of the corn part CN is smaller than 90 degrees. This is due to the following: in the present fourth embodiment, wire bonding of a copper wire is carried out with the divergence angle $\theta_{IC4}$ of the inner chamfer part ICU of the capillary CAP set smaller than 90 degrees; accordingly, the divergence angle of the corn part CN formed reflecting the shape of the inner chamfer part ICU also becomes smaller than 90 degrees.

Further, in the present fourth embodiment, when A represents the press-bonding diameter of the press-bonded ball PBL in contact with the pad PD, B represents the thickness of the pedestal part PE, C represents the thickness of the hole insertion part HI, and D represents the thickness of the corn part CN, the following relationships hold. Namely, in the present fourth embodiment, $B>2A/9$ and $B \geq 5D/4$ (B is 1.25 times or more of D) hold. This indicates as follows: in the present fourth embodiment, the size of the initial ball is set larger than that in the related art; as a result, the thickness of the pedestal part PE becomes larger than 2/9 times the press-bonding diameter, and the thickness of the pedestal part PE becomes 1.25 times or more the thickness of the corn part CN. Further, the outer edge part of the pedestal part PE is also prevented from entering the inside of the pad PD. This is due to the reduction of the compressive load caused by the sufficient reduction of the load per unit volume.

Further, in the present fourth embodiment, the cross-sectional shape of the hole part HLU2 of the capillary CAP is a tapered shape. Accordingly, the side surface of the hole insertion part HI of the press-bonded ball PBL formed reflecting the shape of the hole part HLU2 is also in a tapered shape TP.

As described up to this point, it is indicated as follows: for the press-bonded ball PBL formed by carrying out the wire bonding step in the fourth embodiment, the feature in the manufacturing method is clearly manifested as the feature in the structure of the press-bonded ball PBL.

Fifth Embodiment

As described in the first embodiment, particularly, in the wire bonding step using a copper wire, there is a problem of pad peeling. The pad peeling is caused by the following first factor: the compressive load applied from the capillary CAP to the outer edge part of the press-bonded ball PBL is increased; this causes the outer edge part of the pedestal part PE of the press-bonded ball PBL to enter the inside of the pad. Further, the pad peeling is also caused by the following second factor: an increase in compressive load increases the insertion pressure on the hole insertion part HI; this results in an increase in frictional force between the hole insertion part HI of the press-bonded ball PBL and the hole part of the capillary CAP; accordingly, the tensile stress for lifting the capillary CAP increases. Particularly, the pad peeling depends upon not only the structure of the pad PD but also the configuration of an interlayer insulation film formed in a layer underlying the pad PD. This enhances the utility of applying the technical idea of the present invention to a semiconductor device having a configuration of the interlayer insulation film facilitating the occurrence of pad peeling. Below, a description will be given to one example of the configuration of the interlayer insulation film facilitating the occurrence of pad peeling.

Figure 49:
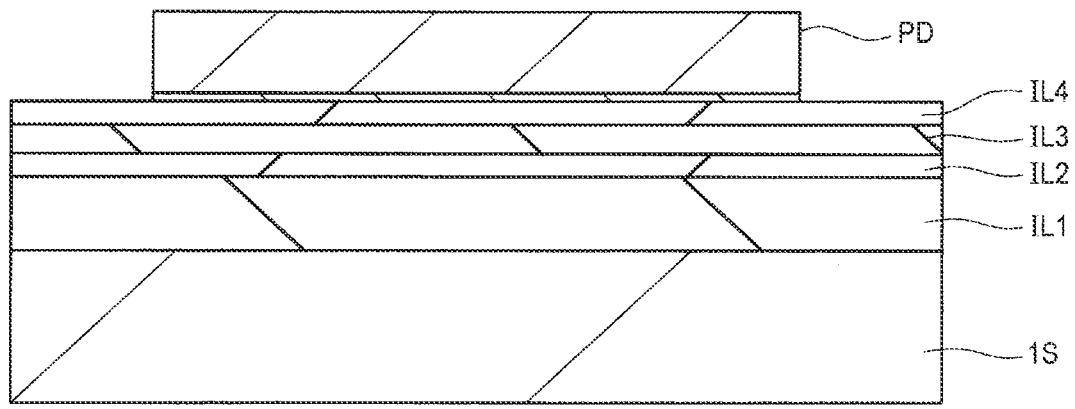
FIG. 49 is a cross-sectional view showing the configuration of a plurality of interlayer insulation films present in layers underlying the pad.

FIG. 49 is a cross-sectional view showing the configuration of a plurality of interlayer insulation films present in layers underlying the pad PD. Incidentally, in FIG. 49, there are not shown semiconductor elements (e.g., MOSFETs) formed over a semiconductor substrate 1S, wirings formed between a plurality of interlayer insulation films, and the like. As shown in FIG. 49, over the semiconductor substrate 1S formed of, for example, a silicon substrate, there is formed an interlayer insulation film IL1. Over the interlayer insulation film IL1, there is formed an interlayer insulation film IL2. Then, over the interlayer insulation film IL2, there is formed an interlayer insulation film IL3. Over the interlayer insulation film IL3, there is formed an interlayer insulation film IL4. Herein, for example, the interlayer insulation film IL1 the interlayer insulation film IL2, and the interlayer insulation film IL4 are each formed of a silicon oxide film. The interlayer insulation film IL3 is formed of a SOG (SPIN ON GLASS) film. Namely, in the present fifth embodiment, there are formed a plurality of the interlayer insulation film IL1 to the interlayer insulation film IL4 formed of different materials.

Particularly, the focus of attention in the present fifth embodiment is each Young's modulus of a plurality of the interlayer insulation film IL1 to the interlayer insulation film IL4. For example, each Young's modulus of the silicon oxide film forming the interlayer insulation film IL1, the interlayer insulation film IL2, and the interlayer insulation film IL4 is about 70 GPa. The Young's modulus of the SOG film forming the interlayer insulation film IL3 is about 20 GPa. In contrast, the Young's modulus of the semiconductor substrate 1S formed of a silicon substrate is about 170 GPa. These indicate that the Young's modulus of the interlayer insulation film IL1 to the interlayer insulation film IL4 is smaller than each Young's modulus of the semiconductor substrate 1S. Herein, the important point is that a plurality of the interlayer insulation film IL1 to the interlayer insulation film IL4 include the interlayer insulation film IL3 formed of SOG film with a low Young's modulus. Thus, when the interlayer insulation film IL3 with a low Young's modulus is included, pad peeling tends to become apparent. Below, the mechanism will be described by reference to the accompanying drawings.

Figure 50:
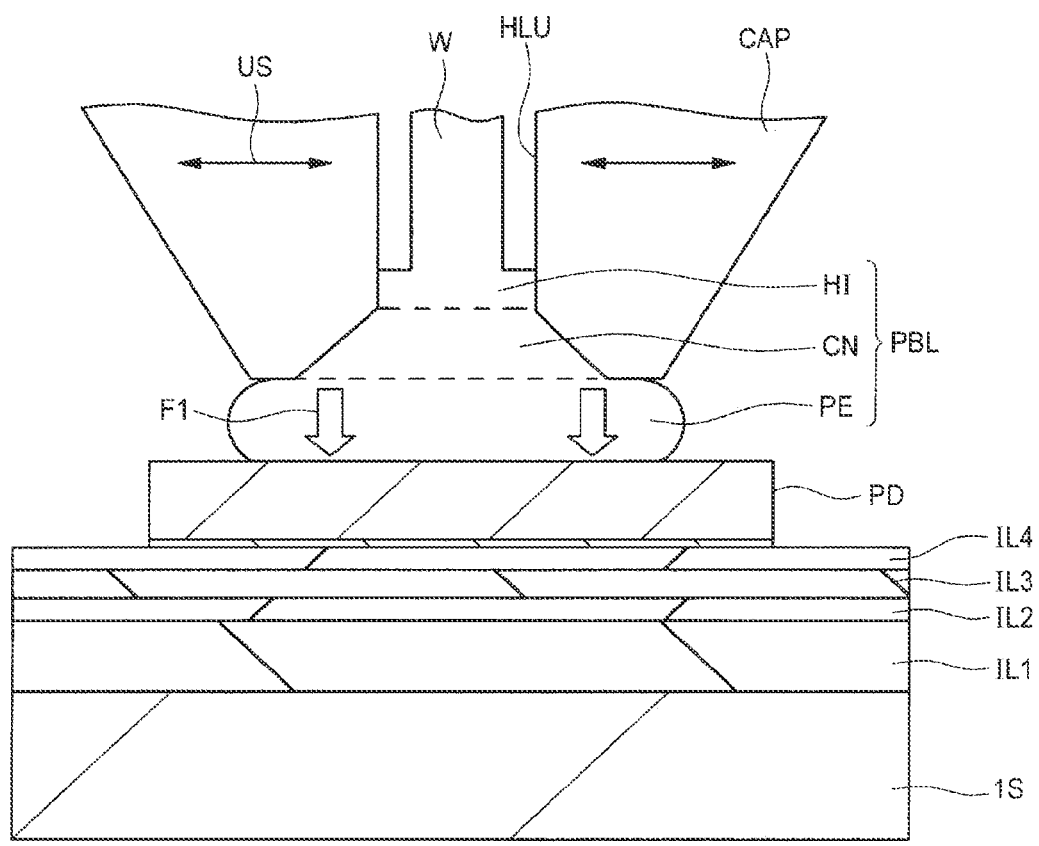
FIG. 50 is a view showing a wire bonding step.
Figure 51:
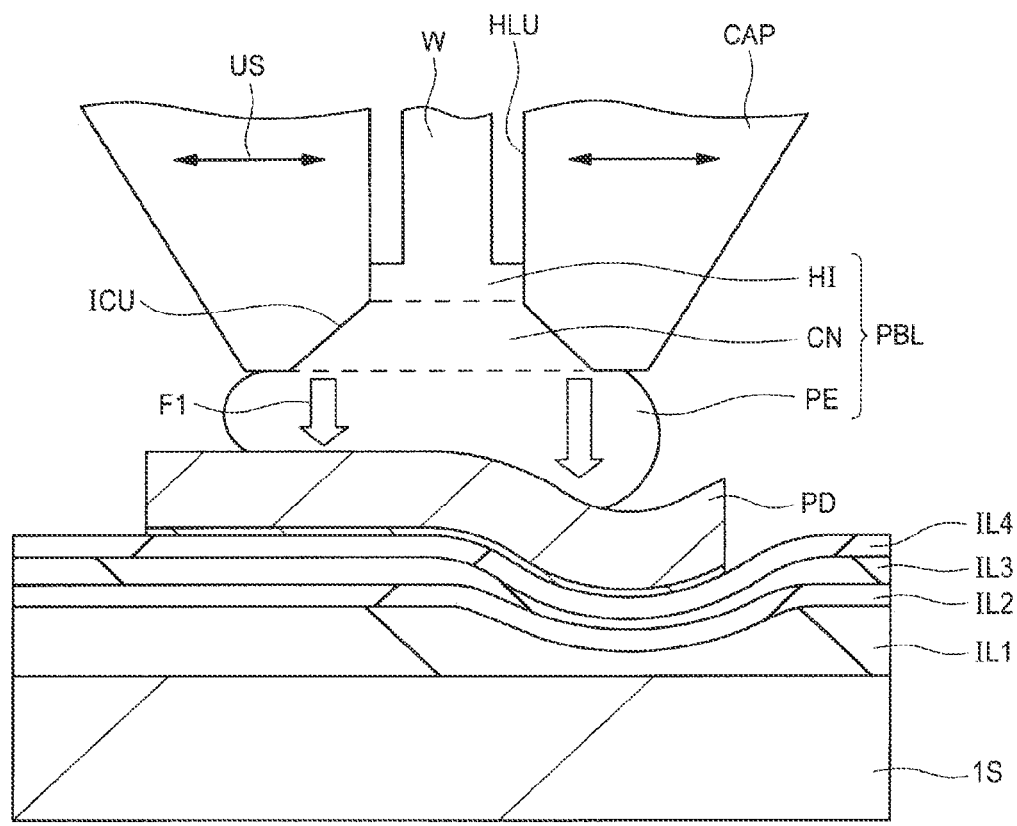
FIG. 51 is a view showing a wire bonding step following FIG. 50.

First, as shown in FIG. 50, an initial ball is formed at the tip part of the capillary CAP. Then, after landing the initial ball formed at the tip part of the capillary CAP over the pad PD, the initial ball is applied with a compressive load F1 and an ultrasonic vibration US from the capillary CAP, thereby to form a press-bonded ball PBL. At this step, the compressive load F1 from the capillary CAP is transferred to the pad PD, and further transferred to a plurality of the interlayer insulation film IL1 to the interlayer insulation film IL4 formed in layers underlying the pad PD. Thus, as shown in FIG. 51, even when the interlayer insulation film IL3 with a small Young's modulus is applied with the same compressive load F1, it exhibits a larger flexure amount than those of the other interlayer insulation film IL1, the interlayer insulation film IL2, and the interlayer insulation film IL4. As a result, the interlayer insulation film IL3 with a large flexure amount has a large shearing stress, resulting in the occurrence of peeling. Then, when peeling occurs in the interlayer insulation film IL3 with a small Young's modulus, a tensile stress generated upon lifting the capillary CAP causes pad peeling. In other words, when a plurality of the interlayer insulation film IL1 to the interlayer insulation film IL4 include the interlayer insulation film with a smaller Young's modulus than those of the other interlayer insulation films, peeling due to the compressive load becomes more likely to occur at the interlayer insulation film with a smaller Young's modulus. As a result, pad peeling becomes more likely to occur due to the tensile load upon moving up the capillary CAP. Therefore, it is indicated as follows: in a semiconductor device having interlayer insulation film with different Young's moduli, pad peeling becomes more likely to occur; this results in an increase in utility of applying the technical idea of the present invention.

Further, in recent years, in order to implement the high integration of semiconductor chips, miniaturization of multilayer wiring has been pursued. Accordingly, an increase in resistance due to the miniaturization of wiring, and an increase in parasitic capacity due to the shrinkage of the distance between wirings have become apparent as problems. In other words, an electrical signal passes through the multilayer wiring. However, the increase in resistance of wirings, and the increase in parasitic capacity between wirings causes the delay of the electrical signal. For example, in a circuit at which the timing is important, the delay of the electrical signal passing through the wiring causes malfunction, so that the circuit may not function as a normal circuit. This indicates that the suppression of the increase in resistance of the wirings and the reduction of the parasitic capacity of the wirings are required in order to prevent the delay of the electrical signal passing through the wirings.

Under such circumstances, the material forming the multilayer wiring is changed from an aluminum film into a copper film. Namely, this is for the following reason: the copper film is lower in resistivity than the aluminum film; thus, even when wirings are reduced in size, it is possible to suppress the increase in resistance of the wirings. Further, from the viewpoint of reducing the parasitic capacity between the wirings, some of the interlayer insulation films present between the wirings is formed of a low dielectric constant film having a lower dielectric constant than that of the silicon oxide film. As described up to this point, for a semiconductor device having a multilayer wiring, in order to enhance the performances, a copper film tends to be used as the material for wiring, and a low dielectric constant film tends to be used for some of the interlayer insulation films.

Namely, as the interlayer insulation film, a low dielectric constant film having a lower dielectric constant than that of the silicon oxide film has come to be used. The low dielectric constant film has a property of being also low in Young's modulus. Generally, the Young's modulus of the low dielectric constant film is often about 10 to 20 GPa. This is for the following reason: the low dielectric constant film may have pores in the inside of the film in order to reduce the dielectric constant; the film having pores is brittle, resulting the reduction of the Young's modulus. For example, as the low dielectric constant films, there are a SiOC film having pores, a HSQ (hydrogen silsesquioxane, a silicon oxide film formed by a coating step, and having a Si—H bond, or a hydrogen-containing silsesquioxane) film having pores, or a MSQ (methyl silsesquioxane, a silicon oxide film formed by a coating step, and having a Si—H bond, or a carbon-containing silsesquioxane) film having pores. Also when the interlayer insulation films are formed of the low dielectric constant film having a low Young's modulus, pad peeling becomes more likely to occur. This results in an increase in utility of applying the technical idea of the present invention.

Sixth Embodiment

Figure 52:
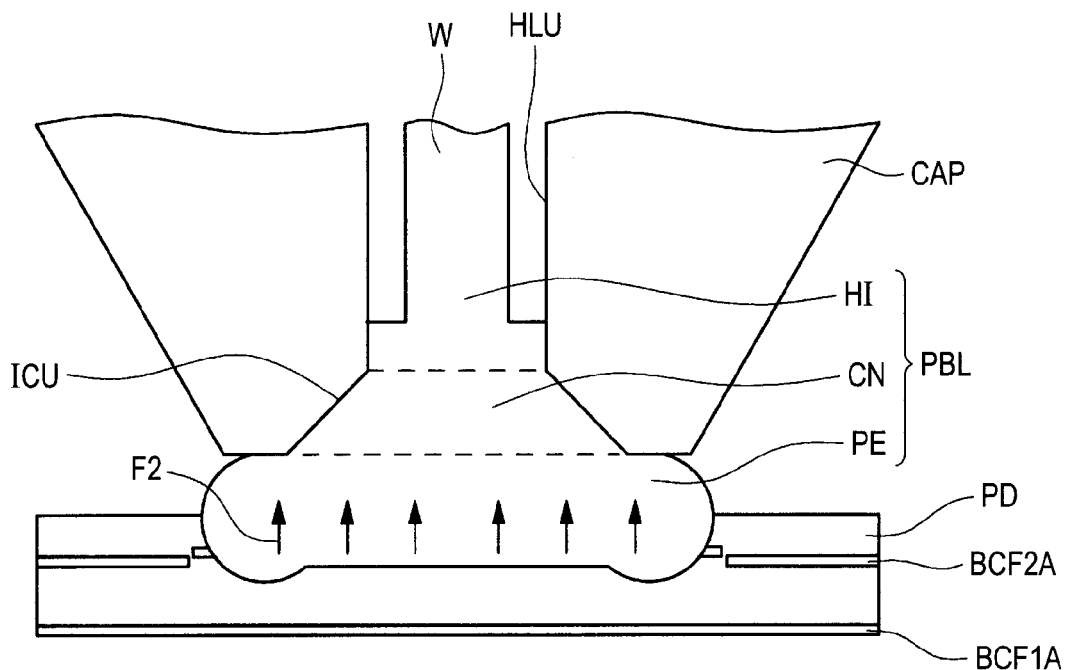
FIG. 52 is a view showing a wire bonding step in a pad structure relatively less susceptible to pad peeling.

In the present sixth embodiment, the pad structure susceptible to pad peeling will be described while performing the comparison with the pad structure relatively less susceptible to pad peeling. FIG. 52 is a view showing a wire bonding step in a pad structure relatively less susceptible to pad peeling. In FIG. 52, the pad PD is formed of, for example, a barrier conductive film BCF1A, an aluminum film, a barrier conductive film BCF2A, and an aluminum film. Herein, as shown in FIG. 52, an initial ball is applied with a compressive load and an ultrasonic vibration from the capillary CAP, thereby to form a press-bonded ball PBL. At this step, when the compressive load from the capillary CAP increases, the pedestal part PE of the press-bonded ball PBL enters the inside of the pad PD. As a result, the barrier conductive film BCF2A is broken. Herein, when the thickness of the barrier conductive film BCF2A is small, as shown in FIG. 52, the barrier conductive film BCF2A is broken over the entire bottom surface of the press-bonded ball PBL. When the capillary CAP is lifted in this state, the bottom surface of the pedestal part PE is roughly uniformly applied with the tensile load F2. Thus, when the barrier conductive film BCF2A is thin, a large tensile load F2 becomes less likely to be locally applied. As a result, pad peeling is less likely to occur.

Figure 53:
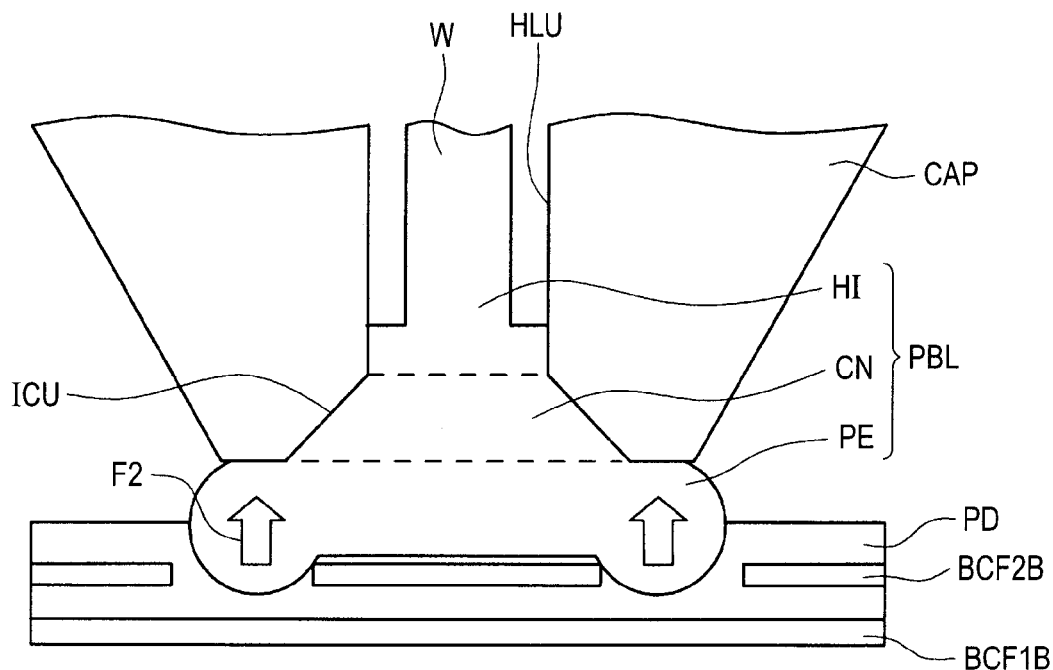
FIG. 53 is a view showing a wire bonding step in a pad structure relatively susceptible to pad peeling.

In contrast, FIG. 53 is a view showing a wire bonding step in a pad structure relatively susceptible to pad peeling. In FIG. 53, the pad PD is formed of, for example, a barrier conductive film BCF1B, an aluminum film, a barrier conductive film BCF2B, and an aluminum film. Herein, as shown in FIG. 53, an initial ball is applied with a compressive load and an ultrasonic vibration from the capillary CAP, thereby to form a press-bonded ball PBL. At this step, when the compressive load from the capillary CAP increases, the pedestal part PE of the press-bonded ball PBL enters the inside of the pad PD. As a result, the barrier conductive film BCF2A is broken. Herein, when the thickness of the barrier conductive film BCF2A is large, as shown in FIG. 53, the barrier conductive film BCF2A is broken only at the outer edge part of the pedestal part PE on which the compressive load is larger. Namely, with the pad structure shown in FIG. 53, the thickness of the barrier conductive film BCF2B is large. This results in breakage of only the barrier conductive film BCF2B present under the outer edge part of the pedestal part PE on which the compressive load is larger. When the capillary CAP is lifted in this state, the barrier conductive film BCF2B is broken. As a result, the outer edge part entered into the inside of the pad PD is locally applied with a large tensile load F2. Thus, when the barrier conductive film BCF2B is thick, the outer edge part is locally applied with a large tensile load F2. Accordingly, pad peeling becomes more likely to occur.

As described up to this point, it is indicated as follows: when the thickness of the barrier conductive film forming the pad PD is larger, pad peeling is more likely to occur as compared with the case where the thickness of the barrier conductive film is small. This results in an increase in utility of applying the technical idea of the present invention, particularly, when wire bonding using a copper wire is performed for the pad structure in which the thickness of the barrier conductive film forming the pad PD is large.

Herein, the difference between the case where the thickness of the barrier conductive film forming the pad PD is smaller and the case where the thickness of the barrier conductive film forming the pad PD is larger is due to the difference in the manufacturing steps of the semiconductor device.

Below, first, a description will be given to the manufacturing steps by which the thickness of the barrier conductive film forming the pad PD is reduced. Then, a description will be given to the manufacturing steps by which the thickness of the barrier conductive film forming the pad PD is increased.

Figure 54:
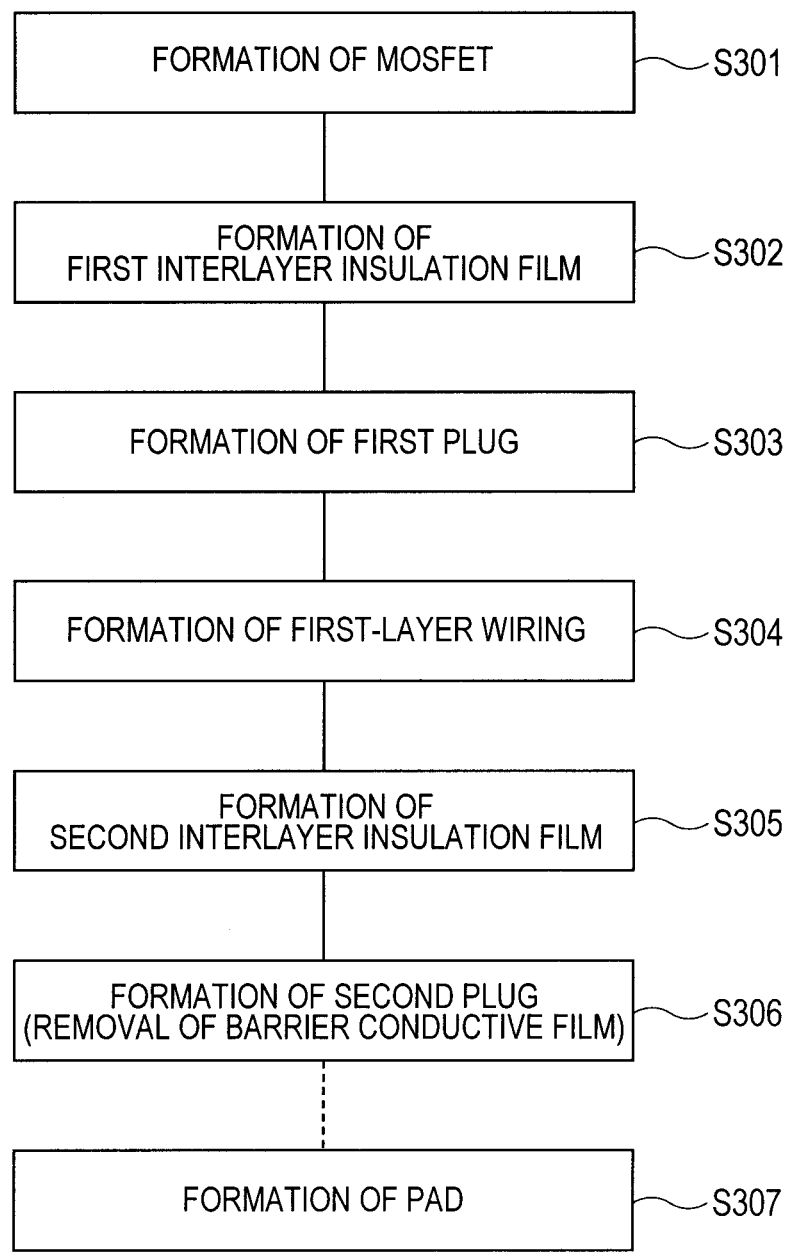
FIG. 54 is a flowchart showing the flow of manufacturing steps in which the thickness of a barrier conductive film forming the pad is reduced.

FIG. 54 is a flowchart showing the flow of manufacturing steps in which the thickness of the barrier conductive film forming the pad PD is reduced. In FIG. 54, first, MOSFETs are formed over a semiconductor substrate (S301). Then, a first interlayer insulation film is formed over the semiconductor substrate, covering the MOSFETs (S302). At this step, the surface of the first interlayer insulation film takes on an uneven profile reflecting the uneven shape due to the MOSFETs formed at the underlying layer. Then, by using a photolithography technology and an etching technology, in the first interlayer insulation film having the unevenness formed therein, a contact hole is formed. In the contact hole, conductive film is embedded, thereby to form a first plug in the first interlayer insulation film (S303). Then, first-layer wiring including the first plug formed therein is formed over the first, interlayer insulation film (S304). The first-layer wiring is formed of, for example, a lamination film of a barrier conductive film and an aluminum film. Subsequently, after forming a second interlayer insulation film over the first interlayer insulation film including the first-layer wiring formed therein (S305), a second plug is formed in the second interlayer insulation film (S306). At this step, the second plug is formed in such a manner as to reach the first-layer wiring formed over the first interlayer insulation film. However, the surface of the first interlayer insulation film takes on an uneven profile formed therein. Therefore, the surface of the first-layer wiring formed over the first interlayer insulation film also reflects the uneven shape. Therefore, when the second plug is formed in such a manner as to reach the first-layer wiring taking on the uneven shape present therein, it results in that there coexist a region in which the second plug is formed in a deep coupling hole and a region in which the second plug is formed in a shallow coupling hole. Accordingly, there is caused a difference between the resistance of the second plug formed in the deep coupling hole and the resistance of the second plug formed in the shallow coupling hole. Thus, in order to reduce the variations in resistance between the second plug formed in the deep coupling hole and the second plug formed in the shallow coupling hole, the barrier conductive film exposed at the bottom of the coupling hole is removed. Namely, at the bottom of the coupling hole, there is formed the first-layer wiring including a lamination film of a barrier conductive film, an aluminum film, and a barrier conductive film. The barrier conductive film is formed of films having relatively high resistances such as titanium film/titanium nitride film. Thus, from the viewpoint of reducing the variations in resistance between the second plugs, the barrier conductive film having a relatively high resistance exposed from the bottom of each coupling hole is removed. Then, a conductive film is embedded in the coupling hole, thereby to form a second plug. Thereafter, the same step is repeated to form a multilayer wiring. A pad is formed at the uppermost layer (S307). In such a step, the barrier conductive film exposed from the coupling hole is removed. Accordingly, the thickness of the barrier conductive film also becomes small at the pad. However, the manufacturing steps shown in FIG. 54 have ceased to be used with a recent trend toward miniaturization of wirings. This is for the following reason: in order to form a miniaturized wiring pattern, it is necessary to increase the resolution precision of the exposure device for use in the photolithography step; however, the increase in resolution precision results in a decrease in focus depth as the optical characteristic. In other words, the manufacturing steps shown in FIG. 54 providing a largely uneven shape makes difficult the formation of a fine wiring pattern.

Figure 55:
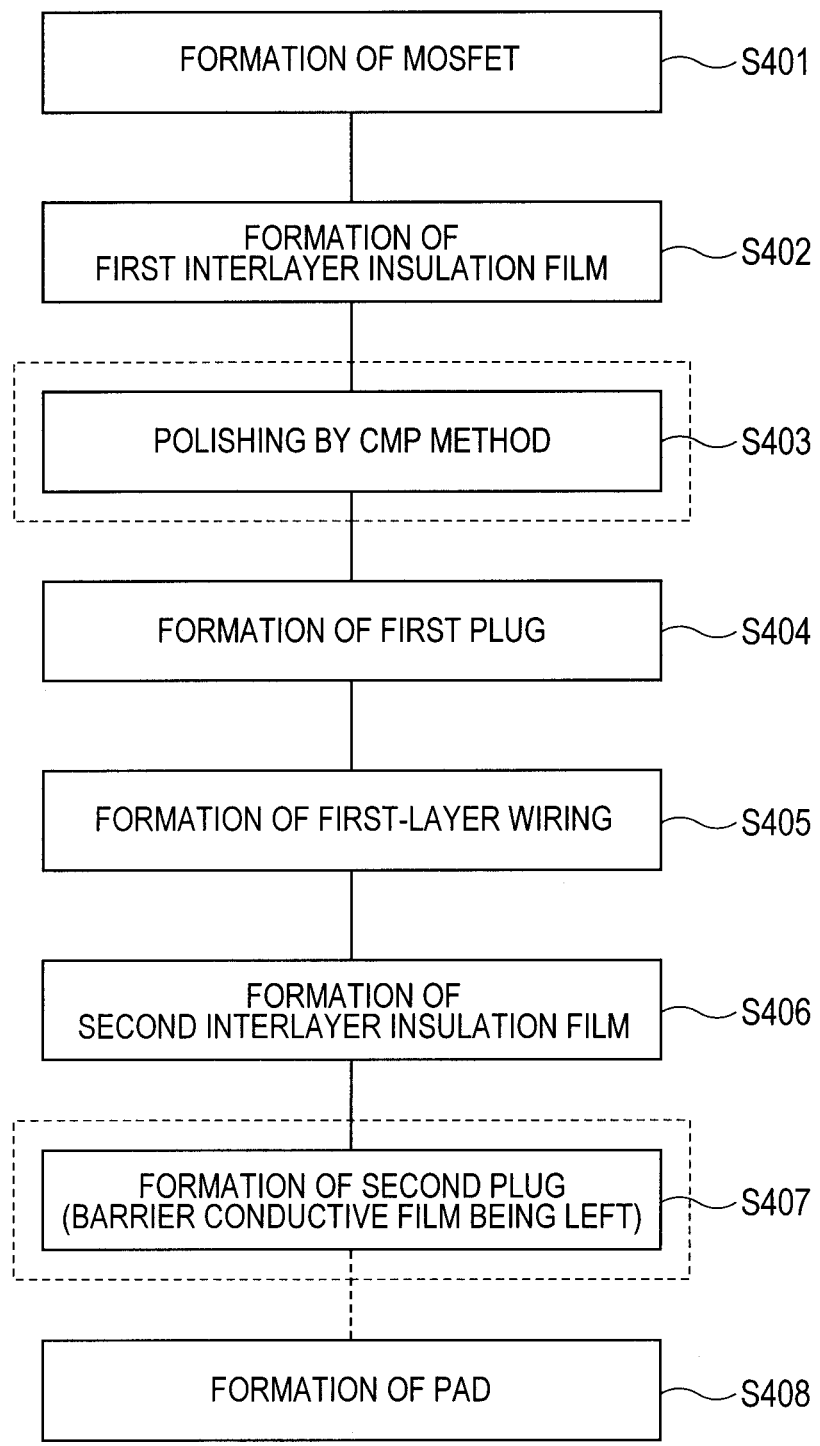
FIG. 55 is a flowchart showing the flow of manufacturing steps in which the thickness of a barrier conductive film forming the pad is increased.

Under such circumstances, in recent years, the manufacturing steps shown in FIG. 55 have come into principal use. Below, the manufacturing steps shown in FIG. 55 will be described. FIG. 55 is a flowchart showing the flow of manufacturing steps in which the thickness of the barrier conductive film forming the pad PD is increased. In FIG. 55, first, MOSFETs are formed over a semiconductor substrate (S401). Then, a first interlayer insulation film is formed over the semiconductor substrate, covering the MOSFETs (S402). At this step, the surface of the first interlayer insulation film takes on an uneven profile reflecting the uneven shape due to the MOSFETs formed at the underlying layer. However, in the manufacturing steps shown in FIG. 55, the surface of the first interlayer insulation film is polished by a CMP (Chemical Mechanical Polishing) method (S403): As a result, the surface of the first interlayer insulation film is planarized. Then, by using a photolithography technology and an etching technology, in the surface-planarized first interlayer insulation film, a contact hole is formed. In the contact hole, a conductive film is embedded. As a result, the first plug is formed in the first interlayer insulation film (S404). Then, over the first interlayer insulation film including the first plug formed therein, a first-layer wiring is formed (S405). The first-layer wiring is formed of a lamination film of, for example, a barrier conductive film and an aluminum film. At this step, in the manufacturing steps shown in FIG. 55, the surface of the first interlayer insulation film is planarized. Accordingly, the surface of the first-layer wiring formed over the first interlayer insulation film is also flat.

Subsequently, after forming a second interlayer insulation film over the first interlayer insulation film including the first-layer wiring formed thereover (5406), in the second interlayer insulation film, a second plug is formed (S407). At this step, the second plug is formed in such a manner as to reach the first-layer wiring formed over the first interlayer insulation film. In the manufacturing steps shown in FIG. 55, the surface of the first interlayer insulation film is planarized. Accordingly, the surface of the first-layer wiring formed over the surface of the first interlayer insulation film is also flat. As a result, in the manufacturing steps shown in FIG. 55, a region in which the second plug is formed in a deep coupling hole and a region in which the second plug is formed in a shallow coupling hole do not coexist as in the manufacturing steps shown in FIG. 54. The second plugs are formed in the coupling holes having roughly uniform depths. For this reason, consideration is scarcely required to be given to the variations in resistance between a plurality of the second plugs. Thus, the barrier conductive film exposed at the bottom of each coupling hole is not removed. Thereafter, the same step is repeated to form a multilayer wiring, resulting in the formation of a pad at the uppermost layer (S408). In such manufacturing steps shown FIG. 55, the barrier conductive film exposed from the coupling hole is not removed. This also results in an increase in thickness of the barrier conductive film at the pad. Thus, in the manufacturing step shown in FIG. 55, the surface of the first interlayer insulation film is planarized by a CMP method. For this reason, even a decrease in focus depth due to the increase in resolution precision of an exposure device does not become a large problem. In other words, the manufacturing steps shown in FIG. 55 are the manufacturing steps suitable for forming the miniaturized wiring pattern, and can be regarded as the manufacturing steps of a semiconductor device to be future mainstream. However, in the manufacturing steps shown in FIG. 55, the thickness of the barrier conductive film forming a part of the pad is increased. Accordingly, when the wire bonding step with a copper wire is carried out after the manufacturing steps shown in FIG. 55, the problem of pad peeling becomes apparent. However, even when the wire bonding step with a copper wire is used after the manufacturing steps shown in FIG. 55, it is possible to effectively prevent pad peeling by applying the technical idea of the present invention.

Up to this point, the inventions made by the present inventors were specifically described based on the embodiments. However, it is naturally understood that the present invention is not limited to the embodiments, and may be variously changed within the scope not departing from the gist thereof.

The MOSFETs are not limited to the case where the gate insulation film is formed of an oxide film, but are assumed to include MOSFETs (Metal Insulator Semiconductor Field Effect Transistors) in which the gate insulation films are formed of a wide range of insulation films. In other words, in the present specification, the term "MOSFET" is used for the sake of convenience. However, the term "MOSFET" is used as a term intended to embrace even MISFET in the present specification.

The present invention can be widely used for the manufacturing industry for manufacturing a semiconductor device.

What is claimed is:

1. A method for manufacturing a semiconductor device, comprising a step of bonding a copper wire to a pad disposed over the surface of a semiconductor chip,
    wherein the step of bonding the copper wire, comprises the steps of:
        (a) forming an initial ball formed of the copper wire at a tip part of a capillary;
        (b) landing the initial ball over the pad;
        (c) applying the initial ball with a load and an ultrasonic wave, and thereby deforming the initial ball to form a press-bonded ball, and electrically coupling the pad with the press-bonded ball; and
        (d) leading out the copper wire from the capillary,
    wherein the press-bonded ball has a first portion coupled with the pad, a second portion located over the first portion, and a third portion located over the second portion, and coupled with the copper wire led out in step (d),
    wherein, in step (c) and step (d), the initial ball is electrically coupled with the pad such that, in cross-sectional view, a thickness of the first portion of the press-bonded ball is 1.25 times or more the thickness of the second portion, the thickness of the first portion of the press-bonded ball is $2/3$ or more of the diameter of the press-bonded ball, and the thickness of the third portion of the press-bonded ball is smaller than $1/6$ of the diameter of the press-bonded ball, and
    wherein a divergence angle of an inner chamfer part of the capillary forming the second portion of the press-bonded ball is smaller than 90 degrees.

2. The method for manufacturing a semiconductor device according to claim 1,
    wherein the divergence angle of the capillary falls within the range of 50 degrees to 70 degrees.

3. The method for manufacturing a semiconductor device according to claim 1,
    wherein at a layer underlying the pad of the semiconductor chip, a plurality of interlayer insulation films are formed, and
    wherein the interlayer insulation films include a plurality of insulation films having different Young's moduli.

4. The method for manufacturing a semiconductor device according to claim 3,
    wherein respective Young's moduli of the interlayer insulation films are smaller than the Young's modulus of silicon.

5. The method for manufacturing a semiconductor device according to claim 1,
    wherein at a layer underlying the pad of the semiconductor chip, a plurality of interlayer insulation films are formed, and
    wherein the interlayer insulation films include a low dielectric constant film lower in dielectric constant than a silicon oxide film.

6. The method for manufacturing a semiconductor device according to claim 1,
    the method comprising a step of mounting the semiconductor chip over a wiring board before the step of bonding the copper wire,
    wherein the step of bonding the copper wire further comprises the steps of:
    after the step (d), electrically coupling the copper wire with a terminal of the wiring board; and
    after the step of bonding the copper wire, sealing the semiconductor chip, the copper wire, and a part of the wiring board by a sealing body.

7. The method for manufacturing a semiconductor device according to claim 6,
    wherein the wiring board is a lead frame, and
    wherein the terminal of the wiring board is a lead.

8. The method for manufacturing a semiconductor device according to claim 6,
    wherein the wiring board is a wiring substrate board, and
    wherein the terminal of the wiring board is a land terminal formed over the wiring substrate board.

9. The method for manufacturing a semiconductor device according to claim 1,
    wherein, after step (d), the longitudinal sectional shape of the third portion of the press-bonded ball is a tapered shape.

10. The method for manufacturing a semiconductor device according to claim 9,
    wherein the tapered shape is a shape broadening in a direction from the third portion toward the first portion of the press-bonded ball, and
    wherein when an imaginary vertical line perpendicular to the surface of the pad is drawn, the taper angle formed between the imaginary vertical line and the side surface of the third portion is greater than 0 degrees.

11. The method for manufacturing a semiconductor device according to claim 10,
    wherein the taper angle falls within the range of 10 degrees to 20 degrees.

12. The method for manufacturing a semiconductor device according to claim 9,
    wherein at the third portion of the press-bonded ball, the diameter of the bottom surface of the third portion in contact with the second portion is greater than the diameter of the top surface of the third portion in contact with the copper wire.

13. The method of manufacturing a semiconductor device according to claim 9, wherein a side surface of the second portion and a side surface of the third portion of the press-bonded ball are formed in an integral curve.

* * * * *